(12) United States Patent
Steven et al.

(10) Patent No.: US 9,727,071 B2
(45) Date of Patent: *Aug. 8, 2017

(54) FACILITATING REVENUE GENERATION FROM WHOLESALE ELECTRICITY MARKETS BASED ON A SELF-TUNING ENERGY ASSET MODEL

(71) Applicant: Viridity Energy, Inc., Philadelphia, PA (US)

(72) Inventors: Alain P. Steven, Lansdale, PA (US); Eunice B. Hameyie, Havertown, PA (US)

(73) Assignee: Viridity Energy Solutions, Inc., Reno, NV (US)

( * ) Notice: Subject to any disclaimer, the term of this patent is extended or adjusted under 35 U.S.C. 154(b) by 354 days.

This patent is subject to a terminal disclaimer.

(21) Appl. No.: 14/398,666

(22) PCT Filed: May 6, 2013

(86) PCT No.: PCT/US2013/039762
§ 371 (c)(1),
(2) Date: Nov. 3, 2014

(87) PCT Pub. No.: WO2013/166511
PCT Pub. Date: Nov. 7, 2013

(65) Prior Publication Data
US 2015/0088576 A1    Mar. 26, 2015

Related U.S. Application Data

(60) Provisional application No. 61/643,062, filed on May 4, 2012, provisional application No. 61/643,067, filed on May 4, 2012.

(51) Int. Cl.
*G05F 1/66* (2006.01)
*G06Q 50/06* (2012.01)
(Continued)

(52) U.S. Cl.
CPC ............... *G05F 1/66* (2013.01); *G05B 17/02* (2013.01); *G06F 17/5009* (2013.01);
(Continued)

(58) Field of Classification Search
CPC ........ G06Q 50/06; G06Q 40/04; G06Q 10/06; Y04S 50/10; Y04S 10/58; Y04S 10/54;
(Continued)

(56) References Cited

U.S. PATENT DOCUMENTS 8,620,632 B2 * 12/2013 An ........................ G01K 17/20
700/291
9,098,876 B2 * 8/2015 Steven ............... G06Q 30/0283
(Continued)

*Primary Examiner* — Darrin Dunn
*Assistant Examiner* — Shon Foley
(74) *Attorney, Agent, or Firm* — The H.T. Than Law Group

(57) ABSTRACT

The apparatus, systems and methods herein facilitate generation of energy-related revenue for an energy customer of an electricity supplier. The apparatuses and methods herein can be used to generate suggested operating schedules for the energy assets that including a controllable energy asset, using an objective function. The objective function is determined based on a dynamic simulation model of the energy profile of the energy assets. The dynamic simulation model is adaptive to physical changes in the energy assets based on a parametric estimation using at least one model parameter. The model parameter is at least one of an operation characteristic of the controllable energy asset, a thermodynamic property of the energy assets, and a projected environmental condition. Energy-related revenue available to the energy customer is based at least in part on a wholesale electricity market or on a regulation market.

13 Claims, 26 Drawing Sheets

(51) Int. Cl.
    *G06Q 10/04* (2012.01)
    *G06Q 10/06* (2012.01)
    *G05B 17/02* (2006.01)
    *G06F 17/50* (2006.01)

(52) U.S. Cl.
    CPC ....... *G06Q 10/04* (2013.01); *G06Q 10/06312* (2013.01); *G06Q 50/06* (2013.01)

(58) Field of Classification Search
    CPC ... Y04S 20/224; H02J 3/008; H02J 2003/003; G05B 15/02; G05B 13/02; G05B 2219/2642; G05F 1/66
    See application file for complete search history.

(56) References Cited

U.S. PATENT DOCUMENTS

| | | | |
|---|---|---|---|
| 9,367,825 B2 | 6/2016 | Steven et al. | |
| 2006/0276938 A1* | 12/2006 | Miller | G06Q 50/06 700/295 |
| 2011/0009996 A1* | 1/2011 | Liu | G05B 17/02 700/105 |
| 2011/0231320 A1* | 9/2011 | Irving | G06Q 30/00 705/80 |
| 2011/0270452 A1* | 11/2011 | Lu | G05B 19/042 700/291 |
| 2012/0078434 A1* | 3/2012 | Hindi | H02J 3/14 700/296 |
| 2012/0158618 A1* | 6/2012 | Roskos | G06Q 50/06 706/12 |
| 2014/0039710 A1* | 2/2014 | Carter | G06Q 10/06 700/291 |

\* cited by examiner

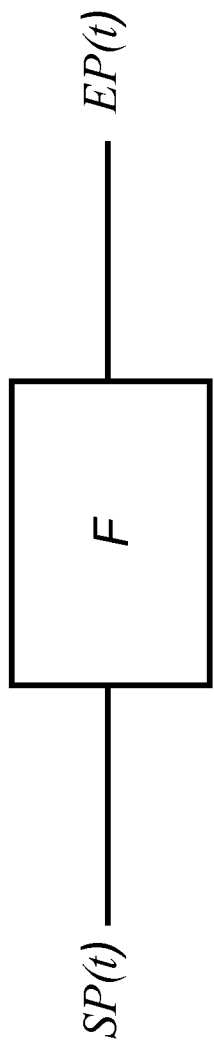
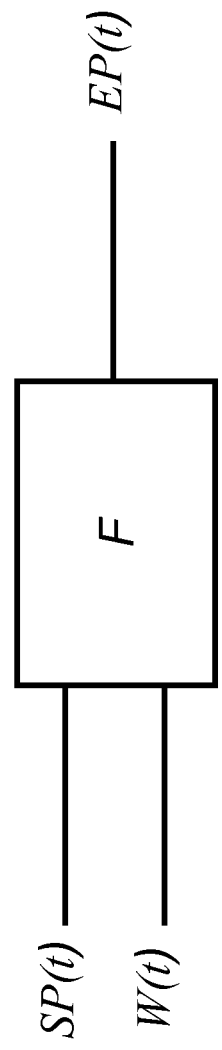

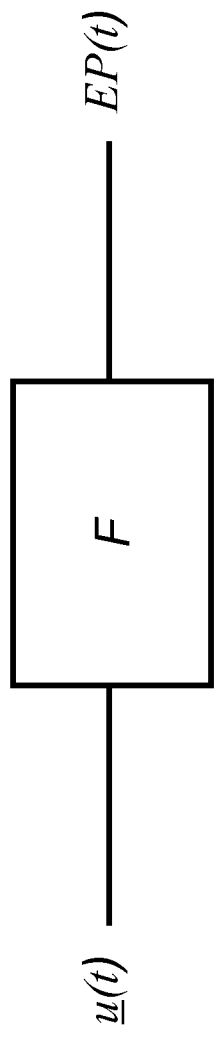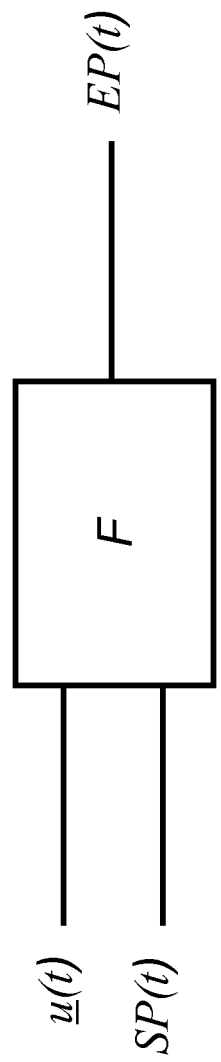

FACILITATING REVENUE GENERATION FROM WHOLESALE ELECTRICITY MARKETS BASED ON A SELF-TUNING ENERGY ASSET MODEL

CROSS-REFERENCES TO RELATED APPLICATIONS

This application is a U.S. National Phase application of PCT/US2013/039762, filed on May 6, 2013, which claims priority to and benefit of U.S. Provisional Application No. 61/643,062, filed on May 4, 2012, entitled "MODELING OF BUILDING ASSETS AND FACILITATING REVENUE GENERATION FROM WHOLESALE ELECTRICITY MARKETS," and U.S. Provisional Application No. 61/643,067, filed on May 4, 2012, entitled "MODELING OF BUILDING ASSETS AND FACILITATING REVENUE GENERATION FROM WHOLESALE ELECTRICITY MARKETS USING AN ENGINEERING-BASED MODEL," the entire disclosure of each of which is incorporated herein by reference in its entirety, including drawings.

BACKGROUND

In various regions across the United States, "regional transmission operators" (RTOs) or "independent system operators" (ISOs) generally are responsible for obtaining electricity from electricity generators (e.g., operators of coal-fired plants, gas plants, nuclear plants, hydroelectric plants, renewable resources, etc.), and then transmitting the electricity provided by generators over particular geographic regions (e.g., New England, the greater New York area, the mid-Atlantic states) via an electricity transmission infrastructure (also commonly referred to as the electricity "grid"). RTOs generally are responsible for regional planning of grid expansion and/or ordering deployment of new electricity transmission infrastructure by transmission owners.

The Federal Energy Regulation Commission (FERC) presently requires that, in addition to generally managing the operation of the electricity grid in a given geographic area, RTOs/ISOs need to manage the price of electricity generated and consumed on the grid via "wholesale electricity markets." To this end, RTOs/ISOs establish pricing auctions to provide and support wholesale electricity markets. These pricing auctions, in addition to setting wholesale prices as a function of time, also foster sufficient electricity production for the grid at various locations to ensure that the grid is capable of delivering adequate electricity to respective locations of demand for electricity on the grid. Thus, some of the key objectives of the RTOs/ISOs in overseeing wholesale electricity markets include providing for efficient, economic and reliable operation of the grid.

In general, a given RTO/ISO supports a wholesale electricity market by allowing competing electricity generators to offer their electricity production output to the RTO/ISO. Retail electricity suppliers, also commonly referred to as "utilities," in turn supply electricity to end-users/consumers, or "energy customers" of the retail electricity suppliers, and are billed by the RTO/ISO for their purchases. With respect to the wholesale electricity market, the retail electricity suppliers make bids for the electricity production output offered by the electricity generators that, once accepted, establish market prices. The retail electricity suppliers in turn typically re-price the electricity they purchase from electricity generators on the wholesale market to sell to their retail electricity customers.

One significant issue facing RTOs/ISOs relates to various limitations that exist in connection with the grid that may impede a sufficient flow of electricity on the grid under certain circumstances. In particular, there may be time-dependent and/or geographically-dependent limitations on the grid's ability to support transmission of electricity, based on one or more of: 1) an available overall supply of electricity from electricity generators; 2) overall demand from retail electricity suppliers; 3) general conditions on the grid itself (e.g., aging, failing or dated equipment); and 4) "location-specific" or "congestion" issues, e.g., respective geographic locations on the grid of electricity generators, electricity consumers, particular demand conditions, and/or particular grid-related conditions that in some manner impede the transmission of available electricity to one or more portions of the grid). In some circumstances, a grid limitation may be caused by a particular branch of the grid reaching a thermal limit, or a failure of a generator or transformer on a branch of the grid; these limitations generally are referred to as "security constraints" (i.e., particular grid infrastructure cannot be overloaded without jeopardizing the grid). As such, the electricity grid is sometimes referred to as a "security constrained system."

In view of the foregoing, RTOs/ISOs may employ a process known as "security constrained economic dispatch" for establishing wholesale electricity prices on a wholesale electricity market. Pursuant to this process, an RTO/ISO managing a particular geographic region of an electricity grid determines particular locations on the grid, or "nodes," at which there is a possibility for security constraints to limit electricity transmission. Wholesale electricity prices as a function of time are then established independently for each node (i.e., on a geographically-dependent, or "locational" basis) by accepting bids from energy generators in sequence from the lowest priced offer to the highest priced offer, up to an amount of electricity needed to satisfy electricity demand conditions (e.g., bids from retail electricity suppliers) at the node, so as to develop a supply and demand equilibrium price. In this manner, the wholesale electricity price at a particular node reflects the highest-priced accepted generation offer needed to provide an adequate amount of electricity to that node, taking into consideration various security constraints that may be present at the node. This location-based approach to wholesale electricity prices, which takes into consideration security constraints on the grid, commonly is referred to as "locational marginal pricing," and the wholesale electricity price at a given node is commonly referred to a Locational Marginal Price (LMP). Thus, the wholesale electricity price generally varies at different locations on the grid, based at least in part on security constraints.

While electricity generators and retail electricity suppliers make up a significant constituency of the participants in wholesale electricity markets, applicable market rules in some wholesale electricity markets also permit electricity consumers/end-users (e.g., energy customers of retail electricity suppliers) and others to participate in wholesale electricity markets so as to earn energy-related revenue and offset their energy-related expenditures. In particular, market rules now permit energy users (or their market representatives) to make offers to curtail or otherwise alter their electricity use, or to sell self-generated or stored electricity, to the wholesale market. If such an offer by an energy customer to provide an "electricity-related product or service" is accepted on the applicable wholesale market, the customer endeavors to appropriately control its various energy assets so as to make available to the grid the offered product/service, in return for payment pursuant to the terms of the offer. The concept of an energy customer providing an electricity-related product or service (e.g., electricity use curtailment) on a wholesale electricity market in exchange for payment to the energy customer by the RTO/ISO, commonly is referred to as "demand response" (DR).

Some of the currently more active wholesale electricity sub-markets in which energy customers of retail service providers may readily participate include the "energy markets" (e.g., "day-ahead" energy market, "real-time dispatched" energy market). While various pricing models exist for participation in these markets and other economic demand response wholesale electricity markets (as well as various penalty models for customer non-performance pursuant to an offer to reduce/curtail energy use), often any revenue generated by the energy customer from participation in these markets is based on the locational marginal price (LMP). The LMP may be calculated periodically at specified nodes (e.g., every 5 minutes, every half-hour, every hour) depending on the particular market in which the energy customer is participating. More generally, revenue generation relating to participation in an economic demand response wholesale electricity market is based on a prevailing "wholesale electricity price" for the particular market in question, which in turn generally is based on the LMP (calculated at various intervals), as discussed above.

To determine revenue earned by participating energy customers in a particular economic demand response wholesale electricity market such as an "energy market," the amount of electricity use reduction by the participating customer typically has to be measured; subsequently, this measured amount of electricity use reduction typically is multiplied by a price relating to the prevailing wholesale electricity price for the market in question (e.g., LMP). Electricity use reduction by the energy customer conventionally is measured against a reference electricity usage commonly referred to as a "customer baseline" (CBL). The CBL is intended to represent what the participating energy customer's electricity use normally would have been, over a particular time period and typical ("business-as-usual" or BAU) operating conditions for the customer's energy assets, absent the customer's voluntary electricity use reduction based on the incentive provided by the economic demand response wholesale electricity market.

Conventionally, a customer baseline (CBL) electricity use profile for an energy customer is derived by an RTO/ISO from an historical sample of actual electricity use by the customer over a particular time period and BAU operating conditions. In some cases, the particular time period for which an historical sample of the customer's actual electricity use is selected as a CBL may be based, at least in part, on similar conditions prevailing at the customer's site at the time of the historical sampling and participation in the economic demand response program (e.g., similar weather conditions, similar seasons/time of year, similar occupancy conditions at the customer's site, etc.). In other instances, the time period for selecting an historical sample of actual electricity usage as a CBL is based on relatively recent actual electricity use by the energy customer just prior to the customer's participation in the economic demand response program. For example, the ISO PJM Interconnect calculates a market-participating customer's CBL for a given weekday as "the average of the highest four out of the five most recent highest load (electricity use) weekdays in the 45 calendar day period preceding the relevant load reduction event." In sum, revenue generation from the economic demand response wholesale electricity "energy markets" conventionally is based on an historical actual electricity usage of a participating customer, which historical actual electricity usage serves as a customer baseline (CBL) against which electricity use reduction is measured for purposes of paying the energy customer for the use reduction.

SUMMARY

The Inventors have recognized and appreciated that new opportunities for participation in wholesale electricity markets by electricity consumers/end-users (e.g., energy customers of retail electricity suppliers) have created a need for energy management tools to facilitate energy-related revenue generation from such markets. In view of the foregoing, various embodiments are directed generally to methods, apparatus and systems for determining operating schedules for energy assets so as to facilitate revenue generation from wholesale electricity markets. These energy assets include energy storage assets, energy consuming assets and energy generating assets. In different examples herein, an energy asset can include an energy storage asset, an energy consuming asset, and/or an energy generating asset.

Wholesale electricity markets in which the energy customer may participate to earn energy-related revenue, and to which the various methods, apparatus and systems according to the concepts disclosed herein may apply, include various economic demand response wholesale electricity markets, examples of which include, but are not limited to, a "real-time energy market," a "day-ahead energy market," a "day-ahead scheduling reserve market," a "synchronized reserve" market, a "regulation" market, a "capacity" market, and an "emissions" market. The various methods, apparatus and systems according to the concepts disclosed herein may also apply to facilitate the energy customer participating in a market based on a voltage/VAR ancillary service to earn energy-related revenue. In some examples, the methods, apparatus and systems described herein may be implemented in whole or in part by a curtailment service provider (CSP) or other entity acting as a "broker" between energy customers and an RTO/ISO to facilitate participation in various demand response programs supported by wholesale electricity markets.

Suggested Operating Schedules for Energy Assets

In example implementations discussed in greater detail below, the methods, apparatus and systems described herein determine a suggested operating schedule for one or more energy assets (including energy-consuming assets for which energy usage may be curtailed), over a given time period T, that are operated by an energy customer of a retail electricity supplier. The energy assets operated by the energy customer may include electricity-consuming assets as well as electricity-generating assets (e.g., fossil-fuel-based generators, renewable energy sources) and/or electricity storage assets (e.g., batteries). The time period T over which a suggested operating schedule for the energy asset(s) may be determined according to the inventive concepts disclosed herein may be a portion of an hour, an hour, a period of multiple hours, a day, or a period of multiple days, for example (which in some instances may be based, at least in part, on time-varying wholesale electricity prices on a particular wholesale electricity market from which revenue may be generated). Similarly, the suggested operating schedule(s) for the energy assets(s) may be determined based at least in part on wholesale prices of various wholesale electricity "products" offered on the wholesale electricity markets in which the energy customer may participate (e.g., based on a geographic region in which the energy customer is located) to earn energy-related revenue.

In one example implementation, as discussed in greater detail below, the suggested operating schedule for one or more energy assets is determined via a mathematical optimization process that reduces a net energy-related cost to the energy customer over the time period T by increasing projected energy-related revenue from one or more wholesale electricity markets in which the energy customer may participate.

Energy Asset Modeling

To facilitate the mathematical optimization process for generating a suggested operating schedule for one or more energy assets, a mathematical model representing the customer's energy asset(s) is formulated and employed in the mathematical optimization process. The energy asset model is specified by one or more mathematical functions for calculating an energy profile (i.e., electricity use and/or electricity generation as a function of time over the time period T) for the asset(s), based on a proposed operating schedule for the asset(s) applied as an input to the model. In one aspect, the mathematical function(s) defining the asset model at least in part represent physical attributes of the energy asset(s) themselves that relate to electricity use and/or electricity generation. Depending on the energy asset(s) operated by the energy customer, a given model may represent a single energy asset or an aggregation of multiple energy assets operated by the customer.

Also, depending on the type of energy asset(s) being modeled, the asset model may be formulated to accept additional inputs to facilitate calculation of an energy profile based on a proposed operating schedule. Herein, in various examples, energy storage assets, energy consuming assets and/or energy generating assets are being modeled. For example, in the case of controllable energy assets, including energy consuming assets such as building assets including heating, ventilation and air conditioning (HVAC) systems for temperature control in one or more buildings, and/or other assets for which thermodynamic considerations are relevant (including weather- or temperature-dependent energy generating assets including photovoltaic cells and wind turbines), the mathematical model for the asset(s) may be configured to consider as an input to the model actual or forecast ambient environmental conditions (e.g., temperature, humidity, ambient light/cloud cover, etc.) as a function of time, as well as other variables that may impact thermodynamics or the energy profile in general (e.g., building occupancy, a presence of equipment such as computers and other instrumentation that may affect heating or cooling in an environment, etc.).

Customer Baseline (CBL) Energy Profiles for Business-As-Usual (BAU) Operating Schedules In some examples, the mathematical model for the energy asset(s) first is used to generate a simulated (or "predictive") customer baseline (CBL) energy profile corresponding to a typical operating schedule (also referred to herein as a "business-as-usual" (BAU) operating schedule, or "BAU conditions"). In particular, an energy customer's BAU operating schedule for its energy asset(s) is applied to the mathematical model, which in turn provides as an output a simulated CBL energy profile representing a typical electricity consumption or generation as a function of time, over a given time period T, for the modeled energy asset(s). In one aspect, the energy customer's BAU operating schedule represents the customer's typical behavior with respect to operating its energy asset(s), absent any incentive to reduce energy costs and/or earn energy-related revenue from the wholesale electricity market.

As discussed in greater detail below, a simulated and predictive CBL energy profile based on a mathematical model according to the concepts disclosed herein provides a significant improvement over conventional approaches to determine a frame of reference for typical energy profiles of energy customers (absent an incentive to generate revenue via wholesale electricity markets); as noted above, conventional approaches are limited to considering only historical actual energy use information. In particular, it is recognized and appreciated herein that conventional backward-looking assessment of CBL is not necessarily representative of what an energy customer's electricity usage actually would have been on a given day for which economic demand response revenue is being calculated at best, such backward-looking historical actual-use-based assessments of CBL provide inconclusive estimates.

Additionally, it has been observed empirically that an historical actual-use CBL provides incentives for some energy customers to artificially inflate energy usage (i.e., by not operating energy assets pursuant to "business-as-usual" or BAU conditions, but instead purposefully adopting higher-consumption operating conditions) prior to a period in which the customer anticipates participation in economic demand response wholesale electricity markets; an artificially higher historic actual-use-based CBL, against which energy use reduction will be measured, provides a potentially higher economic demand response revenue. In this manner, the general goal of economic demand response programs to incentivize reduced electricity usage is undermined (by an artificially-increased electricity usage to establish a higher CBL).

Furthermore, the Inventors have recognized and appreciated that an historical actual-use-based CBL provides a long-term disincentive to participate in economic demand response wholesale electricity markets. In particular, as a given energy customer participates in economic demand response wholesale electricity markets over time, their average actual electricity use from retail suppliers is expected to decrease. If revenue from such markets continues to be calculated with reference to an historical actual-use-based CBL, the potential for economic demand response revenue will decrease over time, as an economic settlement approach based on historical actual-use CBL eventually will begin to treat incentivized electricity use reduction as "business-as-usual" operating conditions for the energy customer. This type of treatment arguably will ultimately discourage participation in wholesale electricity markets. At very least, continued reliance on historical actual-use-based CBL likely will compel an extension of a "look-back" period serving as a basis for determining CBL for energy customers who actively participate in economic demand response wholesale electricity markets for significant periods of time. As longer look-back periods are adopted, the accuracy and relevance of historic actual-use-based CBLs from more distant time periods arguably will significantly decrease.

Accordingly, for at least the foregoing reasons, a simulated and predictive CBL energy profile, based on a mathematical model of an energy customer's energy asset(s) according to the concepts disclosed herein (rather than an historical actual-use-based CBL as conventionally employed), provides a significant improvement for more accurately determining revenue earned from economic demand response wholesale electricity markets. In some examples, the mathematical model for the energy asset(s)

may not be predicated on any significantly historical actual electricity use information for the energy asset(s), and instead may be based in part on physical attributes of the energy asset(s) themselves that relate to electricity use and/or electricity generation, as noted above. In this manner, simulated and predictive CBL energy profiles based on such mathematical models are not substantively influenced by significantly historical actual electricity use information.

A self-tuning energy asset model according to a principle herein may adapt itself to the current conditions of an energy asset. Fore example, the computation of the CBL may reflect temporary changes or permanent changes in the physical characteristics of an energy asset. Non-limiting examples of such changes include but are not limited to changes in the building materials or building construction, changes in the types of energy assets present in the system, the types of temperature control systems present in the system. The historical actual-use-based CBL may capture permanent changes in the energy asset as well.

In other examples, the mathematical model for energy asset(s) may be predicated on some degree of essentially real-time or near real-time feedback (e.g., from one or more control systems actually controlling the modeled energy asset(s)), which feedback may represent actual electricity use. This feedback may be used, according to some examples of the methods, apparatus and systems disclosed herein, to refine some aspects of the mathematical model; however, even when real-time or near real-time feedback representing actual electricity use is employed, in some examples the mathematical model is may be based on physical attributes of the energy asset(s) themselves relating to electricity use and/or electricity generation.

Objective Cost Functions

In some examples, the mathematical model for the energy asset(s) is employed to determine a suggested operating schedule over a given time period T for the energy asset(s) (different than the BAU operating schedule) based on a mathematical optimization of an "objective cost function" representing the net energy-related cost to the energy customer for operating the asset(s). In example implementations, the objective cost function incorporates the mathematical model for the energy asset(s) and specifies energy-related revenues from one or more wholesale energy markets (e.g., based on forecasted wholesale energy prices over the time period T for the one or more wholesale markets of interest), from which possible revenue may be available to the energy customer. In some examples, the energy-related revenues specified in the objective cost function may take into consideration a simulated customer baseline (CBL) energy profile (discussed above) as a basis for determining such revenue.

The objective cost function employed in the mathematical optimization to determine a suggested operating schedule for the energy asset(s) also may specify energy-related costs which are offset by the energy-related revenues. In particular, in some examples, the energy-related costs included in the objective cost function may include "actual" energy-related costs. Non-limiting examples of the "actual" energy-related costs include retail electricity costs, wholesale electricity costs representing revenue earned by the energy customer, fuel costs to run one or more electricity generation assets, operation and/or maintenance costs that may be associated with electricity generation and/or energy storage assets, lifetime and/or replacement costs for electricity generation and/or energy storage assets, emissions-related costs, tariffs that can be leveled in the industry, demand charges that can be leveled at times of peak energy usage, etc. The energy-related costs included in the objective cost function additionally or alternatively may include "indirect" energy-related costs, such as convenience/comfort costs associated with the energy customer's adoption of a suggested operating schedule different than the BAU operating schedule (the convenience/comfort cost represents an "indirect" cost associated with a change in the customer's behavior with respect to operating its asset(s), based on the incentive of possible energy-related revenue from the wholesale electricity markets). The energy-related costs may also include a reliability cost (such as based on any voltage/VAR control activity in a microgrid application) and/or an emissions cost based on an emissions market.

Optimization of Objective Cost Function for Generating Energy Asset Operating Schedules In one example, the objective cost function (which incorporates the mathematical model of the energy asset(s)) may be provided to an optimizer (a particularly-programmed processor, also referred to as a "solver") that implements a mathematical optimization process to determine a suggested operating schedule for the energy asset(s) over a given time period T. In one conceptual illustration of the mathematical optimization process, some number N of candidate operating schedules are successively applied to the mathematical model to generate simulated energy profiles corresponding to the candidate operating schedules. A net energy-related cost represented by the objective cost function is calculated for each simulated energy profile, and the candidate operating schedule that minimizes the objective cost function (i.e., minimizes the net energy-related cost) is selected as the suggested operating schedule. In some implementations, the amount of revenue available from the relevant wholesale electricity markets over the given time period T is a significant factor dictating the candidate operating schedule that is provided as an output of the optimizer. The energy-related costs may also include a reliability cost (such as based on any voltage/VAR control activity in a microgrid application) and/or an emissions cost based on an emissions market.

Adopting Operating Schedules, Market Bids and Settlement

The suggested operating schedule in turn may be transmitted to the energy customer (e.g., to an energy management system of the energy customer, including a building management system), and the customer may choose to adopt or not adopt the suggested operating schedule to actually operate its energy asset(s) over the particular time period T for which the optimization is performed. In some implementations, a given operating schedule is transmitted to the energy customer in the form of one or more bias signals representing a change in an operating set point of one or more assets, as a function of time over the time period T, from the typical or "business-as-usual" (BAU) operating set point for the asset(s). In some examples, the energy customer makes a choice to adopt a given suggested operating schedule in tandem with making an offer (a "bid") to provide one or more wholesale electricity market products to the appropriate market pursuant to the adopted operating schedule.

If the energy customer adopts the suggested operating schedule to actually operate its energy asset(s) so as to provide a particular wholesale electricity market product pursuant to an accepted bid (e.g., reduce its energy consumption), various information ultimately is obtained from the energy customer to facilitate a "settlement" process pursuant to which the customer is paid by the wholesale market operator (i.e., the RTO/ISO overseeing the wholesale electricity market(s) in which the customer is participating).

For example, in one example relating to energy markets (wherein the "product" is energy use curtailment), the energy customer's "metered load" (i.e., actual energy use during the time period T in which the suggested operating schedule is adopted) is measured, and compared to a simulated CBL based on the mathematical model for the customer's energy asset(s). The energy customer may then be paid for its economic demand response electricity use reduction based on a difference between the simulated CBL and the actual metered load, multiplied by the actual wholesale energy price during the time period T for the market in question (e.g., LMP).

Apparatus, methods and computer-readable media are described for determining a suggested operating schedule for at least one energy asset operated by an energy customer. In an example, the apparatus includes at least one communication interface, at least one memory to store processing unit-executable instructions and an objective function for the at least one energy asset, at least one processing unit communicatively coupled to the at least one memory. The at least one energy asset comprises at least one controllable energy asset. The objective function facilitates a determination of the suggested operating schedule for the at least one energy asset based at least in part on data representative of model parameters, wherein the model parameters are: (a) an operation characteristic of the at least one controllable energy asset, (b) a thermodynamic property of the at least one energy asset, (c) a projected environmental condition during time period T. Upon execution of the processing unit-executable instructions, the at least one processing unit: (A) prior to time period T, determines the suggested operating schedule based on an optimization of the objective function over time period T, and (B) controls the at least one communication interface to transmit to the energy customer the suggested operating schedule determined in A), and/or controls the at least one memory so as to store the determined suggested operating schedule. The objective function is determined based on a dynamic simulation model of the energy profile of the at least one energy asset, a customer baseline (CBL) energy profile for the at least one energy asset, and a forecast wholesale electricity price, over time period T, associated with a wholesale electricity market. The dynamic simulation model is adaptive to physical changes in the at least one energy asset based on a parametric estimation using at least one of the model parameters, and is trained using the data. The operation of the at least one energy asset according to the suggested operating schedule, over a time period T, facilitates generation of energy-related revenue based at least in part on the wholesale electricity market.

In an example, the CBL energy profile is computed based on applying the dynamic simulation model to the data representative of the operation characteristic of the at least one controllable energy asset, the thermodynamic property of the building asset, and an environmental condition, all during a time period TA prior to time period T.

In an example, the data representative of the projected environmental condition is data representative of at least one of an ambient temperature of the environment in which the building asset is located; a humidity of the environment in which the building asset is located; an amount of solar irradiance of the environment in which the building asset is located, an amount of cloud cover of the environment in which the building asset is located, an outside air temperature, an outside air humidity, an outside air enthalpy, an outside air wet bulb temperature, a dewpoint temperature, and a heat index.

In an example, the at least one energy asset comprises at least one building asset. In an example implementation, the data representative of the thermodynamic property of the building asset is data representative of at least one of an occupancy schedule of the building asset, a relative humidity of the building asset, a temperature of the building asset, and a lighting level of the building asset.

In an example, the thermodynamic property of the at least one energy asset is a zone temperature.

In an example, the at least one processing unit determines the suggested operating schedule for the at least one energy asset as at least one bias signal, as an interruptible load function, or as at least one use modulation signal. In this example, the at least one processing unit determines the suggested operating schedule for the at least one energy asset in (A) as at least one bias signal, and controls the at least one communication interface in (B) to transmit to the energy customer the at least one bias signal at different times during time period T. In this example, the at least one processing unit controls the at least one communication interface to transmit to the energy customer the suggested operating schedule as at least one use modulation signal, and wherein the operation of the at least one energy asset according to the at least one use modulation signal causes a modulation with time of the load use of the controllable energy asset.

In an example, the dynamic simulation model of the energy profile of the at least one energy asset is a semi-linear regression over at least one of the model parameters. In this example, the dynamic simulation model of the energy profile of the at least one energy asset is a semi-linear regression over at least one of a zone temperature of the at least one energy asset, a load schedule of the at least one energy asset, the projected environmental condition, and a control setpoint of the at least one controllable energy asset. In this example, the zone temperature of the at least one energy asset can be a semi-linear regression over at least one of the projected environmental condition, the load schedule of the at least one energy asset, and the control setpoint of the at least one controllable energy asset.

In an example, the dynamic simulation model is trained using the data representative of the operation characteristic of the at least one controllable energy asset and the thermodynamic property of the at least one energy asset, during operation of the at least one energy asset at under similar environmental conditions to the projected environmental condition during time period T.

In an example implementation, the at least one processing unit can further: (C) determines an updated operating schedule for the at least one energy asset, during time period T, based on updated parameters of the suggested operating schedule, and (D) controls the at least one communication interface to transmit to the energy customer the updated operating schedule for at least one energy asset determined in D), and/or controls the at least one memory so as to store the determined updated operating schedule. The updated parameters are determined using a feedback mechanism. The feedback mechanism comprises comparing a predicted value of at least one of the model parameters, computed using the suggested operating schedule, to an actual value measured, during time period T, of the respective at least one of the model parameters.

In an example, the updated parameters of the suggested operating schedule are computed based on Kalman filtering.

In an example, the at least one processing unit can determine the updated operating schedule for the at least one energy asset as at least one bias signal, as an interruptible load function, or as at least one use modulation signal. In this example, the at least one processing unit determines the updated operating schedule for the at least one energy asset in (A) as at least one bias signal, and controls the at least one communication interface in (B) to transmit to the energy customer the at least one bias signal at different times during time period T. In this example, the at least one processing unit controls the at least one communication interface to transmit to the energy customer the updated operating schedule as at least one use modulation signal, wherein the operation of the at least one energy asset according to the at least one use modulation signal causes a modulation with time of the loads use of the controllable energy asset.

In an example, the at least one processing unit can further: (C) determine a mathematical model of the energy profile of the at least one energy asset in operation according to the operating schedule during time period T; and (D) determine the energy-related revenue based on a comparison between at least one demand response revenue derived from the wholesale electricity market and at least one energy-related cost associated with operation of the at least one energy asset according to the suggested operating schedule.

Apparatuses, methods and computer-readable media are described for modeling of a building asset. The building asset models generated using the apparatuses, methods and computer-readable media described herein facilitate revenue generation from wholesale electricity markets. The wholesale electricity market may be an energy market, a regulation market, and/or a spinning reserve market. The revenue generation from the wholesale electricity markets is based on the output of the building asset model. In an example, the apparatus includes at least one communication interface, at least one memory to store processor-executable instructions and a mathematical model, and at least one processing unit. The mathematical model is used to generate the building asset model according to a method described herein, based at least in part on at least one operation characteristic of the building asset. The at least one processing unit is communicatively coupled to the at least one communication interface and the at least one memory. Upon execution of the processor-executable instructions, the at least one processing unit determines the building asset model using the mathematical model. Input to the mathematical model includes at least one operation characteristic of the building asset. Input to the mathematical model may include the time period being modeled, and/or weather-related parameters, including outside air temperature (OAT), outside air humidity (OAH), solar irradiance ($Q_{irradiance}$), and/or cloud cover. Upon execution of the processor-executable instructions, the at least one processing unit also controls the at least one communication interface to transmit to the energy customer the determined building asset model, and/or output generated based on the building asset model. In an example, the output of the building asset model include values for building zone air temperature and/or a set-point (SPT) for one or more building components. In a non-limiting example, the building zone air temperature is a return-air-temperature (RAT). In an example, the output of the mathematical model include other parameters that are determined based on the output of the building asset model such as but not limited to the building zone air temperature (including a RAT), and/or the SPT. Output of the mathematical model can include a projected value of energy usage.

In an example, a building asset model described herein can be a self-tuning model. A self-tuning model provides for faster implementation with accuracy within the standards of energy market and regulatory bodies. An example self-tuning model described herein considers together the building thermodynamic effects (including radiation, conduction, convection and inertia) along with the operation of building components (including the mechanical/HVAC system). An example self-tuning model described herein is applicable to all building types, including the poorly sensed buildings (for which there is little data on its operation characteristics).

Apparatuses, methods and computer-readable media are also described for generating a building asset model to determine operation parameters and operating schedules for at least one building asset. In an example, the apparatus includes at least one communication interface, at least one memory to store processor-executable instructions and a mathematical model, and at least one processing unit. The mathematical model is used to generate the building asset model according to a method described herein, based at least in part on at least one operation characteristic of the building asset. The at least one processing unit is communicatively coupled to the at least one communication interface and the at least one memory. Upon execution of the processor-executable instructions, the at least one processing unit determines the building asset model using the mathematical model. Input to the mathematical model includes at least one operation characteristic of the building asset.

In one aspect, apparatuses, methods and computer-readable media are described for generating a day-ahead building asset model to determine operation parameters and/or operating schedules for at least one building asset. The apparatus includes at least one communication interface, at least one memory to store processor-executable instructions and a day-ahead building asset model, and at least one processing unit. The day-ahead building asset model is used to generate operation parameters and operating schedules for at least one building asset according to a method described herein, based at least in part on at least one operation characteristic of the building asset. The at least one processing unit is communicatively coupled to the at least one communication interface and the at least one memory. Upon execution of the processor-executable instructions, the at least one processing unit determines the operation parameters and/or operating schedules for at least one building asset using the day-ahead building asset model. Input to the day-ahead building asset model includes at least one operation characteristic of the building asset. For example, input to the day-ahead building asset model may include the time period being modeled, and/or weather-related parameters, including outside air temperature (OAT), outside air humidity (OAH), solar irradiance ($Q_{irradiance}$), and/or cloud cover. Upon execution of the processor-executable instructions, the at least one processing unit also controls the at least one communication interface to transmit to the energy customer the determined operation parameters and/or operating schedules. In an example, the operation parameters and/or operating schedules include values for building zone air temperature (including a return-air-temperature (RAT)) and/or a set-point (SPT) for one or more building components. Output of the day-ahead building asset model can be used to determine a projected value of energy usage. The output of the day-ahead building asset model can be used to project a day-ahead expected performance of at least one component and/or system of the building asset when they are later operated.

In one aspect, apparatuses, methods and computer-readable media are described for generating a real-time building asset model to determine operation parameters and/or operating schedules for at least one building asset. The apparatus includes at least one communication interface, at least one memory to store processor-executable instructions and a real-time building asset model, and at least one processing unit. The real-time building asset model is used to generate operation parameters and operating schedules for at least one building asset according to a method described herein, based at least in part on at least one operation characteristic of the building asset. The at least one processing unit is communicatively coupled to the at least one communication interface and the at least one memory. Upon execution of the processor-executable instructions, the at least one processing unit determines the operation parameters and/or operating schedules for at least one building asset using the real-time building asset model. Input to the real-time building asset model includes a measured value of at least one operation characteristic of the building asset during real-time operation. For example, input to the real-time building asset model may include weather-related parameters, including outside air temperature (OAT), outside air humidity (OAH), solar irradiance ($Q_{irradiance}$), and/or cloud cover. Upon execution of the processor-executable instructions, the at least one processing unit also controls the at least one communication interface to transmit to the energy customer the determined operation parameters and/or operating schedules. In an example, the operation parameters and/or operating schedules include values for building zone air temperature (including a return-air-temperature (RAT)) and/or a set-point (SPT) for one or more building components. Output of the real-time building asset model can used to determine a projected value of energy usage. The output of the real-time building asset model can be used to adjust or modify one or more operating schedules of the building asset when it is being operated. In an example, the output of the real-time building asset model can be used to adjust or modify one or more operating schedules of the building asset when it is being operated according to an output of a day-ahead building asset model.

In one aspect, apparatuses, methods and computer-readable media are described for generating a day-after building asset model to determine actual operation parameters of at least one building asset. The apparatus includes at least one communication interface, at least one memory to store processor-executable instructions and a day-after building asset model, and at least one processing unit. The day-after building asset model is used to generate operation parameters for at least one building asset according to a method described herein, based at least in part on at least one operation characteristic of the building asset. The at least one processing unit is communicatively coupled to the at least one communication interface and the at least one memory. Upon execution of the processor-executable instructions, the at least one processing unit determines the operation parameters for at least one building asset using the day-after building asset model. Input to the day-after building asset model includes a measured value of at least one operation characteristic of the building asset during a period of operation of at least one component and/or system of the building asset. For example, input to the day-after building asset model may include the time period during which the building asset was operated, and/or weather-related parameters, including outside air temperature (OAT), outside air humidity (OAH), solar irradiance ($Q_{irradiance}$), and/or cloud cover. Upon execution of the processor-executable instructions, the at least one processing unit also controls the at least one communication interface to transmit to the energy customer the determined actual operation parameters. In an example, the actual operation parameters include values for actual load and/or actual energy usage of the building asset.

In an example, the day-after building asset model can be used to determine actual operation parameters of at least one building asset that was operated according to operating schedules determined using an output of a day-ahead building asset model and/or an output of a real-time building asset model. The operation parameters determined using the day-after building asset model can be used for settlement purposes, e.g., to compute an amount of energy-related revenue due to the energy customer. Output of the day-after building asset model can used to determine a projected value of energy usage.

Apparatuses, methods and computer-readable media are described for applying a different building asset models at different stages during operation of at least one component and/or system of the building asset. In different examples, the building asset model is a day-ahead building asset model, a real-time building asset model, or a day-after building asset model. The apparatuses, methods and computer-readable media can be used to generate the day-ahead building asset model, and/or to apply the day-ahead building asset model to input parameters characteristic of the building asset to project a day-ahead expected performance of at least one component and/or system of the building asset prior to operation. In an example, the output of the day-ahead building asset model is used in computation of an objective cost function. In an example, the output of the day-ahead building asset model is used in computation of an energy-related revenue. The apparatuses, methods and computer-readable media can be used to generate the real-time building asset model, and/or to apply the real-time building asset model to model a real-time performance of at least one component and/or system of the building asset during the time period that they are operated. The apparatuses, methods and computer-readable media can be used to generate the day-after building asset model, and/or to apply the day-after building asset model to model an actual performance of at least one component and/or system of a building asset after they have been operated. In an example, the output of the day-after building asset model is used in computation of an objective cost function. In an example, the output of the day-after building asset model is used in computation of an energy-related revenue.

Apparatuses, methods and computer-readable media are also described for applying a building asset model, including a day-ahead building asset model, a real-time building asset model, or a day-after building asset model, to determine operation parameters and, where pertinent, operating schedules, for controllers of one or more components of the building asset.

Apparatuses, methods and computer-readable media are also described for generating a seasonal building asset model. For example, the building asset model developed to model the building asset for a summer season can differ from the building asset model developed to model the building asset for a fall, winter, or spring season, based on the differing environmental and weather conditions and responses thereto. In an example, a seasonal building asset model is generated by varying temperature-related terms. The seasonal building asset model can be developed as a day-ahead building asset model, a real-time building asset model, or a day-after building asset model, to determine operation parameters and operating schedules for the building asset or for one or more components of the building asset. In another example, the seasonal building asset model can be developed as a day-ahead building asset model, a real-time building asset model, or a day-after building asset model, to determine operation parameters and, where pertinent, operating schedules, for the controllers of one or more components of the building asset.

Apparatuses, methods and computer-readable media described herein can be used for determining an operating schedule of at least one controller of at least one energy asset so as to generate energy-related revenue, over a time period T, associated with operation of the at least one energy asset according to the operating schedule. The energy-related revenue available to the energy customer over the time period T is based at least in part on at least one wholesale electricity market. The apparatus includes at least one communication interface, at least one memory to store processor-executable instructions and a mathematical model for the at least one energy asset, and at least one processing unit. The mathematical model facilitates a determination of the operating schedule for the controllers based at least in part on an operation characteristic of the at least one energy asset and forecast wholesale electricity prices associated with the at least one wholesale electricity market. The at least one processing unit is configured to determine the operating schedule for the at least one controller of the at least one energy asset using the mathematical model by minimizing a net energy-related cost over the time period T. The net-energy related cost is based at least in part on at least one energy supply cost and at least one demand response revenue. The operating schedule specifies, during a time interval within the time period T, conditions for use of the at least one energy asset in respective ones of the at least one energy market. The at least one processing unit is also configured to control the at least one communication interface to transmit to the energy customer the operating schedule for the at least one controller of the at least one energy asset, control the at least one memory so as to store the determined operating schedule for the at least one controller, and/or control the at least one communication interface to transmit to the at least one controller of at least one energy asset the operating schedule. The energy asset can include at least one of an energy storage asset, an energy generating asset, an energy consuming asset, or any combination thereof. The at least one wholesale electricity market can be at least one of an energy market, a regulation market, a spinning reserve market, or any combination thereof. The forecast wholesale electricity prices associated with the energy market can be a wholesale price. The forecast wholesale electricity prices associated with the regulation market can be a regulation price. The forecast wholesale electricity prices associated with the spinning reserve market can be a spinning reserve market price.

At least one computer-readable storage medium is provided herein. The at least one computer-readable storage medium is encoded with instructions that, when executed using at least one processor unit described herein, performs a method according to a principle described herein. For example, the method can be for modeling a building asset and/or for applying a building asset model to operation characteristics of a building asset to generate an operating schedule for the building asset or for a controller of at least component of the building asset.

The following patent applications are hereby incorporated herein by reference in their entirety:
U.S. Provisional Application No. 61/477,067, filed on Apr. 19, 2011;
U.S. Provisional Application No. 61/552,982, filed on Oct. 28, 2011;
U.S. Non-provisional application Ser. No. 12/850,918, filed on Aug. 5, 2010; and
U.S. Provisional Application No. 61/279,589, filed on Oct. 23, 2009.

The entire disclosure of these applications is incorporated herein by reference in its entirety, including drawings, It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 4 illustrates an example block diagram representing an asset model according to a principle described herein.

FIG. 5 illustrates an example block diagram representing another asset model according to a principle described herein.

FIG. 6 illustrates an example block diagram representing another asset model according to a principle described herein.

FIG. 7 illustrates an example block diagram representing another asset model according to a principle described herein.

DETAILED DESCRIPTION

Figure 1:
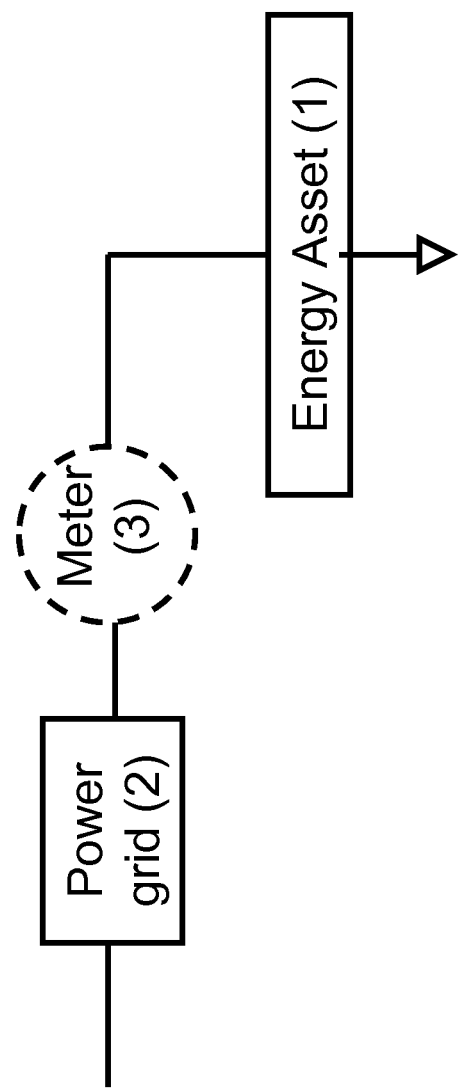
FIG. 1 shows an example system that includes an energy asset, according to a principle described herein.

Following below are more detailed descriptions of various concepts related to, and embodiments of, inventive methods, apparatus, and systems for determining a suggested operating schedule for energy assets to facilitate revenue generation from wholesale electricity markets. The systems, methods and apparatus described herein can be applied to a building asset. The output of the different models also can be used for determining a suggested operating schedules for the building asset. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As used herein, the term "includes" means includes but not limited to, the term "including" means including but not limited to. The term "based on" means based at least in part on.

As used herein, the term "in communication with" includes direct communication between elements as well as indirect communication between the elements, such as by means of at least one intermediate component. As used herein, the term "in electrical communication with" includes direct electrical communication between elements as well as indirect electrical communication between the elements, such as by means of at least one intermediate component.

The methods, apparatus, and systems disclosed herein provide resources by which a certain environment that includes one or more energy assets is modeled, energy use and/or generation profiles of the assets may be simulated based on the model(s), and operating schedules for the energy asset(s) may be suggested, based on such simulations, to facilitate revenue generation from one or more wholesale electricity markets for energy customers overseeing the environment (e.g., operating the energy asset(s) within the environment). Environments including one or more of a wide variety of energy assets are contemplated, examples of which include, but are not limited to, a building or group of buildings that include one or more energy-consuming and/or energy-generating assets (e.g., heaters, HVAC systems, chillers/ice makers, fossil-fuel-based and/or renewable electricity generators, energy storage devices), as well as other environments in which one or more building may not be involved (but which may nonetheless include one or more energy assets).

In some examples, optimization software constituting an "optimizer" module (also referred to as a "solver" or simply "optimizer") is used to perform an optimization process to determine suggested operating schedules for one or more energy assets that minimize net energy-related costs for the energy customer. In one aspect, the optimization process is based at least in part on balancing respective energy-related costs and energy-related revenues in connection with the energy customer's operating environment and assets therein, in consideration of wholesale electricity prices as a function of time. In other aspects, an "objective cost function" that represents the net energy-related cost as a function of an operating schedule for the energy asset(s) and a mathematical model for the energy asset(s) may include multiple constituent components, examples of which include, but are not limited to:

1. a convenience or comfort cost associated with deviation from the CBL or business-as-usual (BAU) operating schedule,
2. a cost associated with electric power production by the customer's energy generating assets (if any),
3. a cost associated with electric power supply from a retail electricity supplier, and
4. a cost associated with economic demand response (DR) revenue from one or more wholesale electricity markets.

Accordingly, salient aspects of example methods, apparatus and systems according the principles described herein are to provide energy asset management capabilities for reducing retail electricity costs by optimizing electricity usage, generation, and storage, while at the same time providing significant revenue opportunities in markets, including wholesale electricity markets, in regulation markets, in synchronized reserve markets and/or in emissions markets.

In an example, an optimization module of an example energy management system according to the principles described herein can be used to perform an optimization process. In a non-limiting example, the optimization process can be performed as a staged process. In a stage of the optimization process, a computation can be performed to calculate how a system including at least one energy asset responds on a normal day using the default settings of the energy assets and with no outside intervention. The result can be used to determine a business-as-usual (BAU) schedule. A customer baseline (CBL) schedule can be derived based on applying a mathematical model to the BAU schedule. Alternatively, a predetermined CBL or BAU schedule may be introduced into the optimization process rather than calculated. Additionally, the optimization may be used to determine the financial impact with respect to the CBL schedule or the BAU schedule. In another stage of the optimization process, an optimization can be run with certain operating changes that may be entered by a system operator of the energy management system. This stage may also factor in energy prices and/or emissions trading prices. Again, the optimization module may be used to determine the financial impact of the optimized operating schedule, preferably showing the financial benefit thereof as compared with a BAU schedule.

The apparatuses and methods described herein are applicable to a system that includes an energy asset 1. The energy asset 1 can be a building asset. In the non-limiting example of FIG. 1, the energy asset 1 is in communication with a power grid 2 (as depicted in the example of FIG. 1). As depicted in the non-limiting example of FIG. 1, the energy asset 1 may be located behind a power meter 3. For example, the energy asset 1 may be one or more facilities of the energy consumer.

Figure 2:
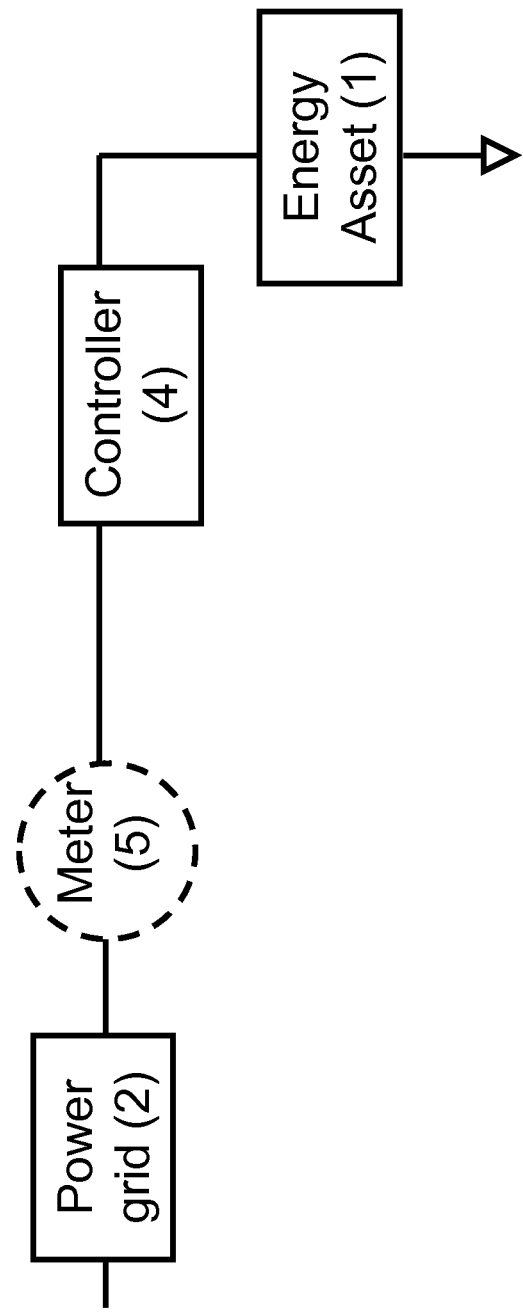
FIG. 2 shows an example system that includes an energy asset and a controller, according to a principle described herein.

The apparatuses and methods described herein are also applicable to a system that includes an energy asset 1 and a controller 4 in communication with at least one component of the energy asset 1, where the energy asset 1 and the controller 4 are in communication with a power grid 2 (as depicted in the example of FIG. 2). The controller 4 facilitates operating the one or more components of the energy asset 1 according to an operating schedule and/or operation parameters generated using a building asset model described herein. As depicted in the non-limiting example of FIG. 2, the controller 4 and the energy asset 1 may be located behind a power meter 5. For example, the energy asset 1 may be one or more facilities of the energy consumer and the controller 4 may be located at any of the one or more facilities.

In any of the apparatuses, methods, and/or computer readable media described herein, the building asset model can be a self-tuning model. For example, any of the day-ahead building asset models, the real-time building asset models, or day-after building asset models described herein can be a self-tuning model. In an example, a combination of various types of self-tuning models may be applied a given building asset as a day-ahead building asset model, a real-time building asset model, or a day-after building asset model. Various examples and aspects of self-tuning building asset models that are applicable to any of the apparatuses, methods, and/or computer readable media are described herein.

The output of the building asset models described herein may be used to operate an energy asset in a way that facilitates generation of energy-related revenue for an energy customer of an electricity supplier. The energy customer may commit an amount of energy or energy curtailment from the at least one energy asset to an energy market.

In an example, the electricity supplier may be a retail electricity supplier that supplies the electricity to the energy customer at a retail price. In another example, the electricity supplier may supply the electricity to the energy customer at a contracted for or negotiated price. In various examples herein, the energy customer may allow an amount of capacity of the energy asset to be committed to the energy market.

In a non-limiting example, an apparatus or a method described herein can be used to generate an operating schedule for a controller that communicates with the energy asset and/or at least one component of the energy asset. The controller is capable of exercising an amount of control over the energy asset and/or at least one component of the energy asset. Operation of the controller, and hence the energy asset and/or at least one component of the energy asset, according to the operating schedule generated by a principle herein over the specified time period may generate for the energy customer an amount of energy-related revenue based at least in part on a wholesale electricity market.

Figure 3:
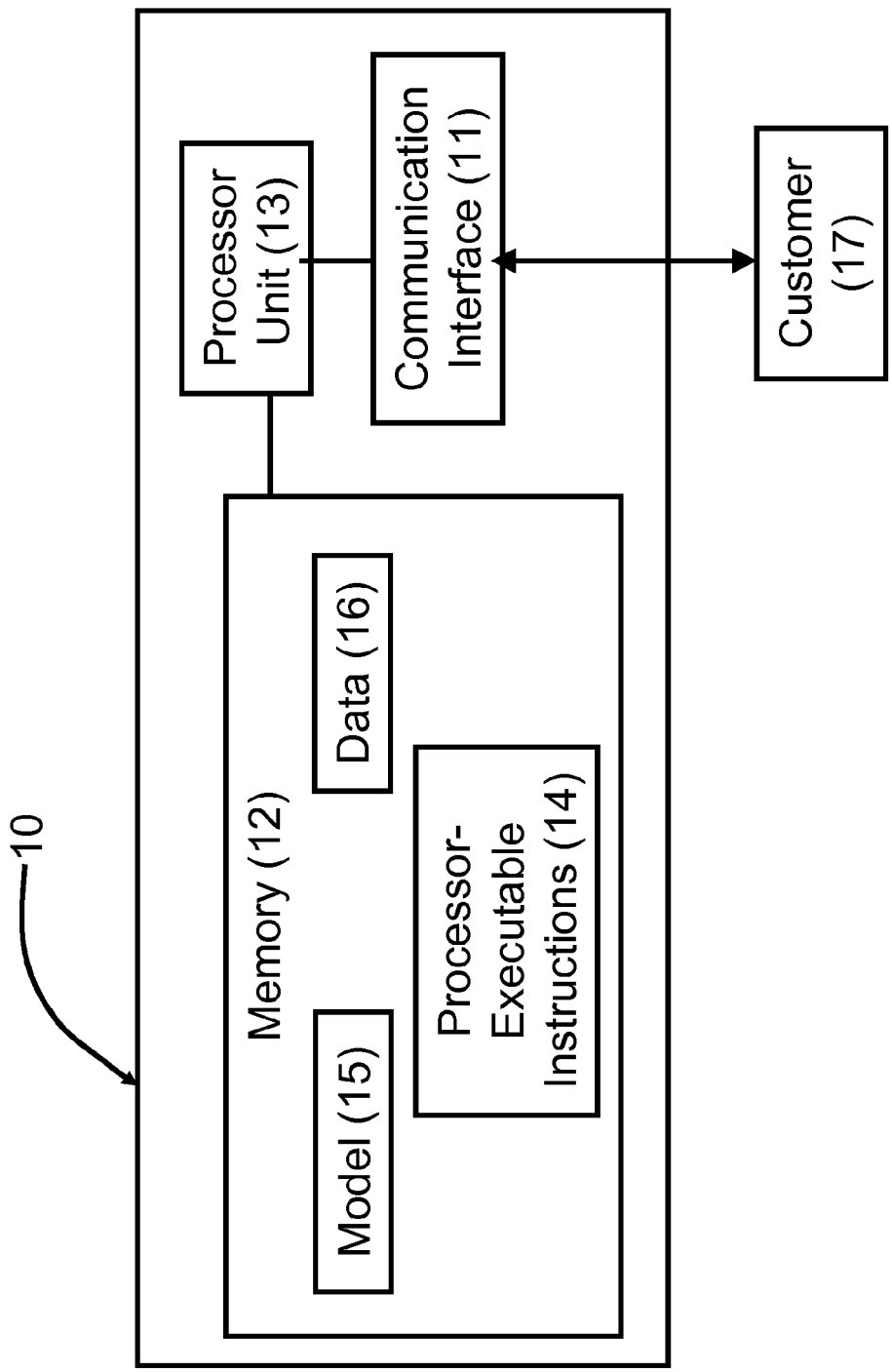
FIG. 3 shows an example apparatus according to a principle described herein.

A non-limiting example of the apparatus 10 according to the principles described herein is illustrated in FIG. 3. The apparatus 10 includes at least one communication interface 11, at least one memory 12, and at least one processing unit 13. The at least one processing unit 13 is communicatively coupled to the at least one communication interface 11 and the at least one memory 12.

The at least one memory 12 is configured to store processor-executable instructions 14 and a mathematical model 15. In a non-limiting example, the mathematical model 15 can be used to generate the building asset model according to a method described herein, based at least in part on at least one operation characteristic of the building asset. In another non-limiting example, the mathematical model can be used to determine an operating schedule for a controller of one or more components of a building asset based on data 16 associated with parameters, including but not limited to, an operation characteristic of the energy asset and a forecast wholesale electricity price associated with the wholesale electricity market.

In an example, the wholesale electricity price for a market differs according to the time period in the day, e.g., during on-peak times versus off-peak times. In an example, the forecast wholesale electricity prices used in the computation of the day-ahead building asset model may be the same as the wholesale electricity prices used for the real-time model and for the day-after model. In another example, the forecast wholesale electricity prices used in the computation of the day-ahead building asset model may differ from the wholesale electricity prices used for the real-time model, which in turn may differ from the wholesale electricity prices used for the day-after model. In an example, the wholesale electricity price is computed as a budget or actual market prices on the day that the systems of the building asset is run, as compared to a forecasted wholesale electricity price for the day-ahead model. In an example, the wholesale electricity prices, including the forecast wholesale electricity prices, may be set by a market operator (such as but not limited to a RTO), or other third party provider.

In a non-limiting example, the at least one processing unit 13 executes the processor-executable instructions 14 stored in the memory 12 at least to determine the building asset model using the mathematical model 15. The at least one processing unit 13 also executes processor-executable instructions 14 to control the communication interface 11 to transmit to the energy customer 17 the building asset model that has been determined and/or controls the memory 12 to store the determined building asset model.

In an example, the at least one processing unit 13 executes the processor-executable instructions 14 stored in the memory 12 at least to determine the building asset model using the mathematical model 15 as a self-tuning model. A self-tuning model provides for faster implementation with accuracy within the standards of energy market and regulatory bodies. An example self-tuning model described herein considers together the building thermodynamic effects (including radiation into or out of the building asset, conduction, convection and inertia) along with the operation of building components (including the mechanical/HVAC system). An example self-tuning model described herein is applicable to all building types, including the poorly sensed buildings (for which there is little data on its operation characteristics).

Upon execution of the processor-executable instructions, the at least one processing unit also controls the at least one communication interface to transmit to the energy customer the determined building asset model, and/or output generated based on the building asset model. In an example, the output of the building asset model includes values for building zone air temperature (including a return-air-temperature (RAT)) and/or a set-point (SPT) for one or more building components. In an example, the output of the mathematical model include other parameters that are determined based on the output of the building asset model such as but not limited to the building zone air temperature (including a RAT) and/or the SPT. Output of the mathematical model can include a projected value of energy usage.

In a non-limiting example, the at least one processing unit 13 executes the processor-executable instructions 14 stored in the memory 12 at least to generate a building asset model to determine operation parameters and/or operating schedules for at least one building asset. The mathematical model 15 is used to generate the building asset model according to a method described herein, based at least in part on at least one operation characteristic of the building asset. Upon execution of the processor-executable instructions 14, the at least one processing unit 13 determines the building asset model using the mathematical model 15. Input to the mathematical model 15 includes at least one operation characteristic of the building asset.

In a non-limiting example, other possible input to the model include information about weather condition, solar radiance, degree of cloud cover, outside air temperature, or outside air humidity.

The at least one operation characteristic of the building asset in any of the building asset models described herein can be at least one of a zone temperature, a prior load, a HVAC schedule, a control setpoint, or a HVAC temperature.

The determined operation parameters and/or operating schedules for the at least one building asset can be at least one of a building zone air temperature (including a return air temperature (RAT)), a setpoint (SPT), a zone temperature, a load, or an HVAC schedule. In any of the examples described herein, the RAT can be used as an indicator of the zone temperature ($T_z$).

In one aspect, the at least one processing unit 13 executes the processor-executable instructions 14 stored in the memory 12 at least to generate a day-ahead building asset model to determine operation parameters and/or operating schedules for at least one building asset. The day-ahead building asset model is used to generate operation parameters and operating schedules for at least one building asset according to a method described herein, based at least in part on at least one operation characteristic of the building asset. Output of the day-ahead building asset model can used to determine a projected value of energy usage. The output of the day-ahead building asset model can be used to project a day-ahead expected performance of at least one component and/or system of the building asset when they are later operated.

In one aspect, the at least one processing unit 13 executes the processor-executable instructions 14 stored in the memory 12 at least to generate a real-time building asset model to determine operation parameters and/or operating schedules for at least one building asset. The real-time building asset model is used to generate operation parameters and operating schedules for at least one building asset according to a method described herein, based at least in part on at least one operation characteristic of the building asset. Output of the real-time building asset model can used to determine a projected value of energy usage. The output of the real-time building asset model can be used to adjust or modify one or more operating schedules of the building asset when it is being operated. In an example, the output of the real-time building asset model can be used to adjust or modify one or more operating schedules of the building asset when it is being operated according to an output of a day-ahead building asset model.

In one example, the at least one processing unit 13 executes the processor-executable instructions 14 stored in the memory 12 at least to generate a day-after building asset model to determine actual operation parameters of at least one building asset. The day-after building asset model is used to compute actual operation parameters for at least one building asset according to a method described herein, based at least in part on at least one operation characteristic of the building asset. In an example, the actual operation parameters include values for actual load and/or actual energy usage of the building asset. In an example, the day-after building asset model can be used to determine actual operation parameters of at least one component or system of a building asset that was operated according to operating schedules determined using an output of a day-ahead building asset model and/or an output of a real-time building asset model. Output of the day-after building asset model can used to determine a projected value of energy usage. The operation parameters determined using the day-after building asset model can be used for settlement purposes, e.g., to compute an amount of energy-related revenue due to the energy customer. For example, the day-after building asset model can be used to model actual readings of components or systems of a building asset when, e.g., the HVAC is run, the zone temperature (including the RAT) is measured, electricity used, and so can be used to model the actual energy usage of a building asset.

In one example, the at least one processing unit 13 executes the processor-executable instructions 14 stored in the memory 12 at least to apply different building asset models at different stages during operation of at least one component and/or system of the building asset. In different examples, the building asset model is a day-ahead building asset model, a real-time building asset model, or a day-after building asset model. The at least one processing unit 13 may execute the processor-executable instructions 14 stored in the memory 12 at least to generate the day-ahead building asset model, and/or to apply the day-ahead building asset model to input parameters characteristic of the building asset to project a day-ahead expected performance of at least one component and/or system of the building asset and/or operating parameters of the building asset prior to operation of at least one component and/or system of the building asset. In an example, the at least one processing unit 13 may execute the processor-executable instructions 14 stored in the memory 12 at least to compute an objective cost function based on the output of the day-ahead building asset model. In an example, the at least one processing unit 13 may execute the processor-executable instructions 14 stored in the memory 12 at least to compute an energy-related revenue based on the output of the day-ahead building asset model for settlement purposes. The at least one processing unit 13 may execute the processor-executable instructions 14 stored in the memory 12 at least to generate the real-time building asset model, and/or to apply the real-time building asset model to model a real-time performance of at least one component and/or system of the building asset during the time period that the building is operated (and possibly modify the operating schedule based on application of Kalman filtering to update the model). The at least one processing unit 13 may execute the processor-executable instructions 14 stored in the memory 12 at least to generate the day-after building asset model, and/or to apply the day-after building asset model to determine an actual performance of at least one component and/or system of a building asset after they have been operated. In an example, the at least one processing unit 13 may execute the processor-executable instructions 14 stored in the memory 12 at least to compute an objective cost function based on the output of the day-after building asset model. In an example, the at least one processing unit 13 may execute the processor-executable instructions 14 stored in the memory 12 at least to compute an energy-related revenue based on the output of the day-after building asset model for settlement purposes.

In a non-limiting example, the day-ahead building asset model, the real-time building asset model and the day-after building asset model are applied in time-order sequence to a single building asset or collection of building assets.

In another non-limiting example, the day-ahead building asset model, the real-time building asset model and the day-after building asset model are applied to a single building asset or collection of building assets in the same given day. For example, on a given day the at least one processing unit 13 may apply to the building asset (or collection of building assets):
(i) a day-after building asset model to determine the operating schedule for the following day, to project a day-ahead expected performance of at least one component and/or system of the building asset and/or operating parameters of the building asset;
(ii) a real-time building asset model possibly to modify the operating schedule based on application of Kalman filtering to update the model as the given day progresses; and
(iii) a day-after building asset model to determine the actual performance of at least one component and/or system of a building asset based on its operation the previous day, e.g., with the computation of energy-related revenue, for settlement purposes.

In an example, the at least one processing unit 13 executes the processor-executable instructions 14 stored in the memory 12 at least to apply a building asset model, including a day-ahead building asset model, a real-time building asset model, or a day-after building asset model, to determine operation parameters and, where pertinent, operating schedules, for controllers of one or more components of the building asset.

In a non-limiting example, the at least one processing unit 13 executes the processor-executable instructions 14 stored in the memory 12 at least to determine the operating schedule for the controller of the energy asset using the mathematical model 15. The at least one processing unit 13 also executes processor-executable instructions 14 to control the communication interface 11 to transmit to the energy customer 17 the operating schedule that has been determined for the controller and/or controls the memory 12 to store the determined operating schedule for the controller. In a non-limiting example, the processing unit 13 may execute processor-executable instructions 14 to control the communication interface 11 to transmit to the operating schedule directly to the controller.

In a non-limiting example, the at least one processing unit 13 executes the processor-executable instructions 14 stored in the memory 12 at least to determine an operating schedule of at least one controller of at least one energy asset so as to generate energy-related revenue, over a time period T, associated with operation of the at least one energy asset according to the operating schedule. The energy-related revenue available to the energy customer over the time period T is based at least in part on at least one wholesale electricity market. The mathematical model 15 facilitates a determination of the operating schedule for the controllers based at least in part on an operation characteristic of the at least one energy asset and forecast wholesale electricity prices associated with the at least one wholesale electricity market. The at least one processing unit 13 is configured to determine the operating schedule for the at least one controller of the at least one energy asset using the mathematical model 15 by minimizing a net energy-related cost over the time period T. The net-energy related cost is based at least in part on at least one energy supply cost and at least one demand response revenue. The operating schedule specifies, during a time interval within the time period T, conditions for use of the at least one energy asset in respective ones of the at least one energy market. The at least one processing unit 13 is also configured to control the at least one communication interface 11 to transmit to the energy customer 17 the operating schedule for the at least one controller of the at least one energy asset, control the at least one memory so as to store the determined operating schedule for the at least one controller, and/or control the at least one communication interface to transmit to the at least one controller of at least one energy asset the operating schedule. The energy asset can include at least one of an energy storage asset, an energy generating asset, an energy consuming asset, or any combination thereof. The at least one wholesale electricity market can be at least one of an energy market, a regulation market, a spinning reserve market, or any combination thereof. The forecast wholesale electricity prices associated with the energy market can be a wholesale price. The forecast wholesale electricity prices associated with the regulation market can be a regulation price. The forecast wholesale electricity prices associated with the spinning reserve market can be a spinning reserve market price.

The operation characteristic of the energy storage asset may be its state of charge, charge rate, the degree of non-linearity of the charge rate, discharge rate, degree of non-linearity of the discharge rate, round trip efficiency, and degree of life reduction. In an example where the operation characteristic of the energy storage asset is its charge rate and/or discharge rate, the operating schedule for the controller may include suggested different time intervals for charging the energy storage asset or discharging the energy storage asset during the time period T that the system is in operation.

The optimized operating schedule according to the systems, apparatus and methods described herein is based on an optimization of an objective cost function over an entire time period T. The optimized schedule results from the maximization of the economic benefit, given constraints on the controls or on the states, or more generally from the minimization or maximization of an objective function. As a non-limiting example, the suggested operating schedule may calls for a counter-intuitive action, such as sending a signal to a controller to increase a load, e.g., to charge an energy storage asset (such as a battery) or increase the load of another type of controllable energy asset (such as a HVAC), even during a time interval when the forecast prices are expected to be higher. The optimization according to the principles described herein evaluate the various actions and responses of the energy assets over the entire time period T in order to optimize the objective cost function, e.g., to maximize the economic benefit, given constraints on the controls or on the states. Accordingly, implementation of a suggested operating schedule generated according to the system, method or apparatus described herein can result in actions that differ from more heuristic approaches.

In an example, the operation characteristic of an energy asset may be its load use schedule. For example, the operation characteristic of the energy asset can be its energy consumption profile as a function of time. The energy consumption characteristics of a controllable energy asset may be modified by changing parameters of operation of the system. A non-limiting example of an operation characteristic for a controllable energy asset is its set point. The set point may be a controllable set point, e.g., it may be controllable as a function of time or temperature. For example, where the controllable energy asset is a building with a variable internal temperature controlled by a heating, ventilation and air conditioning (HVAC) system, the operation characteristic may be a temperature set point for the HVAC system. In another example, the operation characteristic may be a setting of the component. For example, where the component is a HVAC or a chiller, the operation characteristic may be a cooling rate/speed of the HVAC or a chill rate of the chiller, respectively.

As described herein, in an example, an amount of energy of the energy storage asset may be generated and supplied to the power line at a discharge rate to generate energy-related revenue for the energy customer in an energy market. The energy-related revenue can depend on a forecast wholesale electricity price associated with the wholesale electricity market, and may be determined based on computation of a net-energy related cost. The net energy related cost may be computed based on the supply costs for supplying electricity to the customer and a demand response revenue. An apparatus and method herein can be implemented to generate an operating schedule for the controller of the energy storage asset that provides recommendations for the timing of charging and discharging of the energy storage asset.

In an example, the processing unit 13 can be configured to determine the operating schedule for the controller of the at least one energy asset using the mathematical model 15 by minimizing a net energy-related cost over a relevant time period (T). The net energy-related cost can be associated with electricity generation by the energy storage asset, electricity consumption by the energy storage asset, and electricity consumption by the energy consuming asset. Here, the energy-related revenue available to the energy customer may be computed based at least in part on the minimized net energy-related cost.

The net energy-related cost may be specified as a difference between the electricity supply cost and the economic demand response revenue over the pertinent time period.

In an example, the processing unit 13 can be configured to determine the operating schedule for the controller using the mathematical model and a representative customer baseline (CBL) energy profile for the energy consuming asset over the time period (T). As used herein, the term "representative customer baseline energy profile" or "representative CBL energy profile" encompasses representations of the energy customer's energy usage in the absence of change of behavior according to the principles described herein. As non-limiting examples, the "representative customer baseline energy profile" or "representative CBL energy profile" includes an estimation based on the energy customer's business-as-usual (BAU) operations, including any form of averaged or weighted measure based on measures of historical BAU operations. Herein, the representative CBL energy profile represents a typical operation of the at least one energy consuming asset by the energy customer. For example, where the energy consuming asset is a fixed-load asset, the representative CBL may be determined as the energy consumption profile for the energy consuming asset.

Where the operating schedule for the controller is generated based on using the mathematical model and a representative customer baseline (CBL) energy profile, the economic demand response revenue may be computed based on the forecast wholesale electricity price, the electricity generation by the energy storage asset, the electricity consumption by the energy storage asset, and the representative CBL energy profile for the energy consuming asset. The values of economic demand response revenue computed according to a principle herein may be used for settlement purposes. For example, the values of economic demand response revenue computed according to a principle herein may be provided to an energy supplier for settlement purposes.

In an example herein, a portion of the energy of the energy storage asset may be committed to the regulation market. That is, the wholesale electricity market for the energy customer would include an energy market and a regulation market. In an example where the forecast wholesale electricity price is for the energy market, the operating schedule for the controller may specify optimal time intervals for use of the energy storage asset in the regulation market. As a non-limiting example, the suggested operating schedule may calls for a counter-intuitive action, such as committing a portion of the energy of the energy storage asset to the regulation market even during a time interval when the forecast wholesale electricity price are expected to be higher than the potential revenue from the regulation market during that time. The optimization according to the principles described herein evaluate the various actions and responses of the energy assets over the entire time period T in order to optimize the objective cost function, e.g., to maximize the economic benefit, given constraints on the controls or on the states. Accordingly, implementation of a suggested operating schedule generated according to the system, method or apparatus described herein can result in actions that differ from more heuristic approaches.

According to an example of the principles herein, the wholesale electricity market may include both the energy market and the regulation market, and the operating schedule generated may facilitate implementation of the energy storage asset in both the energy market and the regulation market. According to a principle of virtual partitioning described herein, the operating schedule for the controller may be configured so that the energy customer may participate in both the energy market and the regulation market concurrently the energy storage asset. In a non-limiting example, the operating schedule for the controller of the energy storage asset may specify that, during a given time interval, a first portion of an available state of charge (SOC) of the energy storage asset may be used in the energy market and a second portion of the available SOC of the energy storage asset may be committed to the regulation market. The operating schedule generated for the controller may be used to provide energy-related revenue for the energy consumer based on both the energy market and the regulation market. The principles and implementations described above in connection to FIG. 1 are also applicable to a system operating according to the principles of virtual partitioning.

In another non-limiting example, the apparatus of FIG. 3 can be used for determining an operating schedule of a controller of at least one energy asset operated by an energy customer of an electricity supplier, so as to generate energy-related revenue, over a time period T, associated with operation of the at least one energy asset according to the operating schedule, wherein the energy-related revenue available to the energy customer over the time period T is based at least in part on a wholesale electricity market. The wholesale electricity market may include an energy market. The energy-related revenue may also be available from a regulation market. The apparatus includes at least one communication interface, at least one memory to store processor-executable instructions and a mathematical model for the at least one energy asset, and at least one processing unit. The mathematical model facilitates a determination of the operating schedule for the controller of the at least one energy asset based at least in part on an operation characteristic of the at least one energy asset, a forecast wholesale electricity price associated with the energy market, and a regulation price associated with the regulation market. The at least one processing unit is configured to determine the operating schedule for the controller of the at least one energy asset using the mathematical model by minimizing a net energy-related cost over the time period T. The net-energy related cost is based at least in part on the duration of energy asset participation in the regulation market, electricity generation by the at least one energy storage asset, and electricity consumption by the at least one energy asset (including the energy storage asset). The energy-related revenue available to the energy customer is based at least in part on the minimized net energy-related cost. The operating schedule specifies, during a time interval within the time period T, a first portion of an available output of the controller for use in the energy market and a second portion of the available output of the controller for use for use in the regulation market. The at least one processing unit is also configured to control the at least one communication interface to transmit to the energy customer the operating schedule for the controller of the at least one energy asset and/or controls the at least one memory so as to store the determined operating schedule for the controller.

In this example, the available output of the controller is a charge rate of the at least one energy storage asset or a discharge rate of the at least one energy storage asset. The net energy-related cost may be specified as a difference between an electricity supply cost and an economic demand response revenue over the time period T. The operation characteristic of the at least one energy storage asset is a state of charge, a charge rate, a degree of non-linearity of charge rate a discharge rate, a degree of non-linearity of discharge rate, a round trip efficiency, or a degree of life reduction.

Energy Asset Modeling

To facilitate the mathematical optimization process for generating a suggested operating schedule for one or more energy assets according to various examples of the principles herein, a mathematical model representing an energy customer's energy asset(s) is formulated and employed to simulate an "energy profile" for the asset(s).

In an example, the building asset model is a self-tuning model. Various examples and aspects of self-tuning building asset models that are applicable to any of the apparatuses, methods, and/or computer readable media are described herein. An example self-tuning model described herein considers together the building thermodynamic effects (including radiation, conduction, convection and inertia) along with the operation of building components (including the mechanical/HVAC system). The self-tuning model described herein can be applicable to all building types, including the poorly sensed buildings (that is, buildings for which there is little data on its operation characteristics).

To illustrate the general concept of an asset model, a model is first considered for one or more energy assets that not only may be turned "on" or "off," but that may be controlled at various "operating set points." For example, consider the case of a "building asset," e.g., one or more buildings including a heating, ventilation and air conditioning (HVAC) system for temperature control, for which the customer may choose different temperature set points at different times (e.g., thermostat settings); accordingly, in this example, the temperature set points constitute "operating set points" of the building asset. In this example, the magnitude of the operating set point may vary as a function of time t, in a continuous or step-wise manner (e.g., Temp(t)=72 degrees F. for 9 PM<t<9 AM; Temp(t)=68 degrees F. for 9 AM<t<9 PM). In other examples of energy assets that merely may be turned "on" or "off," the magnitude of the operating set point may be binary (i.e., on or off), but the respective on and off states may vary as a function of time t (e.g., over a given time period T).

Based on the notion of time-varying operating set points for energy assets, the term "operating schedule" as used herein refers to an operating set point of one or more energy assets as a function of time, and is denoted by the notation SP(t):

SP(t)≡operating schedule for one or more energy assets.

The amount of energy used (and/or generated) by a particular asset or group of assets in a given time period T is referred to herein as an "energy profile." In various implementations discussed herein, the energy profile of one or more assets often depends at least in part on a given operating schedule SP(t) for the asset(s) during the time period T. For a fixed-load asset, the energy profile may not depend on a given operating schedule SP(t). Accordingly, an energy asset model specifies one or more mathematical functions for calculating an energy profile (i.e., electricity use and/or electricity generation as a function of time) for the asset(s), based on a proposed operating schedule for the asset(s) applied as an input to the model. The one or more functions constituting the asset model are denoted herein generally as F (and for simplicity the term "function" when referring to F may be used in the singular), and the model may be conceptually represented using mathematical notation as:

$$F(SP(t)) = EP(t),\qquad \text{Eq. 1}$$

where the operating schedule SP(t) is an argument of the function F, and the energy profile of the modeled asset(s) as a function of time is denoted as EP(t). In a non-limiting example, EP(t) has units of MWh. FIG. 4 illustrates a simple block diagram representing the asset model given by Eq. 1.

In various examples, the function(s) F defining a particular asset model may be relatively simple or arbitrarily complex functions of the argument SP(t) (e.g., the function(s) may involve one or more constants, have multiple terms with respective coefficients, include terms of different orders, include differential equations, etc.) to reflect how the asset(s) consume or generate energy in response to the operating schedule SP(t). In general, the particular form of a given function F, and/or the coefficients for different terms, may be based at least in part on one or more physical attributes of the asset(s), and/or the environment in which the asset(s) is/are operated, which may impact the energy profile of the asset(s) pursuant to the operating schedule. More specifically, depending on the type of energy asset(s) being modeled, the mathematical model may be formulated to accept other inputs (in addition to the operating schedule SP(t)), and/or to accommodate variable parameters of a given function F (e.g., via time-dependent coefficients of different terms of the function), to facilitate calculation of the energy profile EP(t) based on a proposed operating schedule SP(t).

For example, in the case of the building asset discussed above, and/or other assets for which thermodynamic considerations are pertinent, various internal factors that may impact the asset's energy profile in general (e.g., building occupancy; a presence of equipment such as computers and other instrumentation that may affect heating or cooling in an environment; thermal inertia due to insulation, building materials, windows; etc.) may be considered in the formulation of the form of the function F itself, and/or coefficients for different terms of the function F. In some examples discussed in further detail below, such as with a real-time building asset model, the function F may be dynamically adjusted based on an observation/measurement of actual energy usage over time by the asset(s) pursuant to the updating performed during implementation of Kalman filtering. In some examples discussed in further detail below, the function F may be dynamically adjusted based on observing actual energy usage over time by the asset(s) pursuant to control via a particular operating schedule (i.e., coefficients of function terms initially may be estimated, and subsequently adjusted over time based on real-time feedback from controlled assets).

Similarly, the mathematical model for the asset(s) may be configured to consider as an input to the model actual or forecast ambient environmental conditions (e.g., temperature, humidity, ambient light/cloud cover, etc.) as a function of time, collectively denoted as "weather information" W(t), which may impact the energy profile of one or more assets. In this case, the model may be conceptually represented as:

$$F(SP(t), W(t)) = EP(t), \qquad \text{Eq. 2}$$

where both the operating schedule SP(t) and the weather information W(t) are arguments of the function F. FIG. 5 illustrates a simple block diagram representing the asset model given by Eq. 2. It should be appreciated that, while weather information W(t) is noted above as providing another possible input to the model in addition to the operating schedule SP(t), in other examples one or more other inputs to the model may be provided and considered as arguments to the function F (and accordingly taken into consideration in the function) for purposes of calculating an energy profile EP(t) for the asset(s).

In another example herein, the mathematical model for a system that includes a controllable asset, such as an energy storage asset and an associated controller, or other component with a controller (e.g., a HVAC), may be configured to consider as an input to the model the control vector for the controller as a function of time, denoted as u(t), which may impact the energy profile. In this case, the model may be conceptually represented as:

$$F(u(t)) = EP(t), \qquad \text{Eq. 3}$$

where both the control vector of the controller is an argument of the function F. FIG. 6 illustrates a simple block diagram representing the asset model given by Eq. 3. It should be appreciated that, while the control vector u(t) is noted above as providing input to the model, in other examples, one or more other inputs to the model may be provided and considered as arguments to the function F (and accordingly taken into consideration in the function) for purposes of calculating an energy profile EP(t) for the asset(s). An energy storage asset herein generally refers to an asset that can store a form of energy and release it as usable energy (or power) over time. Non-limiting examples of energy storage assets include batteries, ice units, compressed air, flywheel, heated liquids, and heated solids. Non-limiting examples of batteries include lithium ion batteries, lead-acid batteries, flow batteries, or dry cell technology batteries.

In yet another example herein, the mathematical model for a system that includes controllable energy assets, including energy consuming assets such as but not limited to a building asset including a (HVAC) system for temperature control, or an energy storage asset and an associated controller, may be configured to consider as an input to the model the control vector for the controller as a function of time, denoted as u(t), and temperature dependent operating set points for the energy consuming asset (its operating schedule). In this case, the model may be conceptually represented as:

$$F(u(t), SP(t)) = EP(t), \qquad \text{Eq. 4}$$

where both the control vector of the controller is an argument of the function F. FIG. 7 illustrates a simple block diagram representing the asset model given by Eq. 4. In an example, the control vector for a controller, $u(t) = C_t + D_t$, may be expressed as:

$$C_t = u_{1,t} * C/D_{max}$$

$$D_t = u_{2,t} * C/D_{max} \qquad \text{Eq. 5}$$

with the constraints that $u_{1,t} * u_{2,t} = 0$ and $0 \le u_{1,t}, u_{2,t} \le 1$, where represents $C/D_{max}$ the maximum charge rate or discharge rate capacity of the controller in communication with the energy storage asset.

Figure 8:
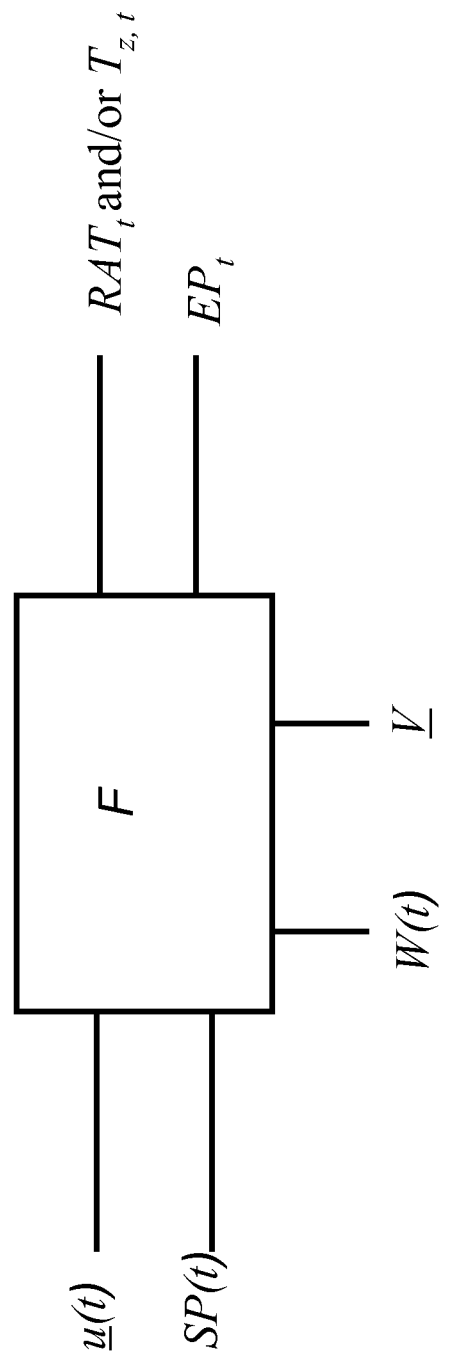
FIG. 8 illustrates an example block diagram representing another asset model according to a principle described herein.

In yet another example herein, the mathematical model for a system that includes an energy consuming asset, such as but not limited to a building asset, and a controllable asset, such as but not limited to an energy storage asset and an associated controller, or other component with a controller (e.g., a HVAC), may be configured to consider as an input to the model the control vector for the controller as a function of time, denoted as u(t), and temperature dependent operating set points for the energy consuming asset (its operating schedule). FIG. 8 illustrates a simple block diagram representing the asset model for such as system according to the principles herein. In this case, the model may have outputs of the state of charge ($SOC_t$) of the energy storage asset as a function of time t, the return-air-temperature ($RAT_t$) (including the zone temperature ($T_z$)) as a function of time t (for, e.g., a HVAC or other similar equipment), and the energy profile as a function of time ($EP_t$) of the energy consuming asset (e.g., some components of the building asset). In another example, the output is a zone temperature ($T_z$) as a function of time and the energy profile ($EP_t$). In yet another example, the output is a return-air-temperature ($RAT_t$), a zone temperature ($T_z$) and an energy profile ($EP_t$) as functions of time. In yet other examples, the output is a load as a function of time. Other inputs to the system can be weather information (W(t)) and/or feedback from other energy assets in the system (V). This model can be used, e.g., for co-optimization of an energy storage asset and an energy consuming asset for the energy market.

In an example according to a principle herein, once an appropriate asset model is established for a given energy asset or group of energy assets, different candidate operating schedules may be applied to the model to simulate how the energy profile EP(t) of the asset(s) is affected as a function of time, over a given time period T, by the different operating schedules.

An example technique for facilitating determination of optimal operating schedule for energy cost reduction and/or revenue generation from wholesale electricity markets according to various examples disclosed herein is as follows. In this example, the system includes an energy consuming asset, a controller of the energy storage asset, and a controllable energy consuming asset. A plurality of first candidate operating schedules is selected for the controller, and a plurality of second candidate operating schedules is selected for the energy consuming asset. Each second candidate operating schedule for the energy consuming asset is different from the BAU operating schedule for the energy consuming asset. The plurality of first and second candidate operating schedules are successively applied to the mathematical model to generate corresponding plurality of simulated energy profiles for the energy storage asset and the energy consuming asset. A plurality of projected net energy-related costs to the energy customer are computed, where each projected net energy-related cost is computed based at least in part on the representative CBL energy profile and the simulated energy profiles corresponding to the respective first and second candidate operating schedules and the forecast wholesale electricity price. Respective ones of the first and second candidate operating schedules corresponding to one simulated energy profile of the plurality of simulated energy profiles that results in a minimum net energy-related cost of the plurality of net energy-related costs calculated are selected as an optimal first operating schedule and an optimal second operating schedule. That is, namely, this technique can be implemented to simulate how energy assets consume/generate electricity based on different candidate operating schedules for the asset(s), and to select a particular operating schedule that facilitates a particular economic goal of the energy customer.

In another example, the operating schedules for the energy storage asset and energy consuming asset can be calculated in tandem based on minimizing the net energy-related costs (NEC), as discussed in greater detail below.

Operating Schedules and Constraints

In considering various operating schedules SP(t) that may be applied to the asset model so as to simulate a corresponding energy profile EP(t), in some instances SP(t) may not be varied freely. Such limitations on candidate operating schedules may be due at least in part to physical limitations of the asset(s) being modeled, and/or limitations on operation of the asset(s) dictated by the energy customer itself. For example, in some instances the customer may want to constrain the range in which the magnitude of SP(t) may be varied at any given time, and/or the customer may wish to designate particular periods of time (e.g., within the given time period T of interest) during which particular values of SP(t) cannot be changed (or only changed in a limited manner).

For purposes of illustration, again consider a building asset with an HVAC system. The customer may specify that, in considering candidate operating schedules SP(t) for the building asset, temperature set points (i.e., the magnitude of SP(t) in this example) must remain in a range of from between 65 to 75 degrees F. in any proposed operating schedule; furthermore, the customer may dictate that during a certain time frame, the temperature set point may not exceed 70 degrees F. In general, magnitude and/or timing limitations placed on a candidate operating schedule SP(t) for one or more modeled assets are referred to herein as "constraints" on the operating schedule.

The concept of candidate operating schedules for one or more modeled energy assets subject to one or more "constraints" is denoted herein as:

$SP(t)|_{Constraints}$=operating schedule for one or more energy assets subject to constraints The "constraints" may also be set to impose limitations on state outputs, including the resulting temperature. The "constraints" on the state outputs may impose limitations on ranges of values for the state outputs, such as but not limited to limiting the temperature of the building asset to specific ranges. For example, the constraints imposed on the control inputs may be optimized so that the state outputs (including temperature) are maintained within specified ranges.

In an example, the system includes an energy storage asset, and constraint may be placed on the allowed state of charge (SOC) of the energy storage asset. For example, the constraint may be placed that the SOC does should not be allowed to fall below a minimal SOC value (i.e., not too depleted) and/or that the SOC does should not be allowed to go above a maximal SOC (i.e., not overly-charged).

Business-as-Usual (BAU) Conditions and Customer Baseline (CBL) Energy Profiles

Once an appropriate asset model is established for a given energy asset or group of energy assets, a particular operating schedule of interest in some examples is referred to herein as a "typical" or "business-as-usual" (BAU) operating schedule (also referred to herein as "BAU conditions"), denoted as $SP(t)_{BAU}$. In particular, "BAU conditions" refer to an operating schedule that an energy customer would typically adopt for its energy asset(s), absent the incentive to reduce energy costs and/or earn energy-related revenue from wholesale electricity markets. Again turning to the example of a building asset for purposes of illustration, absent any incentive to change its behavior, during a summer season in which cooling is desired an energy customer may typically set the thermostat (i.e., temperature set points) for the building asset at 72 degrees F. from 9 PM to 9 AM, and at 68 degrees F. from 9 AM to 9 PM; this can be represented conceptually using the notation adopted herein as:

$$SP(t)_{BAU} = \begin{Bmatrix} 72, & 9PM < t < 9AM \\ 68, & 9AM < t < 9PM \end{Bmatrix}.$$

When a typical operating schedule $SP(t)_{BAU}$ is applied to the asset model, the particular energy profile generated by the model is a special case referred to herein as a simulated "customer baseline" (CBL) energy profile, denoted as CBL (t). Using the example relationship given in Eq. 2 above (which includes consideration of weather information), the special case of a CBL energy profile may be conceptually represented mathematically as:

$$F(SP(t)_{BAU}, W(t)) = CBL(t), \quad \text{Eq. 6}$$

where the typical operating schedule $SP(t)_{BAU}$ is an argument of the function F (in this example together with the weather information W(t)), and the CBL energy profile of the modeled asset(s) as a function of time is denoted as CBL(t).

Although consideration of weather information W(t) is included in the example above, it should be appreciated that the simulation of a customer baseline (CBL) energy profile in other examples may not consider weather information (as such information may not be relevant to the energy profile of the asset(s) in question). It should also be appreciated that while the simulation of a CBL energy profile may be useful for mathematical optimization techniques employed in some examples to facilitate energy cost reduction and/or revenue generation from particular wholesale electricity markets (e.g., economic demand response "energy markets"), simulation of a CBL energy profile may not be applicable or necessary in other examples to facilitate energy cost reduction and/or revenue generation from wholesale electricity markets.

Objective Cost Functions and Optimal Control

For purposes of the present disclosure, an "objective cost function" specifies all energy-related costs and energy-related revenues associated with operating one or more modeled energy assets of an energy customer so as to achieve a particular economic goal (an economic "objective"). In one aspect, an objective cost function incorporates the function(s) F representing the mathematical model for one or more energy assets, and specifies an energy customer's "net energy-related cost" (e.g., in dollars) associated with operating the modeled asset(s) over a given time period T. The energy customer's net energy-related cost as given by the objective cost function is denoted herein as NEC$:

NEC$ ≡ net energy-related cost to operate one or more energy assets.

As discussed in greater detail below, objective cost functions providing a net energy-related cost NEC$ according to different examples may have a variety of respective cost and revenue terms, based at least in part on the types of asset(s) being operated and the particular revenue-generation objective(s) (e.g., the particular wholesale electricity market(s) from which revenue is being sought).

In an example, the objective cost function, control inputs to the objective cost function, and the state outputs can be continuous functions of time, which can form a basis for the optimal control (as opposed to parametric optimization). A parametric optimization may find certain solutions for the PID that deliver an extremum solution but which is not the optimized solution.

For example, in some examples, the energy-related costs included in the objective cost function may include "actual" energy-related costs (e.g., retail electricity costs, wholesale electricity costs representing revenue earned by the energy customer, etc.). In some examples, the energy-related costs included in the objective cost function additionally or alternatively may include "indirect" energy-related costs, such as convenience/comfort costs associated with the energy customer's adoption of a suggested operating schedule different than the BAU operating schedule (the convenience/comfort cost represents an "indirect" cost associated with a change in the customer's behavior with respect to operating its asset(s), based on the incentive of possible energy-related revenue from the wholesale electricity markets). In an example, energy-related costs included in the objective cost function may include reliability costs associated with voltage/VAR control in a microgrid application. Similarly, an objective cost function may include one or more terms specifying energy-related revenues corresponding to one or more wholesale electricity markets (e.g., "energy markets," "synchronized reserve," "regulation").

To provide a preliminary illustration of concepts germane to an objective cost function specifying a net energy-related cost NEC$, an example relating to economic demand response revenue from the wholesale electricity "energy markets" is first considered. To this end, retail electricity prices (i.e., what the energy customer pays a "utility" for electricity usage) and wholesale electricity-related product prices available to the energy customer respectively are denoted as:

Retail$(t) = price of electricity from a retail electricity provider ("utility"); and Wholesale$(t) = price of electricity-related product on applicable wholesale electricity market, where the retail electricity price Retail$(t) and the wholesale electricity-related product price Wholesale$(t) may vary independently of each other as a function of time. In an example, the units of the retail electricity price Retail$(t) and the wholesale electricity-related product price Wholesale$(t) are $/MWh.

The wholesale price Wholesale$(t) can be dictated by (e.g., based at least in part on) the "locational marginal price" (LMP) as a function of time, as noted above (see Background section). However, depending on a given wholesale electricity market and/or a particular electricity-related product in question, it should be appreciated that the wholesale price Wholesale$(t) may be based on other and/or additional factors. Also, practically speaking, wholesale prices are not continuous functions of time; rather, as discussed above, wholesale prices based on the LMP may be calculated periodically at specified nodes of the grid (e.g., every 5 minutes, every half-hour, every hour) depending on the particular market in which the energy customer is participating. Accordingly, it should be appreciated that Wholesale$(t) typically is a discrete function of time, with t having some periodicity (e.g., 5 minutes, 30 minutes, 60 minutes).

Given the notation above for retail and wholesale prices, the energy customer's modeled retail electricity costs (or "supply costs"), for operating one or more modeled electricity-consuming assets pursuant to a particular operating schedule SP(t) applied to an asset model, is denoted herein as Supply$(t), given by:

$$\text{Supply\$}(t) = EP(t) * \text{Retail\$}(t), \quad \text{Eq. 7}$$

wherein EP(t) is the energy profile of the modeled asset(s) (e.g., given by any of Eqs. 1-4 above).

For the energy storage asset, the energy customer's "supply costs" for charging the asset can be denoted herein as Supply$(t)$_{ES}$, given by:

$$\text{Supply\$}(t)_{ES} = EP(t) * \text{Retail\$}(t), \quad \text{Eq. 8}$$

wherein EP(t) is the energy profile of the modeled energy storage asset(s). Since the energy profile for an energy storage asset can be represented based on a charge rate ($C_t$) for a time step (t<T) over the amount of time of charging ($\Delta t$), the supply costs can be expressed as:

$$\text{Supply\$}(t)_{ES} = C_t * \Delta t * \text{Retail\$}(t). \quad \text{Eq. 9}$$

The charge rate ($C_t$) may be the maximum charge rate of the energy storage asset, or a charge rate less than the maximum charge rate. For example, in different examples herein, the output of the controller may modify the charge rate of the energy storage asset to values that are less than the maximum charge rate.

If the system includes an energy storage asset and an energy generating asset, the total supply costs can be expressed, in a non-limiting example, as the energy storage asset (Supply\$$(t)_{ES}$) reduced by a cost amount based on the amount of energy provided by the energy generating asset ($EG_k$). In an example, the total supply costs can be expressed as:

$$\text{Supply\$}(t)_{total} = (C_k - EG_k) * \Delta t * \text{Retail\$}(t). \qquad \text{Eq. 10}$$

Supply costs may also apply to the system by virtue of an emissions cost associated with the operation of at least one of the energy assets. That is, the net-energy related cost can include a term based on the emissions costs (Emissions\$) associated with, as non-limiting examples, the electricity consumption by an energy consuming asset or an emissions cost based on operation of an energy generating asset. The emissions costs can be associated with greenhouse gas emissions during operation of the system. Non-limiting examples of such emissions are $CO_x$ emissions (e.g., carbon monoxide and carbon dioxide emissions), $NO_x$ emissions (e.g., nitrogen dioxide and related pollutant emissions), $SO_x$ emissions (e.g., sulfur dioxide and related pollutant emissions), particulates, and methane ($CH_4$) and related pollutant emissions. In an example, the contribution to the supply costs (Supply\$(t)) based on the emissions costs (Emissions\$) may be computed based on an economic benefit, such as but not limited to a prorated amount of a penalty cost leveled due to an amount of emissions, over a time period T, associated with the operation of the at least one energy asset. The penalty cost may be in staged amounts. For example, a first penalty may be imposed for an amount of emissions above a first threshold value but below a second threshold emissions value, and a second (higher) penalty may be imposed for an amount of emissions above the second threshold emissions value. Such penalties may be leveled by a government agency (in a command-and-control program, a regulation program, or a voluntary program) or may be determined based on participation in a non-governmental voluntary emissions reduction program. In another example, the contribution to the supply costs based on the emissions costs may be computed based on a trading price of an emissions credit based on an amount of emissions, such as but not limited to a trading price of a carbon credit based on $CO_x$ emission (also an economic benefit). For example, trading on financial markets may be performed under international protocol (such as but not limited to the Kyoto Protocol). As another example, trading may occur under a U.S. regional emissions reduction program, such as but not limited to the Regional Greenhouse Gas Initiative (RGGI).

The contribution to the (Supply\$(t)) based on the emissions costs (Emissions\$) may be computed based on base emissions cost for a minimal level of operation of the energy asset(s), over time period T, and a marginal emissions cost per megawatt with each increase or decrease in megawatt of operation. In an example, the marginal emissions cost can be computed based on a change in the amount of emissions generated by an energy generating asset that is in communication with the at least one energy asset, associated with the increase or decrease in megawatt of operation. As a non-limiting example, where the energy generating asset is a diesel generator, the emissions costs can include a term representing the amount of emissions by virtue of use of diesel fuel. In an example, the marginal emissions cost can be computed based on a marginal supplier emissions cost associated with a change in electricity usage by the energy customer associated with the increase or decrease in megawatt of operation. The marginal supplier emissions cost can be quantified based on an amount of emissions from an electricity generating facility of the electricity supplier per megawatt-hour of electricity supplied. The marginal supplier emissions cost can very based on the type of electricity generation facility. As an example, the emissions from a coal-based electricity generation facility can be higher than the emissions from a hydro-power electricity generation facility or a gas-powered electricity generation facility. In this example, the marginal supplier emissions cost for a coal-based electricity generation facility for each incremental increase or decrease in megawatt-hour of electricity supplied can be higher than the marginal supplier emissions cost for a hydro-power electricity generation facility or the marginal supplier emissions cost for a gas-powered electricity generation facility.

The emissions costs (Emissions\$) can be computed based on a change in the energy customer's behavior in reducing its electricity usage based on an operation of the at least one energy asset. For example, the emissions cost can be specified as a cost function based at least in part on at least one difference between the energy customer's behavior in reducing its usage of the energy asset(s) and their BAU operating schedule. In an example, the energy asset(s) can include at least one building having a variable internal temperature controlled by a HVAC system, and the emissions cost is based on a difference between a candidate temperature set point for the HVAC system as a function of time and the BAU temperature set point. The emissions cost can be computed as proportional to the magnitude of deviation of the temperature of the building from a BAU temperature set point.

Supply costs may also apply to the system by virtue of lifetime and/or replacement costs for electricity generation and/or energy storage assets, such as but not limited to due to the reduction in life of the energy storage asset. An energy storage asset may have a limited life depending on its rating of expected charge/discharge cycles. A portion of the costs associated with ultimately replacing an energy storage asset at the end of its lifetime may be included in the supply costs based on the number of charge/discharge cycles it is expected to undergo when implemented in an energy market and/or a regulation market as described herein. The lifetime reduction supply costs may also depend on the number of kWh is used in each charge or discharge cycle, and/or for what length of time the energy storage asset is used in a market (energy, regulation, etc.). For example, the contribution to the supply costs based on the replacement cost (Replacement\$) may be computed according to the expression:

$$\text{Supply\$}(t)_{LIFE} = \text{Replacement\$}/n \qquad \text{Eq. 11}$$

where n represents an effective number of charge/discharge cycles. The effective number of charge/discharge cycles can depend on the number of cycles the asset is expected to undergo when implemented in an energy market and/or a regulation market, the number of kWh is used in each charge or discharge cycle, and/or for what length of time the energy storage asset is used in a given market. This lifetime supply cost would be additive to any of the expressions for supply costs described herein for a system that includes an energy storage asset.

Non-limiting examples of other energy-related costs applicable to the systems, methods and apparatus described herein include fuel costs to run one or more electricity generation assets, operation and/or maintenance costs that may be associated with electricity generation and/or energy storage assets, tariffs that can be leveled in the industry, demand charges that can be leveled at times of peak energy usage, etc.

With respect to economic demand response revenue from the wholesale electricity energy markets, in the present example it is presumed that the energy customer is amenable to operating its energy asset(s) pursuant to a candidate operating schedule that is different than its "typical operating schedule" or BAU conditions (i.e., $SP(t)_{BAU}$), such that the energy profile EP(t) of the asset(s) will be on average lower than the customer baseline CBL(t) (see Eq. 6 and related description above). Altering the energy profile of the asset(s) with respect to the customer baseline, pursuant to a change in behavior represented by a candidate operating schedule different than BAU conditions, provides the source of opportunity for generating economic demand response revenue from the wholesale electricity energy markets. Accordingly, a wholesale electricity energy market "demand response revenue," denoted herein as $DR\$(t)_{EM}$, is given generally by:

$$DR\$(t)_{EM} = \max\{0, [(CBL(t) - EP(t))^* Wholesale\$(t)]\}. \quad \text{Eq. 12}$$

In an example, the DR$(t) represents the net difference between actual net metered load and the BAU load. The participation of any component of the energy asset in the energy market, regulation market or spinning reserve market is included in the computation of DR$(t) to the extent they affect the value of the metered load. In addition, the energy generated by any energy generating asset that is part of the energy asset may also be included in the computation of DR$(t) to the extent this behind-the-meter generated energy affects the value of the metered load.

For an energy storage asset in an energy market, a demand response revenue may be denoted herein as $DR\$(t)_{ES}$, is given generally by:

$$DR\$(t)_{ES} = (0 - (-(D_t)))^* \Delta t^* Wholesale\$(t). \quad \text{Eq. 13}$$

As described herein, a system that includes an energy storage asset can participate in both an energy market (at a price of Wholesale$(t)) and in a regulation market (at a price of regulation$(t)). In this example, the demand response revenue may be computed herein as $DR\$(t)_{ES}$, denoted by:

$$DR\$(t)_{ES} = (\epsilon D_t)^* \Delta t^* Wholesale\$(t) + (\gamma D_t)^* \Delta t^* regulation\$(t) \quad \text{Eq. 14}$$

where $D_t$ denotes the discharge rate of the energy storage asset at a time step. Where the system participates in the energy market and the regulation market at different points in time during overall time period T, both multipliers of the discharge rate, $\epsilon$ and $\gamma$, may be equal to 1. In different examples herein, the output of the controller may modify the discharge rate of the energy storage asset to values that are less than the maximum discharge rate. Using the principles of virtual partitioning described herein, by apportioning an output of the controller in communication with the energy storage asset, a portion of the discharge rate may be directed to the regulation market and another portion directed to the energy market during a given time step. As a non-limiting example, the operating schedule determined as described herein may cause the controller to discharge the energy storage asset at a discharge rate of $\epsilon D_t$ to the energy market, while concurrently respond to the regulation market at a discharge rate of $\gamma D_t$ along shorter timescales (such as but not limited to at 2-second intervals or minute-by-minute time intervals). Here, the constraint on the values may be $\epsilon + \gamma \leq 1$ if $D_t$ represents the maximum discharge rate of the energy storage asset.

In a non-limiting example, where the regulation price is not based on the discharge rate, but rather depends only on the time period of commitment of the energy storage asset to the regulation market, the demand response revenue may be computed as:

$$DR\$(t)_{ES} = (\epsilon D_t)^* \Delta t^* Wholesale\$(t) + regulation\$(t)^* \Delta t \quad \text{Eq. 15}$$

In another example, the demand response revenue for a system that includes an energy storage asset and an energy generating asset participating in an energy market may be computed as:

$$DR\$(t)_{ES+EG} = (D_t)^* \Delta t^* Wholesale\$(t) + (E_{EG})^* Wholesale\$(t) \quad \text{Eq. 16}$$

where $D_t$ denotes the discharge rate of the energy storage asset at a time step and $E_{EG}$ denotes the energy provided by the energy generating asset.

According to the principles described herein, a demand response revenue may also be generated for a system that includes an energy storage asset and an energy generating asset participating in both an energy market and a regulation market.

Based on the equations for supply costs and demand response above, an example of an objective cost function to provide a net energy-related cost NEC$ over a given time period T for operating the modeled asset(s), considering both retail electricity supply costs and demand response revenue can be computed based on the expression:

$$NEC\$ = \sum_{t}^{T} (Supply\$(t) - DR\$(t)). \quad \text{Eq. 17}$$

In one example, an objective cost function as exemplified by Eq. 17 may be provided to an optimizer (a particularly-programmed processor, also referred to as a "solver"; such as processor unit 13 of FIG. 2) that implements a mathematical optimization process to determine a suggested operating schedule for the energy asset(s) over the time period T that minimizes the net energy-related cost NEC$. Accordingly, the optimizer solves for:

$$\text{Min}\left[\sum_{t}^{T}(Supply\$(t) - DR\$(t))\right] \quad \text{Eq. 18}$$

By substituting the pertinent equations for supply costs and demand response (which depends on the modeling of the energy assets in a given system) back into Eq. 18, the various informational inputs provided to the optimizer may be readily ascertained. Various examples and aspects of self-tuning building asset models are described herein that are applicable to any of the apparatuses, methods, and/or computer readable media described herein for solving an objective cost function using the optimizer.

As a non-limiting example, for a system that is participating in the energy market, the various informational inputs provided to the optimizer may be readily ascertained as follows:

$$\text{Min}\left[\sum_{t}^{T}\{(EP(t)*Retail\$(t)) - \right. \quad \text{Eq. 19}$$

$$\left.(\max\{0, [(CBL(t) - EP(t))*Wholesale\$(t)]\})\}\right],$$

where from Eq. 2

$$EP(t)=F(SP(t)|_{Constraints}, W(t)),$$

and from Eq. 6

$$CBL(t)=F(SP(t)_{BAU}, W(t)),$$

where again it is presumed for purposes of illustration that weather information W(t) is relevant in the present example. From the foregoing, it may be seen that one or more of the following inputs may be provided to the optimizer in various examples:

F—one or more functions defining the mathematical model for the energy asset(s);

$SP(t)_{BAU}$—BAU or "typical" operating schedule for the energy asset(s);

Constraints—any timing and/or magnitude constraints placed on candidate operating schedules for the energy asset(s);

W(t)—weather information as a function of time (if appropriate given the type of energy asset(s) being operated);

u(t)—control vector for the controller in communication with the energy storage asset;

Retail$(t)—retail price of electricity as a function of time;

Wholesale$(t)—wholesale price of electricity-related product as a function of time;

Regulation$(t)—regulation price in regulation market as a function of time; and

NEC$—the objective cost function describing the energy customer's net energy-related cost associated with operating the modeled energy asset(s).

Based on the foregoing inputs, the optimizer solves Eq. 19 by finding an "optimal" operating schedule for the energy asset(s), denoted herein as $SP(t)_{opt}$, that minimizes the net energy-related cost NEC$ to the energy customer:

$SP(t)_{opt}$="optimal" or suggested operating schedule for one or more energy assets In various implementations described herein, the optimizer may receive one or more inputs, including but not limited to, the weather information W(t), the retail electricity price Retail$(t), and the wholesale price of the electricity-related product Wholesale$(t) (and the regulation price (regulation$(t))) as forecasted values provided from a third-party source, for the time period T over which the optimization is being performed.

While a given optimizer in a particular implementation may employ various proprietary techniques to solve for the minimization of an objective cost function according to various examples of the principles herein, conceptually the optimization process may be generally understood as follows. In various implementations discussed herein, the optimizer generates the operating schedule using the model of the system through an optimal control procedure. In the various example implementations, the optimizer determines an optimal operating schedule over the defined time period (T) by optimizing an objective cost function. For example, the optimizer can be implemented to determine the operating schedule that generates the energy-related revenue by minimizing a function representing the net energy-related costs of the system over the time period (T). The net energy-related costs can be computed based on the supply costs and the demand response revenue as described herein, including in Eqts. 1-19 above. The optimizer optimizes the objective cost function over the entire defined time period (T) to generate the operating schedule. The generated operating schedule can include suggestions, for different specific time intervals within the overall time period T, for when the controller can be used to implement the energy storage asset in the energy market, in the regulation market, or in both the energy market and regulation market (through dynamic partitioning).

In a non-limiting example of an implementation of the optimizer, some number N of candidate operating schedules $SP(t)|_{Constraints}$ for the modeled asset(s) (together with weather information W(t), if appropriate based on a given objective function) can be successively applied to the asset model given by the function(s) F to generate simulated energy profiles EP(t) corresponding to the candidate operating schedules (see Eqs. 1-4). A net energy-related cost NEC$ given by the objective cost function is calculated for each such simulated energy profile EP(t) (see Eq. 17), and the candidate operating schedule that minimizes the objective cost function (i.e., the "optimal" operating schedule $SP(t)_{opt}$ that minimizes the net energy-related cost NEC$) is selected as the suggested operating schedule to be provided to the energy customer.

As noted earlier, the example above in connection with the objective cost function of Eq. 17 is based on actual energy-related costs (e.g., retail electricity cost) Supply$(t). In other examples, the energy-related costs included in a given objective cost function additionally or alternatively may include "indirect" energy-related costs, such as "convenience/comfort" costs associated with the energy customer's adoption of a suggested operating schedule $SP(t)_{opt}$ different than its typical operating schedule $SP(t)_{BAU}$. In one aspect of such examples, a convenience/comfort cost represents an "indirect" cost in that it does not necessarily relate to actual energy-related expenditures, but rather attributes some cost (e.g., in dollars) relating to a change in the customer's behavior with respect to operating its asset(s), based on the incentive of possible energy-related revenue from the wholesale electricity markets.

Accordingly, in some examples, an alternative objective cost function similar to that shown in Eq. 17 may be given as:

$$NEC\$ = \sum_{t}^{T}(Comfort\$(t) + Supply\$(t) - DR\$(t)), \quad \text{Eq. 20}$$

where Comfort$(t) represents a convenience/comfort cost associated with a change in the energy customer's behavior with respect to operating its asset(s). In an example where the energy-related costs included in the objective cost function include reliability costs, they would be included in the computation (such as in Eq. 12) similarly to the Comfort$(t).

A convenience/comfort cost Comfort$(t) may be defined in any of a variety of manners according to different examples. For example, in one implementation, a convenience/comfort cost may be based at least in part on a difference (e.g., a "mathematical distance") between a given candidate operating schedule and the typical operating schedule (BAU conditions) for the modeled asset(s)—e.g., the greater the difference between the candidate operating schedule and the typical operating schedule, the higher the convenience/comfort cost (there may be more inconvenience/discomfort attributed to adopting a "larger" change in behavior). This may be conceptually represented by:

$$\text{Comfort\$}(t) = G[|SP(t)|_{Constraints} - SP(t)_{BAU}|], \quad \text{Eq. 21}$$

where G specifies some function of the absolute value of the "difference" between a candidate operating schedule (e.g., in a given iteration of the optimization implemented by the optimizer) and the typical operating schedule.

To provide an example of how Eqs. 20 and 21 may be employed in an optimization process to determine a suggested operating schedule $SP(t)_{opt}$ for an energy customer according to one example, again consider a building asset operated by the energy customer, for which a given operating schedule SP(t) is constituted by a temperature set point as a function of time. If $T(t)_{BAU}$ represents the temperature set points constituting a typical operating schedule, and $T(t)|_{Constraints}$ represents different temperature set points constituting a candidate operating schedule that may be adopted to facilitate energy-cost reduction and/or revenue generation, the convenience/comfort cost Comfort$(t) in this example may be defined as a "temperature set point deviation" $T_{dev}(t)$, according to:

$$\text{Comfort \$}(t) \equiv T_{dev}(t) = A(|T(t)|_{Constraints} - T(t)_{BAU}|), \quad \text{Eq. 22}$$

where A is a constant that converts temperature units to cost units (e.g., degrees F. to dollars). In an example, A may be adjustable for each individual time step, so A may be represented as a vector. Eq. 22 specifies that there is a greater "indirect" cost associated with candidate operating schedules having temperature set points that deviate more significantly from the typical temperature set points (albeit within the constraints provided by the energy customer). In this manner, as part of the optimization process, potential revenue from the wholesale electricity markets may be "tempered" to some extent by a perceived cost, included in the objective cost function (see Eq. 20), that is associated with the inconvenience/discomfort of deviating significantly from the typical operating schedule.

In the example above, although the multiplier A in Eq. 22 is discussed as a conversion constant, it should be appreciated that in other examples A may be an arbitrary function having as an argument the absolute value of the difference between a candidate operating schedule and the typical operating schedule as a function of time. More generally, it should be appreciated that a convenience/comfort cost Comfort$(t) is not limited to the "temperature-related" example provided above in connection with a building asset, and that other formulations of a convenience/comfort cost as part of an objective function are possible according to various examples of the principles herein.

In yet other examples of objective cost functions, different cost and revenue terms of a given objective cost function may include corresponding "weighting factors" (e.g., specified by the energy customer), so as to ascribe a relative importance to the energy customer of the respective terms of the objective cost function in arriving at a suggested operating schedule $SP(t)_{opt}$. For example, in some instances, an energy customer may want to emphasize the importance of increasing prospective demand response revenue DR$(t) vis a vis decreasing supply costs Supply$(t) in solving the optimization problem to arrive at a suggested operating schedule; similarly, in other instances, an energy customer may want to emphasize convenience/comfort costs Comfort$(t) vis a vis increasing prospective demand response revenue DR$(t) in solving the optimization problem to arrive at a suggested operating schedule. The ability of an energy customer to tailor a given objective cost function according to weighting factors for respective terms of the objective cost function provides an "elasticity" to the optimization process. Using the objective cost function given in Eq. 20 above as an example, in one example such weighting factors may be included in the specification of an objective cost function as respective term multipliers:

$$NEC\$ = \sum_{t}^{T} [(\alpha * Comfort\$(t)) + (\beta * Supply\$(t)) - (\gamma * DR\$(t))], \quad \text{Eq. 23}$$

where $\alpha$, $\beta$, and $\gamma$ constitute the weighting factors. In an example, $\alpha+\beta+\gamma=1$. In another example, $\alpha+\beta+\gamma\neq1$.

In another example, the value of a weighting factor may differ at various points during the day. For example, if it is preferred that the Comfort$(t) takes a bigger part in the objective cost function computation at certain points during the day, the factor $\alpha$ may be increased relative to the other weighting factors.

In an example, the comfort cost is attributed to a change in the energy customer's behavior in adopting the operating schedule, over the time period T, for the at least one energy asset in lieu of the BAU operating schedule. The comfort cost can be specified as a cost function based at least in part on at least one difference between the operating schedule and the BAU operating schedule. For example, the comfort cost can be based at least in part on a difference between the candidate temperature set point and the BAU temperature set point. In an example where the energy asset is a building, the change in the energy customer's behavior can be monitored based on a difference in a return-air-temperature of a section of the building as compared to a return-air-temperature with the BAU operating schedule. In an example, the comfort cost can be computed as proportional to a magnitude of deviation a temperature of the building from a BAU temperature set point. In another example, the comfort cost can be computed as proportional to a magnitude of deviation a humidity of the building from a BAU humidity set point.

In an example implementation, the operating schedule can be generated through applying an optimization using a net-energy related cost function based only on the energy market. The result of the optimization can be used to provide recommendation for time intervals for the energy customer to participate in the energy market, regulation market, or both the energy market and the regulation market. For example, based on the results of the optimization, the operating schedule may determine that any excess charge/discharge capacity of the controller of the energy storage system may be committed to the regulation market on an hour-by-hour basis. For example, it can be determined that the any excess charge/discharge capacity of the controller may be committed to the regulation market during the first 15 time intervals. The optimization may make such a determination depending on whether the forecast regulation price in the regulation market in this time interval offers opportunity for energy-related revenue during this time interval or if considered in the context of the global optimization over time period T. In an example, such a determination may be made depending on whether the SOC of the energy storage asset is feasible for its use in the regulation market. For example, it may be preferable for the energy storage asset to be near around a 50% SOC for it to be applicable to the regulation market. In addition, if it is decided to commit the energy storage asset to the regulation market for a time interval, e.g., for one or more 1-hour time intervals, the optimization described herein may be re-performed based on the new input state of the system. Such new inputs can include the state of charge of the energy storage asset after its commitment to the regulation market ends. In another non-limiting example, the optimization may evaluate different SOC initial inputs to assess whether "recovery" from the regulation market is feasible for later participation in the energy market.

In an example, a predetermined threshold value of wholesale electricity price can be set at which it is decided that the excess charge/discharge capacity of the controller will be committed to the regulation market. Based on the results of the optimization, a predetermined threshold value of the LMP price, indicated by the dashed horizontal line, may be set. In addition, it may be determined that the first time interval of charging the energy storage asset occurs during the time period that T coincides with the time interval during which the forecast wholesale electricity price falls below the predetermined threshold value. It may also be determined in the operating schedule that a second time interval of discharging the energy storage asset occurs coincides with a time interval during which the forecast wholesale electricity price exceed the predetermined threshold value.

While the discussion above of example objective cost functions and optimization of same to generate suggested operating schedules for energy assets has been based at least in part on economic demand response revenue from wholesale electricity energy markets (and in some particular examples involving building assets), it should be appreciated that the disclosure is not limited in this respect; namely, according to other examples, objective cost functions may be formulated and optimized to achieve a wide variety of energy-related objectives associated with different types of energy assets and revenue generation opportunities from wholesale electricity markets. For example, computation based on revenue from the regulation market has also been described herein above, and optimization based on the wholesale price and the regulation price are described herein below. In other examples, the principles herein can be applied to other markets, such as the spinning reserve market.

Generating an Operating Schedule for Deriving Energy-Related Revenue

As discussed above, the output of an optimization process to minimize an energy customer's net energy-related cost NEC$ (e.g., as specified by an objective cost function) is typically provided as a suggested operating schedule $SP(t)_{opt}$ for one or more energy assets. Generally speaking, the suggested operating schedule $SP(t)_{opt}$ may comprise one or more set point values as a function of time that take into consideration all of the energy customer's modeled and controllable energy assets.

For example, in some instances involving multiple individually modeled and controllable energy assets, the suggested operating schedule $SP(t)_{opt}$ may comprise multiple time-varying control signals respectively provided to corresponding controllers for the different energy assets. In other cases, the energy customer may have an energy management system (EMS) (or where applicable, building management system (BMS), or a building automation system (BAS)) that oversees control of multiple energy assets, and the suggested operating schedule $SP(t)_{opt}$ may comprise a single control signal provided to the energy customer's EMS, which EMS in turn processes/interprets the single control signal representing the suggested operating schedule $SP(t)_{opt}$ to control respective energy assets. In an example, the EMS has predefined "demand levels" that control the power consumption of various assets, including modifying the setpoint for the building zone air temperature, modifying lighting levels, and modifying variable frequency and/or variable speed of components (such as but not limited to modifying the frequency and/or speed of a motor, a fan, any other ventilation equipment, and/or a pump). In an example, modifying the setpoint for the building zone air temperature results in relaxing zone temperature setpoint. In an example, modifying lighting levels limits lighting levels to certain predesignated settings. In an example, modifying variable frequency and/or variable speed limits the variable frequency and/or variable speed to certain predesignated settings.

In examples in which the energy customer normally operates its energy asset(s) according to a typical operating schedule $SP(t)_{BAU}$ (absent any economic incentive to change its energy-related behavior), the suggested operating schedule $SP(t)_{opt}$ may be conveyed to the energy customer in the form of one or more "bias signals," denoted herein by Bias(t). In particular, one or more bias signals Bias(t) may represent a difference between the suggested operating schedule and the typical operating schedule as a function of time, according to:

$$\text{Bias}(t)=SP(t)_{opt}-SP(t)_{BAU}. \quad \text{Eq. 24}$$

Eq. 24 applies in certain cases. In a more general case, the Bias offsets the "demand level" over components of the energy asset. The bias signal (sent to a EMS) may cause controllers not only to act on individual zone setpoints, but also may take other actions such as but not limited to load sheddings (including shutting off non-essential loads) changing lighting levels (including dimming lights), and modifying the variable frequency and/or variable speed of certain components (including motors, fans or other types of ventilation equipment, and pumps). Reducing the variable frequency and/or variable speed of certain components may be implemented to reduce load.

In an example, in response to the signal sent to the EMS, the EMS may make changes to operation settings of components of the energy asset (i.e., modulate the operation parameters of components). Non-limiting examples include adjusting zone setpoints, dimming lights, shedding non essential loads, reducing frequency and/or speed of variable components (including any motors, any fans, any other ventilation equipment, or any pumps).

Self-Tuning Models for Modeling Energy Assets

According to the principles herein, the self-tuning modeling approach can be used to facilitate modeling of energy assets. In an example, one or more buildings can be modeled as energy asset.

Self-tuning models are described that can be implemented to provide a dynamic simulation model of an energy asset that can be adaptive to physical changes in the energy asset.

For example, a self-tuning model according to the principles described herein can be developed as a physical building model with various numbers of input model parameters. A physical building model can be implemented to output at least one of a BAU customer load profile and a temperature profile. The results of the dynamic simulation based on the self-tuning model can be introduced to an optimization that is run to determine an optimal suggested operating schedule for the energy assets being modeled, including the and controllable energy asset resources of the system.

Non-limiting example attributes of a self-tuning model according to the principles described herein are as follows.

In an example, a physical building model can be computationally intensive, and can be time-consuming as a result: Input to the physical building model may require review of mechanical and architectural drawings of the building, including as-built construction drawings and detailed site surveys to calculate parameters such as area and mass. A physical model may require manual tuning of area and mass when parameters in the estimation. Parameters such as the number of people (building occupancy) and equipment also may require manual tuning. A fixed load approximation may be required. The model may require model validation for curve fitting to actual metered load. Some physical models also may require multiple input data monitoring.

Figure 9:
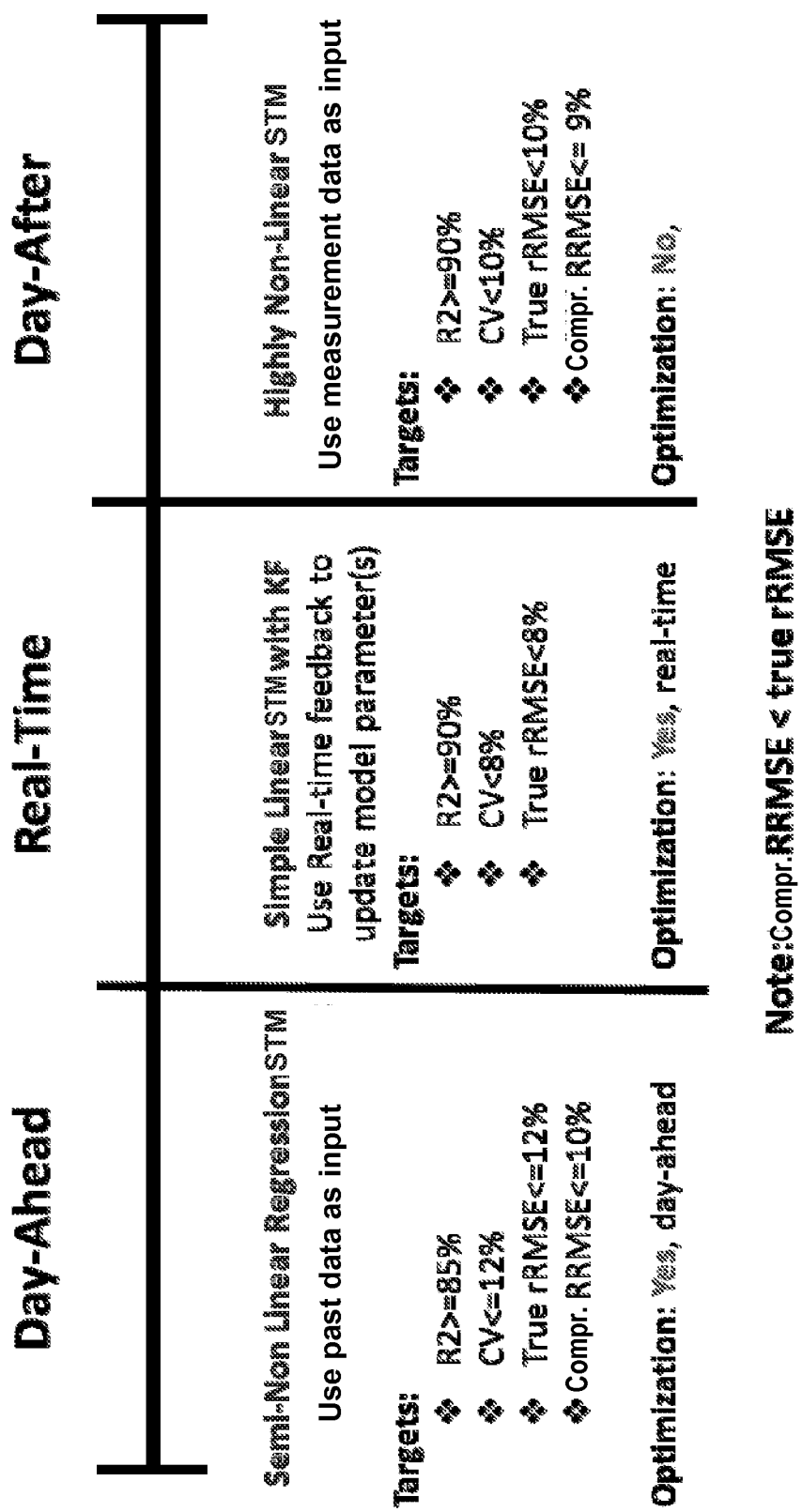
FIG. 9 shows the results of a non-limiting example implementation of a day-ahead self-tuning model, a real-time self-tuning model, and a day-after self-tuning model, according to a principle described herein.

In an example, the robustness of the physical building model may affect accuracy: The inertia of the thermodynamics (a time lag in response) should be unaccounted for. The physical model may be a single node model. The physical model is configured such that the zone temperature ($T_z$) setpoint is achieved and maintained. The model also may be tuned so that the true rRMSE of the output of the model is over 10% for prediction (day-ahead model) and validation (day-after model). FIG. 9 shows the results of a non-limiting example implementation of a day-ahead self-tuning model, a real-time self-tuning model, and a day-after self-tuning model. For comparison, results from an industry-existing model is shown (labeled "Compr. RRMSE"). In the comparison, the RRMSE of an output of a model according to the principles described herein is observed to be better than the RRMSE of an existing industry model. As shown in FIG. 9, an accuracy of greater than about ten percent error or more in load prediction can be achieved using a model according to the principles described herein.

In an example, the physical building model according to the principles described herein may be applicable to a building portfolio that includes poorly sensed buildings. According to the principles herein, the poorly sensed buildings are buildings with minimum or insufficient data from a monitoring of building performance during operation.

An example self-tuning model (STM) can be used to increase the speed of implementation with accuracy within or better than industry standards. In an example, the STM models may bring together the effects of thermodynamic properties of the building energy assets (including radiation, conduction, convection and inertia) with the operation characteristics of controllable energy assets, such as but not limited to the mechanical or HVAC systems. The STM can be used for all building types, including poorly-sensed buildings.

The STM model according to the principles herein can be a data-driven representation of the dynamics and operation of a building asset.

The non-limiting examples of STM models and implementation are in FIG. 9. The RRMSE (root-mean-square error) using guidelines set by industry-existing models are compared to the value of true rRMSE), which is root-mean-square error computed based on the systems, apparatus and methods described herein. In the examples, the R2 (meaning $R^2$) provides a measure of the fit. The term CV can be computed as a standard deviation divided by the mean.

Self-tuning models are described herein that can be implemented to provide day-ahead energy asset models, the real-time energy asset models, or day-after energy asset models. The day-ahead energy asset models can be used to generate a suggested operating schedule, prior to a time period T, that can be used to operate the at least one energy asset to facilitate generation of the energy-related revenue. The real-time energy asset models can be used to generate updated operating schedules during operation of the energy asset according to the suggested operating schedule during time period T. The day-after model can be used to model the operation characteristics of the energy asset after time period T.

Day-Ahead Self-Tuning Models

In a non-limiting example, a day-ahead self-tuning model can be generated using a system, method or apparatus described herein. An example objective function can be generated to facilitate a determination of the suggested operating schedule for at least one energy asset that includes a controllable energy asset, based at least in part on data representative of model parameters. The model parameters can be one or more of an operation characteristic of the at least one controllable energy asset, a thermodynamic property of the at least one energy asset, and a projected environmental condition during time period T.

An example suggested operating schedule can be generated based on an optimization of the objective function over time period T. The objective function can determined based on a dynamic simulation model of the energy profile of the at least one energy asset, a customer baseline (CBL) energy profile for the at least one energy asset, and a forecast market price, over time period T, associated with participation of the at least one energy asset in a market. As non-limiting examples, the market can be a wholesale electricity market and/or a regulation market. For example, the forecast market price can be a forecast wholesale electricity price associated with participation of the at least one energy asset in a wholesale electricity market. As another example, the forecast market price can be a forecast regulation price associated with participation of the at least one energy asset in a regulation market. The dynamic simulation model of the day-ahead STM can be made adaptive to physical changes in the at least one energy asset based on a parametric estimation using at least one of the model parameters. The dynamic simulation model can be trained using the data representative of the model parameters prior to time period T. The operation of the at least one energy asset according to the suggested operating schedule, over a time period T, facilitates generation of energy-related revenue based at least in part on the market, such as but not limited to the wholesale electricity market and/or the regulation market.

The day-ahead self-tuning model can be configured as a day-ahead predictive self-tuning building model ($OD^{t-1}$) model. The $OD^{t-1}$ model is a representation of the building and systems to be utilized for the day-ahead forecasting and optimization, and can be made adaptive to any changes in the building asset. The $OD^{t-1}$ model can be based on a semi-non-linear regression. The $OD^{t-1}$ model can be used to generate operating schedules in advance of a time period over which the energy asset is operated. As a non-limiting example, the $OD^{t-1}$ model can be used to generate an operating schedule a day in advance (e.g., over 48 time steps in 24 hour time period). For example, the $OD^{t-1}$ model can be used to generate models for projected/expected load, zone temperature and/or return air pressure for the energy assets. The projected/expected load, zone temperature and/or return air pressure are introduced into an objective cost function. An optimization tool of the system can be used to generate a suggested operating schedule for the energy asset based on an optimization, over time period T, of the objective cost function. The suggested operating schedule can be implemented for operation of the building asset during time period T. An example of an $OD^{t-1}$ model can be expressed as shown in Eqs. 25 and 26:

$$\ln(\text{Load}(t)) = A_i \times \text{WeatherInput}_i(t-j) + B_i \times \text{ZoneTemperature}_i(t-j) + C_i \times \ln(\text{PriorLoad}_i(t-j)) + D_i \times \text{HVACSchedule}(t-j) + F_i \times \text{ControlSetpoint}(t-j) + G_i \times \text{HVACTemperature}_i(t-j) \quad \text{Eq. 25}$$

$$\text{ZoneTemperature}(t) = A'_i \times \text{WeatherInput}_i(t-j) + B'_i \times \text{PriorZoneTemperature}(t-j)) + C'_i \times \text{HVACSchedule}(t-j) + D'_i \times \text{ControlSetpoint}(t-j) + E'_i \times \text{HVACTemperature}_i(t-j) \quad \text{Eq. 26}$$

The index "i" indicates an input type and "j" is an indicator of time-step (j=0, 1, 2, . . . ) starting at zero for current value to as far back as needed as determined by constraints on the computation of the method. HVACSchedule may represent fan status, chiller status, ice storage status, etc, and can take values of "0" (OFF) or "1" (ON). HVACTemperature may include chilled water temperatures, air temperatures, ice loop temperatures, etc. In some non-limiting examples, day type and temperature can be included in bins in the load equation to improve accuracy of its day-ahead and real-time predictive models.

Example Eqs. 25 and 26 provide a parametric estimation for the dynamic simulation model that is adaptive to physical changes in the at least one energy asset. A customer baseline model (CBL) may be utilized for day-ahead and real-time prediction and optimization. The CBL can be generated based on the data representative of model parameters of the energy asset prior to time period T. For example, the model can be trained using an amount of past data of the energy assets during operation, such as but not limited to at least about 15 days, about 30 days, about 45 days, or more, of past data. The training data allows for the determination of the coefficients ($A_i$, $B_i$, $C_i$, $D_i$, $F_i$, $G_i$, $A_i'$, $B_i'$, $C_i'$, $D_i'$, $E_i'$) of the model parameters in FIGS. 26 and 26 for a given system including the at least one energy asset (including a building asset).

The past data can be data representative of operation characteristic of the at least one controllable energy asset. For example, the operation characteristics can be a load use schedule, or a setpoint. As non-limiting examples, the data representative of thermodynamic property of the at least one energy asset can be past data, such as but not limited to at least about 15 days, about 30 days, about 45 days, or more, of past data, about thermodynamic measures.

Non-limiting examples of data representative of thermodynamic properties include of at least one of an occupancy schedule of the building asset, a relative humidity of the building asset, a temperature of the building asset, a lighting level of the building asset, a chilled water temperature, an air temperatures, and an ice loop temperature.

Non-limiting examples of the data representative of the projected environmental condition during time period T include at least one of an ambient temperature of the environment in which the building asset is located; a humidity of the environment in which the building asset is located; an amount of solar irradiance of the environment in which the building asset is located, an amount of cloud cover of the environment in which the building asset is located, an outside air temperature, an outside air humidity, an outside air enthalpy, an outside air wet bulb temperature, a dewpoint temperature, and a heat index.

In a non-limiting example, the dynamic simulation model can be trained using the data representative of the operation characteristic of the at least one controllable energy asset and the thermodynamic property of the at least one energy asset, during operation of the at least one energy asset under similar environmental conditions to the projected environmental condition during time period T.

In an example, a suggested operating schedule may be provided as a number of bias signals that are stored to a memory and/or transmitted to the EMS of an energy customer. The bias signals can be implemented according to the suggested operating schedule to control the operation of the energy assets to facilitate the generation of the energy-related revenue, as described hereinabove.

In another example implementation, managing various energy assets may be implemented according to the suggested operating schedule in a phased manner to facilitate revenue generation from wholesale electricity markets, regulation markets, or other ancillary markets. Such a suggested operating schedule may be provided as an interruptible load function, or as a modulation signal. For an interruptible load function, the instructions would specify the types of components, equipment, and/or computing resources to power off or power on during various time intervals of time period T, and in what combinations according to the suggested operating schedule. For a modulation signal, the instructions would specify the types of components, equipment, and/or computing resources to whose operation parameters can be increased or decreased, in order to increase or decrease its load during various time intervals of time period T, and in what combinations according to the suggested operating schedule. Each phase of the suggested operating schedule may target a specific energy asset resource, and phases may be implemented sequentially over time for a given set of energy assets, or in any combination concurrently for a given set of energy assets. For example, a first phase may target the HVAC system of a building; a second phase may target backup generators, other distributed energy generation resources (e.g., renewables), and energy storage resources (e.g., batteries) (collectively "power resources"); and a third phase may target other specific resources of a site, such as but not limited to the different type of equipment in a building complex of manufacturing site, or the server computing load of the multiple servers at a building that houses a data center.

Real-Time Self-Tuning Models

In a non-limiting example, a real-time self-tuning model can be generated using a system, method or apparatus described herein. The $OD^t$ model can be based on a linear representation of the building and systems to be used in live operation for adaptive optimization and short-term forecasting. In an example, the $OD^t$ model can be used to generate models for projected/expected load, zone temperature and/or return air pressure that can be updated using a feedback mechanism, such as but not limited to Kalman filtering, based on measurements during operation of systems of the energy assets, such as the building asset. An example of an $OD^t$ model can be expressed as shown in Eqs. 27 and 28:

$$\text{Load}(t) = A_i \times \text{WeatherInput}_i(t-j) + B_i \times \text{ZoneTemperature}(t-j) + C_i \times \text{PriorLoad}(t-j) + D_i \times \text{HVACSchedule}(t-j) + F_i \times \text{ControlSetpoint}(t-j) + G_i \times \text{HVACTemperature}_i(t-j) \quad \text{Eq. 27}$$

$$\text{ZoneTemperature}(t) = A'_i \times \text{WeatherInput}_i(t-j) + B'_i \times \text{PriorZoneTemperature}(t-j) + C'_i \times \text{HVACSchedule}(t-j) + D'_i \times \text{ControlSetpoint}(t-j) + E'_i \times \text{HVACTemperature}_i(t-j) \quad \text{Eq. 28}$$

Figure 10:
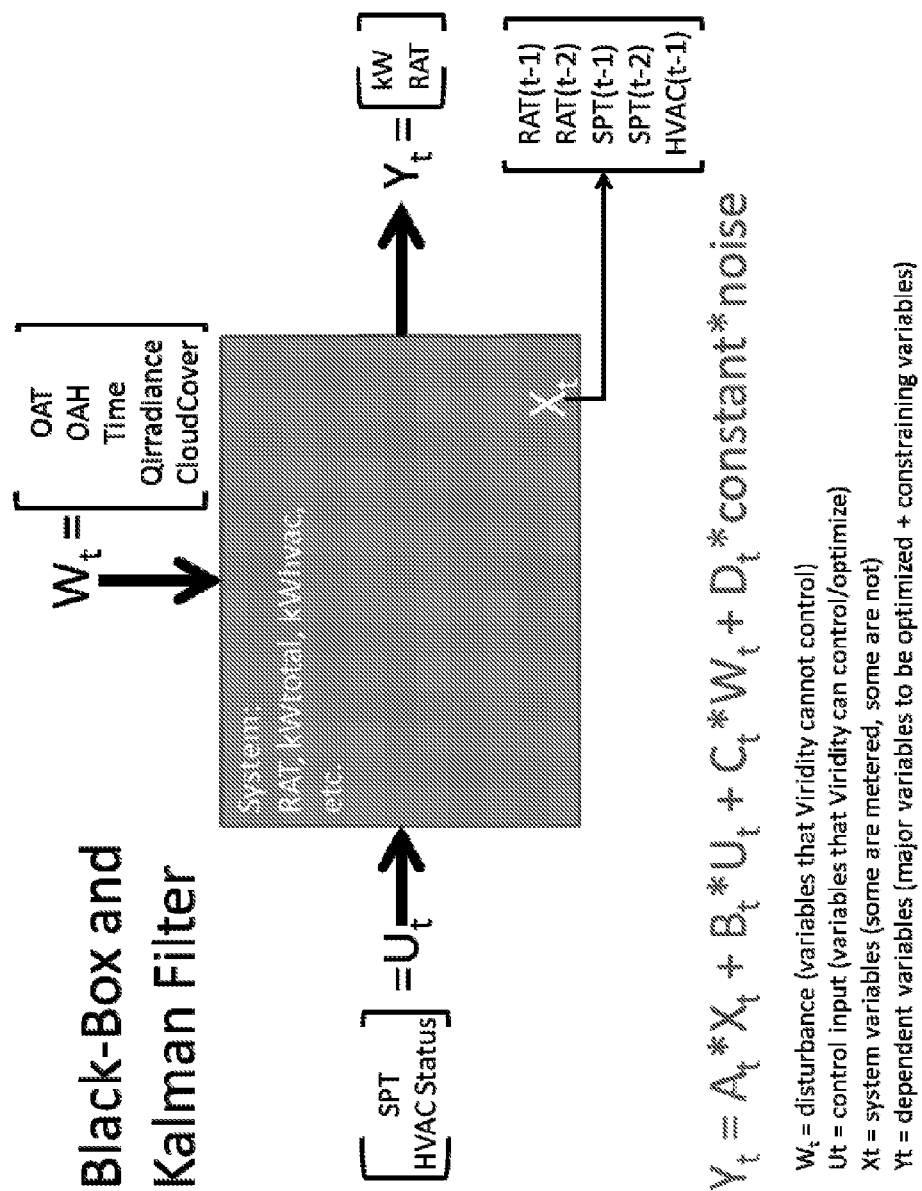
FIG. 10 shows an example of state space representation for a real-time self tuning model according to a principle described herein.

The $OD^t$ model can be updated in realtime (adjustable) using a Kalman Filter (KF) algorithm. For example, the $OD^t$ model can be updated using a KF algorithm at regular intervals (such as but not limited to about every minute, or about every few minutes, or about every half hour). The KF is a recursive tool that obtains optimal estimations of the system state as well as the online identification of parameters of the system state-space equation. The KF can be determined when the model is run for state estimation, and/or for online parameter identification based on targeted model accuracy. The $OD^t$ model can be run and updated using KF as many times as required to reach a solution. The $OD^t$ model can be described as a linear state-space system. An example is represented in FIG. 10, where the control setpoint is the zone temperature setpoint (SPT), HVAC-Schedule is replaced by HVAC Status, and load is kW. Zone temperatures are RAT(t), RAT(t−1) and RAT(t−2) (where RAT is return air temperature). Environmental condition indicators can be weather inputs such as but not limited to outdoor air temperature, solar irradiance, outdoor humidity and cloud cover. The $OD^t$ model is described as a linear state-space system in the example of FIG. 10.

Figure 11:
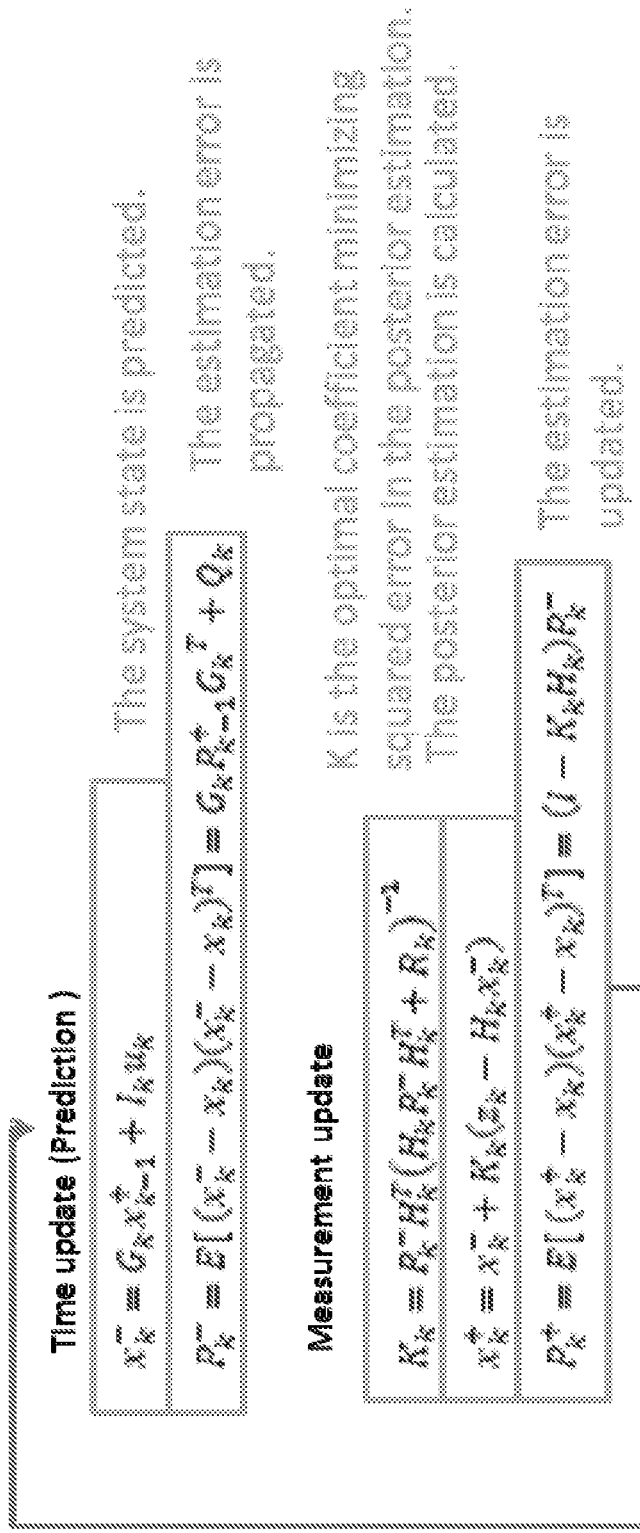
FIG. 11 shows an example Kalman Filter process according to a principle described herein.

In a non-limiting example, the KF can be implemented as described in FIG. 11. The state estimate and/or the model parameters can be updated in real-time, such as but not limited to about each minute, or every few minutes. Nomenclature of abbreviations in FIG. 11 is as follows:
$x_k$ is the state vector at time step k
$G_k$ is the state transition matrix at time step k
$u_k$ is the input at time step k
$I_k$ is the input matrix at time step k
$e_k$ is the process noise, following normal distribution i.i.d $N(0,Q_k)$
$z_k$ is the observation vector at time step k
$H_k$ is the observation matrix at time step k
$\eta_k$ is the observation noise, following normal distribution i.i.d $N(0,R_k)$ As shown in FIG. 11, the KF can be implemented, during time period T of operation of the energy asset(s) according to the suggested operating schedule, as a time update in a first stage and as a measurement update in a second stage. In the first stage, as described in FIG. 11, the system state is predicted at a time t during time period T based on the suggested operating schedule. The estimation error is propagated to provide the time update. In the second stage, a measurement update is performed. The predicted state is compared to the measured state. As a non-limiting example, a measurement is made of at least one of (i) an operation characteristic of a controllable energy asset, (ii) a thermodynamic property of the energy asset, (iii) an actual environmental condition. Based on the comparison of the predicted state and the measured state, the estimation error is updated. The parameters of the suggested operating schedule are updated based on the results of the KF process to provide an updated operating schedule. Using the KF, the state estimate and/or the model parameters can be updated in real-time, such as but not limited to about each minute, or every few minutes during time period T.

Day-After Self-Tuning Models

In a non-limiting example, a day-after self-tuning model can be generated using a system, method or apparatus described herein. In a non-limiting example, the configuration of the day-after self-tuning model can be used to generate the CBL for the system.

The $OD^{t+1}$ model can be based on a highly non-linear representation of the building and systems. Three $OD^{t+1}$ models can be developed to closely match the customer load under business-as-usual operations as well as under the control of the operating schedule of the real-time $OD^t$ model. All of the CBL models can be run and the model with the best accuracy can be selected for settlement purposes with an industry participant in a market and/or other RTOs/ISOs. The $OD^{t+1}$ models can be expressed as:

Non-Linear Kernel CBL Model

The non-linear kernel can be used to generate a non-linear representation of a system that includes the at least one energy asset. For example, for an energy asset that is a building asset, the kernel CBL model may take the form of either Eq. 29 or Eq. 30:

$$\ln(\text{Load}(t))=A_i\times\text{WeatherInput}_i(t-j)+B_i\times\text{ZoneTemperature}(t-j)+\\C_i\times\ln(\text{PriorLoad}(t-j))+D_i\times\text{HVACSchedule}(t-j)+\\F_i\times\text{ControlSetpoint}(t-j)+G_i\times\\\text{HVACTemperature}_i(t-j) \quad \text{Eq. 29}$$

or $$\text{Load}^2(t)=A_i\times\text{WeatherInput}_i(t-j)+B_i\times\text{ZoneTemperature}(t-j)+\\C_i\times\text{PriorLoad}^2(t-j)+D_i\times\text{HVACSchedule}(t-j)+F_i\times\\\text{ControlSetpoint}(t-j)+G_i\times\\\text{HVACTemperature}_i(t-j) \quad \text{Eq. 30}$$

$$(\text{Load}(t))\text{neuralnetwork}=\text{function}[(\text{PriorLoad}(t-i),\\\text{WeatherInput}(t-i),\text{PriorZoneTemperature}(t-i),\\\text{weekday}(t-i),\text{HVACSchedule}(t-i) \quad \text{Eq. 31}$$

Figure 12:
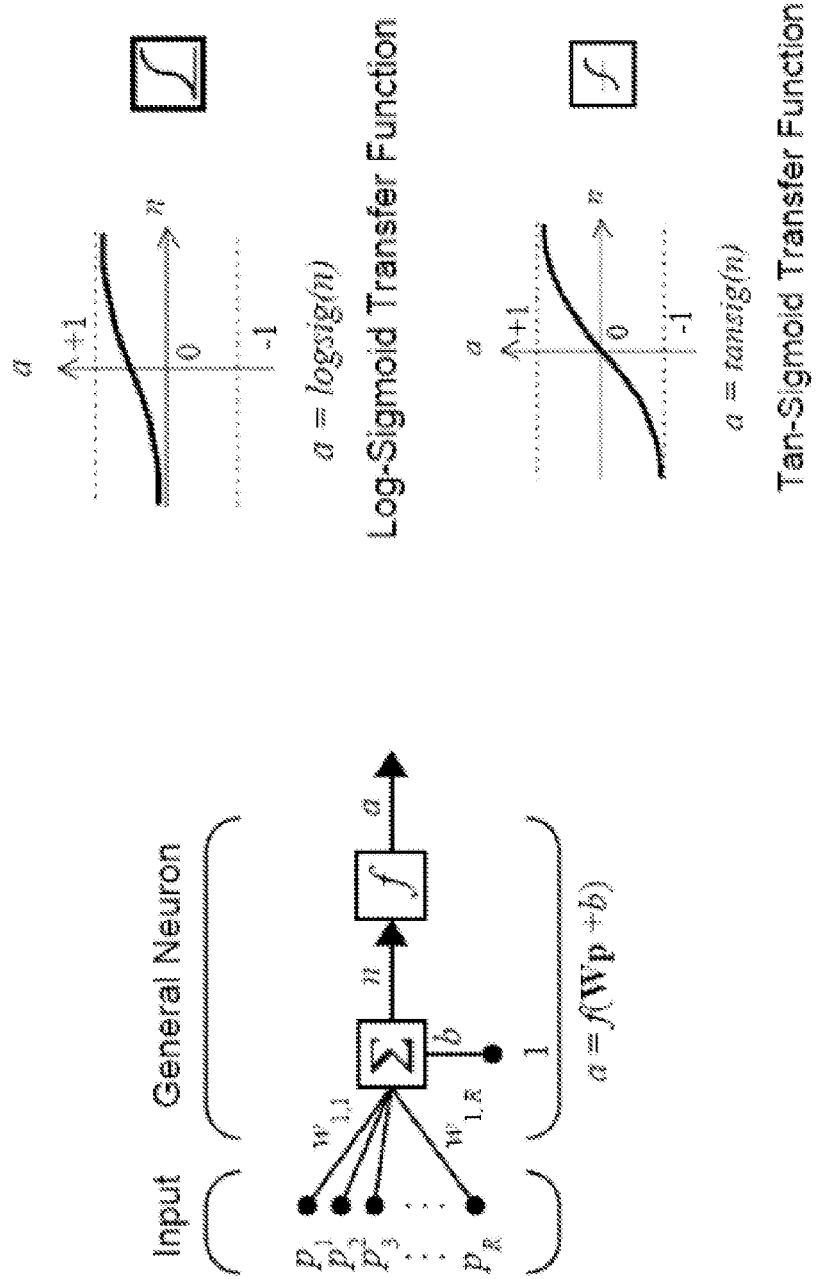
FIG. 12 shows an example day-after self-tuning model based on a neural network model according to a principle described herein.

FIG. 12 depicts the neural network of Eq. 31, and shows the functional form of applicable transfer functions, including a log-sigmond transfer function and a tan-sigmond transfer function.

Figure 13:
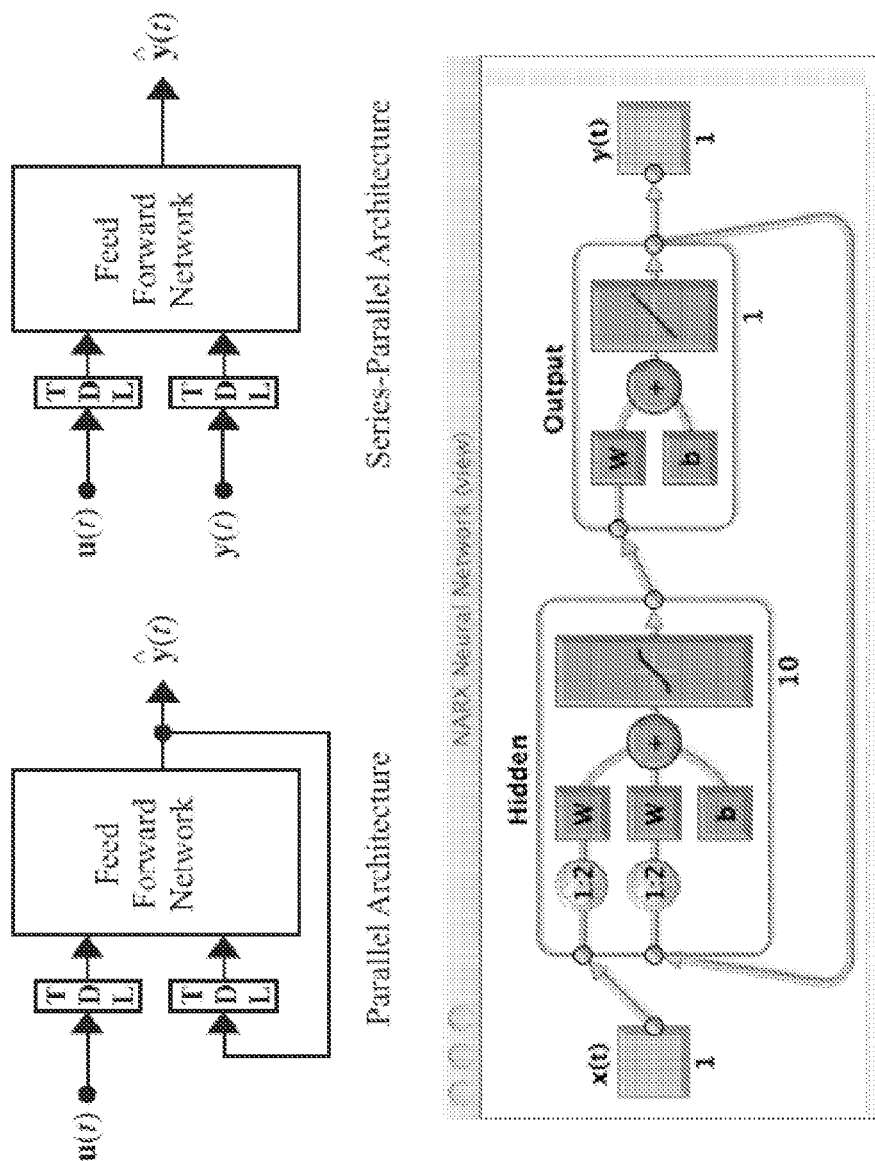
FIG. 13 shows an example day-after self-tuning model based on a neural network model implemented in a parallel architecture and a series-parallel architecture according to a principle described herein.

FIG. 13 depicts the parallel neural network architecture that can be used where it re-iterates using the output from the previous iteration. The series-parallel architecture can be used using the input of a state function and some data representing prior measurements of load.

Higher order representation may be used for load and/or all inputs. The CBL model may be used for real-time optimization and prediction. In such cases, the KF may be a non-linear tool such as an extended Kalman Filter or similar.

Artificial Neural Network AutoRegressive External Input (ANN-NARX) CBL Model

A feed forward NARX network architecture of the form shown in Eq. 31 can be used in an example ANN-NARX for generating a CBL Model:

$$\text{Load}(t)=(\mathcal{T})\text{function}[(\text{Load}(t-1),\text{Load}(t-2),\ldots,\text{Load}\\(t-j),\text{WeatherInputs}(t),\ldots,\text{WeatherInputs}(t-j),\\\text{ZoneTemperatures}(t-j),\text{Weekday}(t-j),\text{HVAC-}\\\text{Schedule}(t-j),\text{ControlSetpoints}(t-j),\\\text{HVACTemperatures}(t-j)] \quad \text{Eq. 32}$$

In a non-limiting example, the neural network has two hidden layers, each with ten neurons.

Another example self-tuning model that is applicable to the systems, methods and apparatus described herein is shown in Eq. 32.

$$kW = kWi + kWd \quad \text{Eq. 33}$$

$$\frac{dT_z}{dt} = A' * OAT + B' * T_z + C' * (T_{spt} + bias)$$

$$kWd = occ * [A * f(\text{weather}) + B * f(\text{indoor})]$$

$$kWi = f(\text{time, day}) = \text{time series model}$$

Eq. 32 show an example multiple regression self-tuning model. The model includes a total load term (in units of kiloWatt (kW)) as a combination of a load term that is independent of environmental conditions (a weather independent load term kWi) and a load term that is dependent on environmental conditions (the weather dependent load term kWd). The weather dependent load term kWd is modeled as a term in an outside environmental condition (such as but not limited to the outside air temperature (OAT) and the outside air humidity (RH)) and the indoor inputs (such as but not limited to the zone temperature and the zone humidity), weighted by a value of "occ" (the building occupancy schedule or by the HVAC operating schedule, which reflects when the building is occupied vs. unoccupied). The kWd term may depend mainly on the HVAC. A statistical analysis or other analysis tool can be implemented to determine model parameters in the kWd model. The weather independent load term kWd is modeled as a time series that can vary with the day of the week and/or with the time of day. For example, the weather independent load term on a weekday can differ from that on a weekend, and can also vary according to time of day for a given day. For example, the weather independent load term can differ between business hours and off-peak times. In addition, the weather independent term may vary with a time series dependent on season, weekdays, holidays/weekend. A Fourier analysis can be used to solve the weather independent load term.

In a non-limiting example, load modeling results: with application of the multiple regression are as follows. The coefficient of variation from actual load is between about 3% to about 10% within a day type; and within about 10-20% overall. The example building asset load was on average 700 kW; the multiple regression model root-mean-square error (RMSE) varied between 49 kW to 65 kW per day type.

Figure 14:
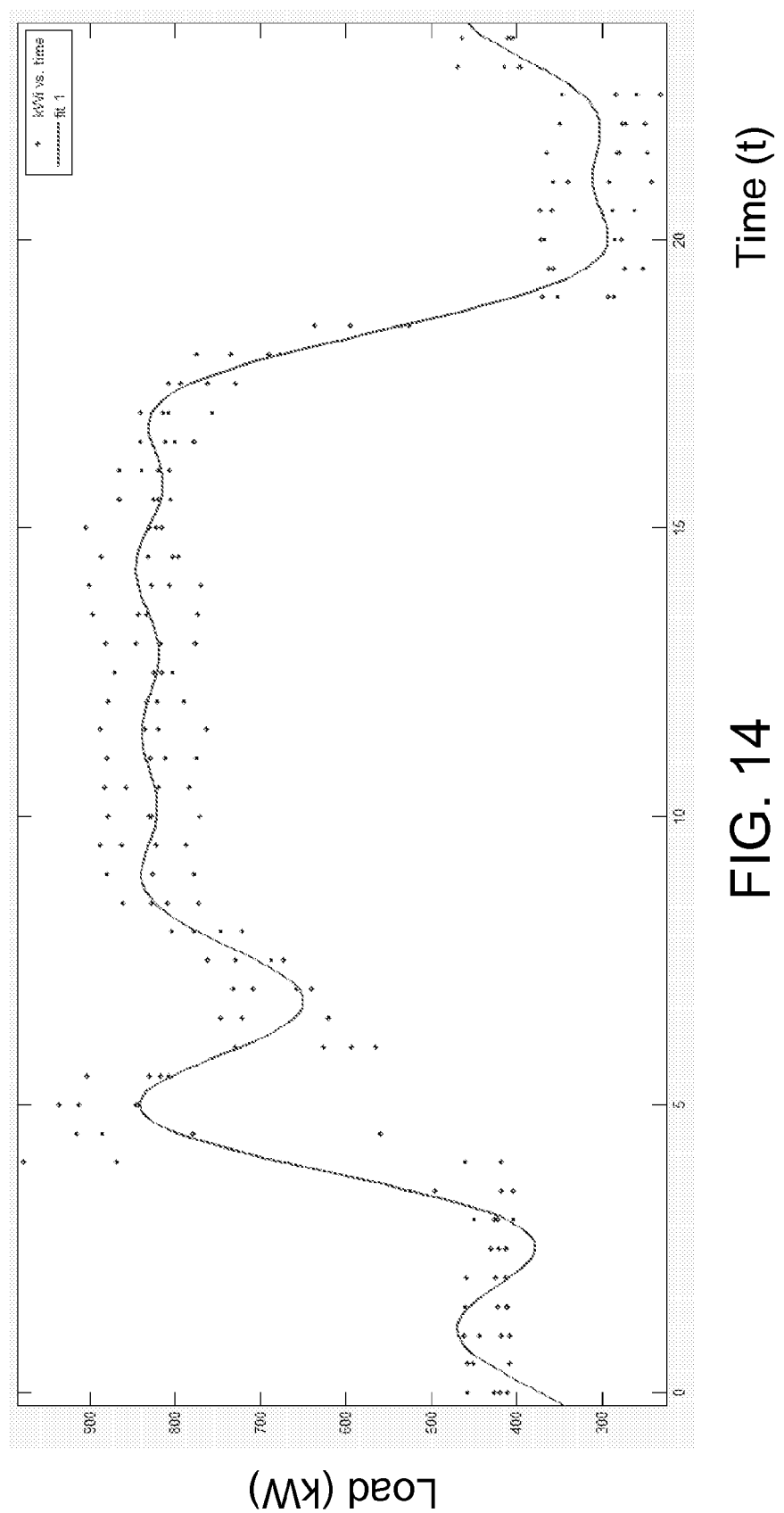
FIG. 14 shows an example of results of the multiple regression model and optimization according to a principle described herein.
Figure 15:
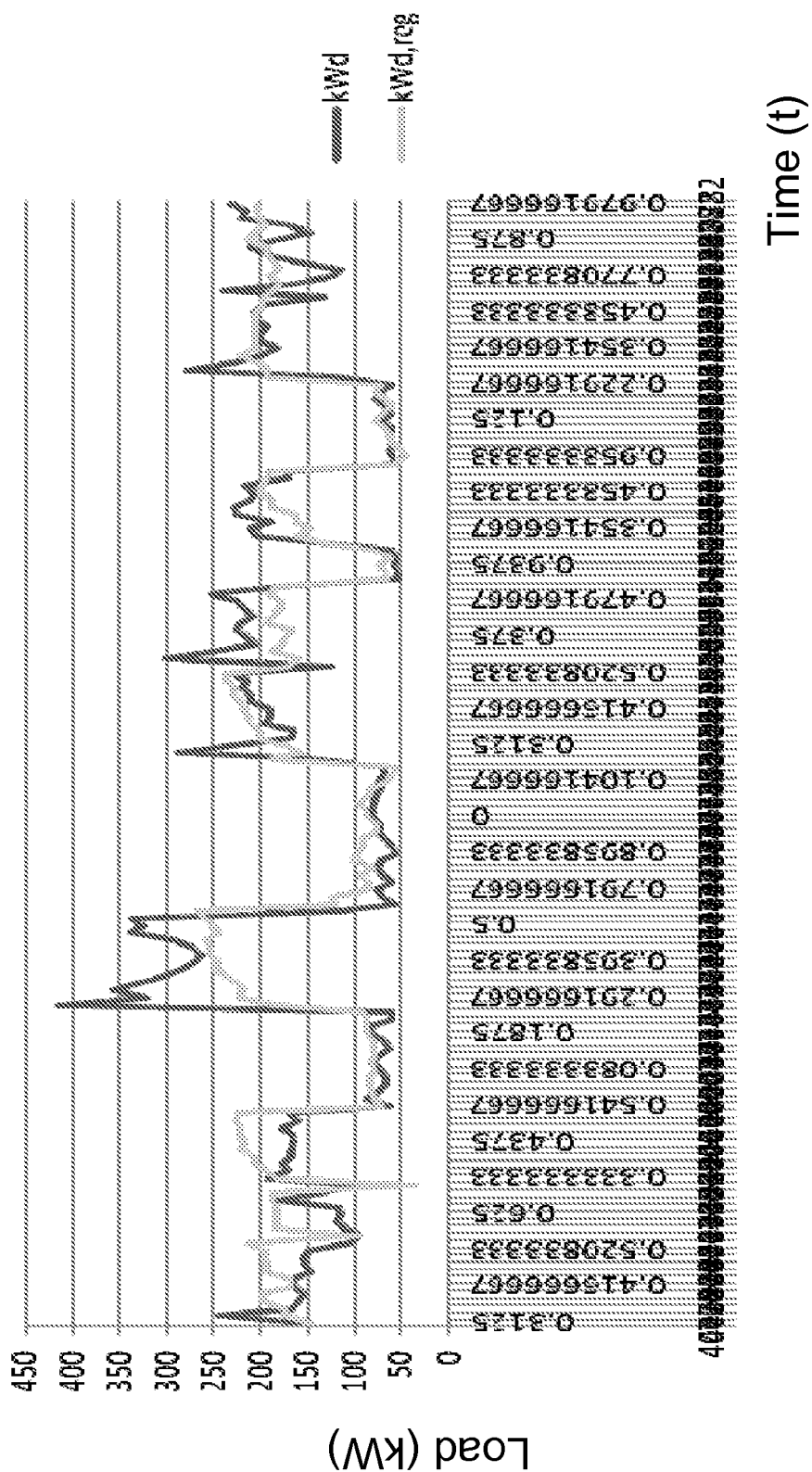
FIG. 15 shows the results of an example multi-regression model fit of the load (kW) vs. time according to a principle described herein.
Figure 16:
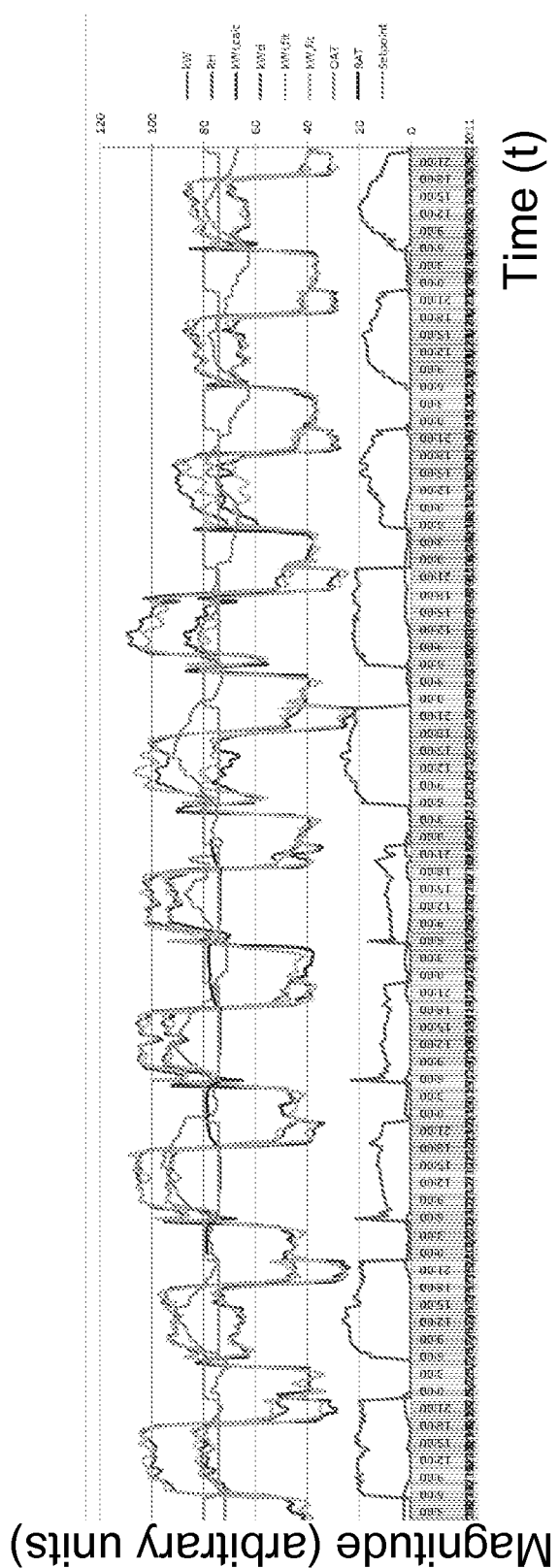
FIG. 16 shows results of another example multi-regression model fit of the load (kW) vs. time according to a principle described herein.

FIG. 14 shows an example of results of the multiple regression model and optimization. The plot shows the load (kW) vs. time for a of time series fit (Fourier) for summer Mondays kWi load profile. FIG. 15 shows the results of the multi-regression model fit of the load (kW) vs. time for summer Sundays kWd load profile. FIG. 16 shows results of the multi-regression model fit of the load (kW) vs. time for summer Tuesdays kWd load profile. FIG. 16 also shows a superposition of values for outside air humidity, outside air temperature, return air temperature, and value of setpoint.

The model of Eq. 33 also includes a term for modeling the zone temperature (Tz) of a building energy asset. The time-dependent variation in the zone temperature (Tz) is modeled as a regression over the outside air temperature (OAT), the zone temperature ($T_z$), the target zone (setpoint) temperature ($T_{spt}$) and a temperature deviation (as a bias).

The coefficients A, B, C, A', B', C', are determined during the model training and fitting process. These coefficients can be updated in real-time through a feedback and auto-corrective loop, e.g., during a real-time self-tuning operation.

The comfort index (CI) is used in this example to provide a measure of an occupant's comfort on a scale of 0 to 100, where CI=100% when Tz is within the cooling and heating setpoints (72 F to 78 F) and RHz is within 40%-60% (consistent with the American Society of Heating, Refrigerating and Air-Conditioning Engineers (ASHRAE) Standard 55-2007).

Figure 17:
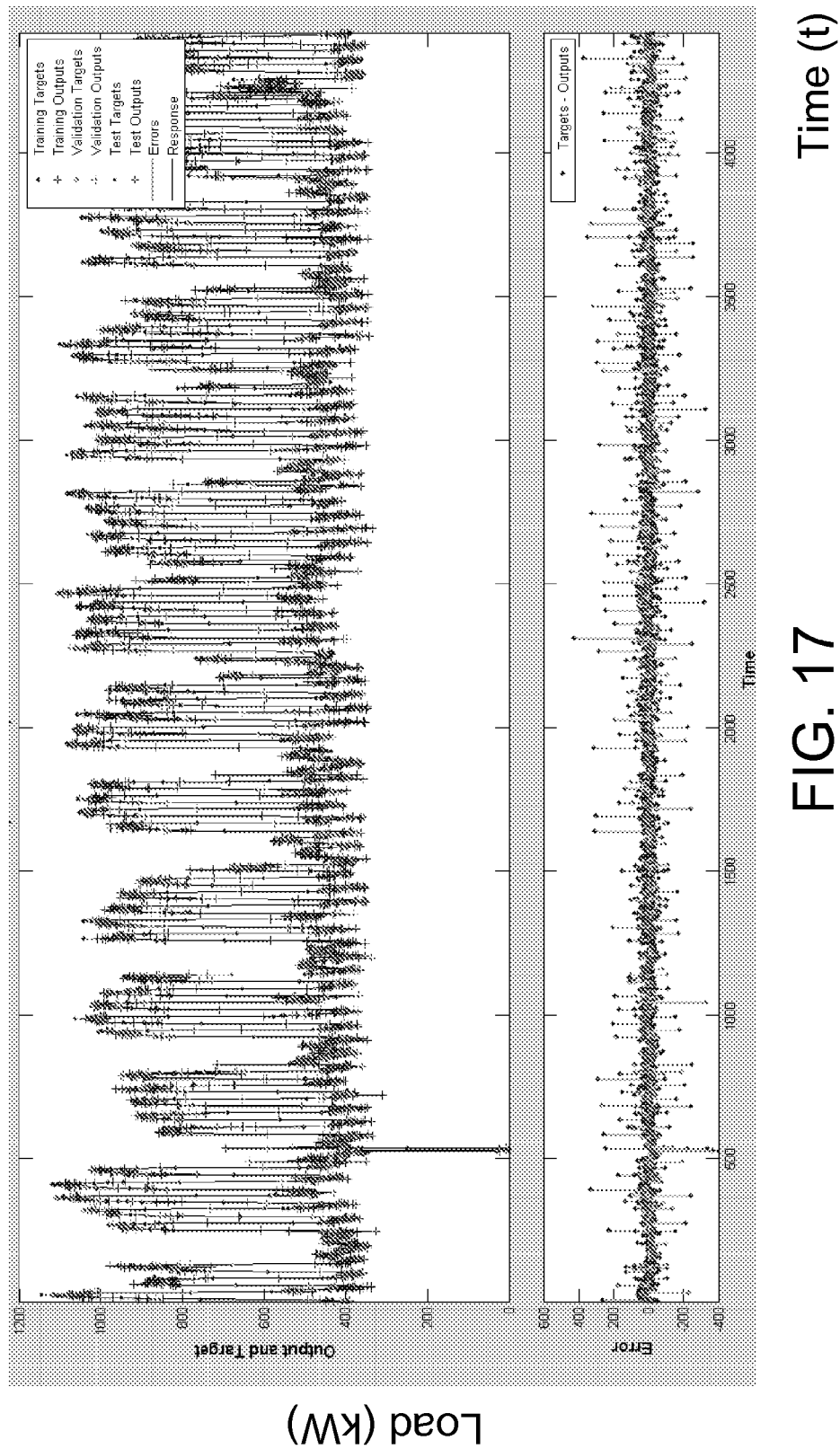
FIG. 17 shows an example of results of the multiple regression model and optimization for the neural network model according to a principle described herein.

Yet another example self-tuning model (a neural network model) that is applicable to the systems, methods and apparatus described herein is shown in Eq. 34. FIG. 17 shows an example of results of the multiple regression model and optimization for the neural network model. The neural network is trained using data from the load (kW) over the summer, showing the training targets, training outputs, validation targets, validation targets, test targets, test outputs.

$$kW = f(\text{weather}, \text{indoor}, \text{day}, \text{occ})$$

$$T_z = f(\text{weather}, \text{indoor}) \qquad \text{Eq. 34}$$

Figure 18:
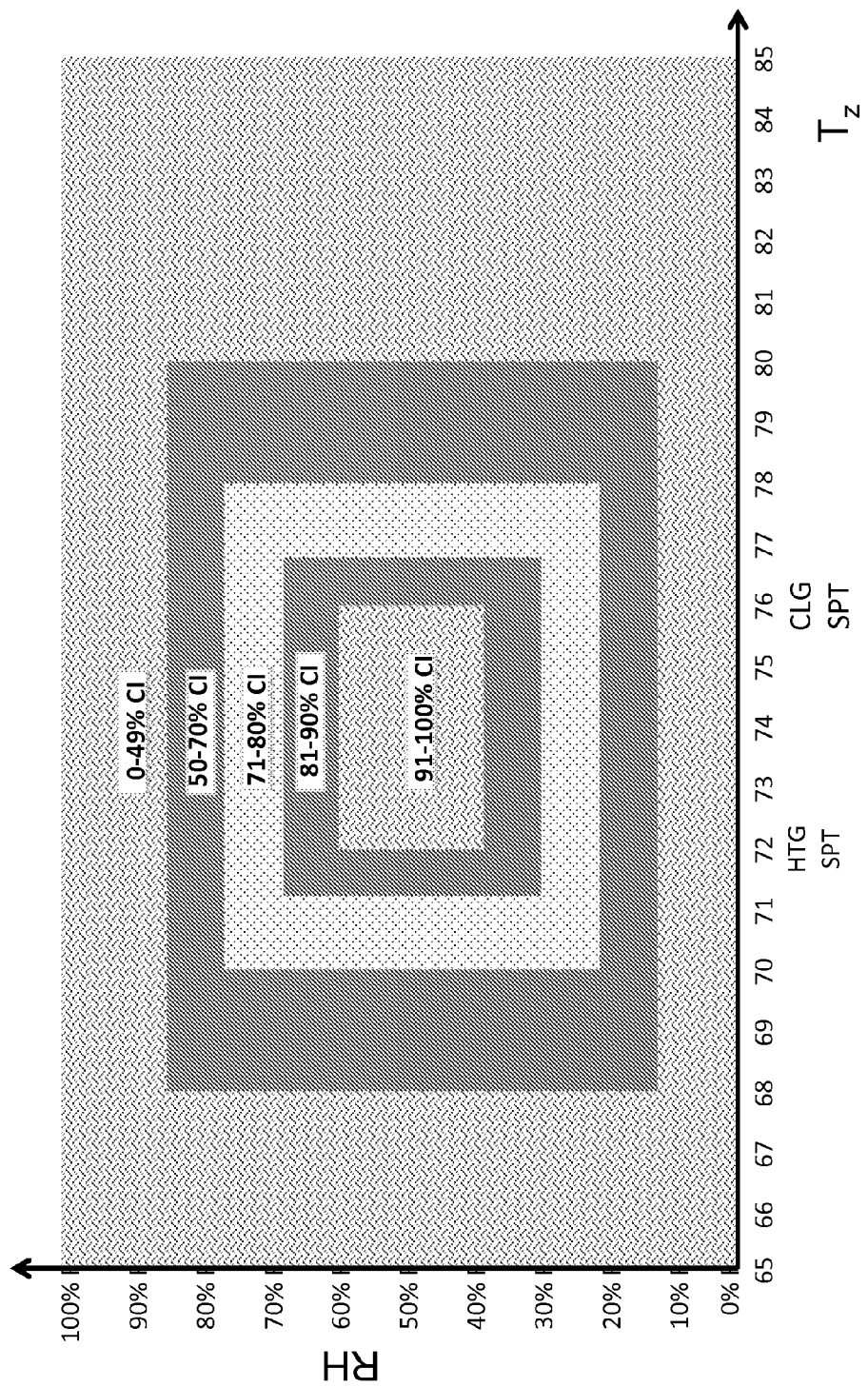
FIG. 18 is an example plot showing the relationship between different values of the comfort index (CI), the outside air humidity and the humidity according to a principle described herein.

FIG. 18 is a plot showing the relationship between different values of the comfort index (CI), the outside air humidity and the humidity.

Systems for Implementation of a Self-Tuning Model

Figure 19:
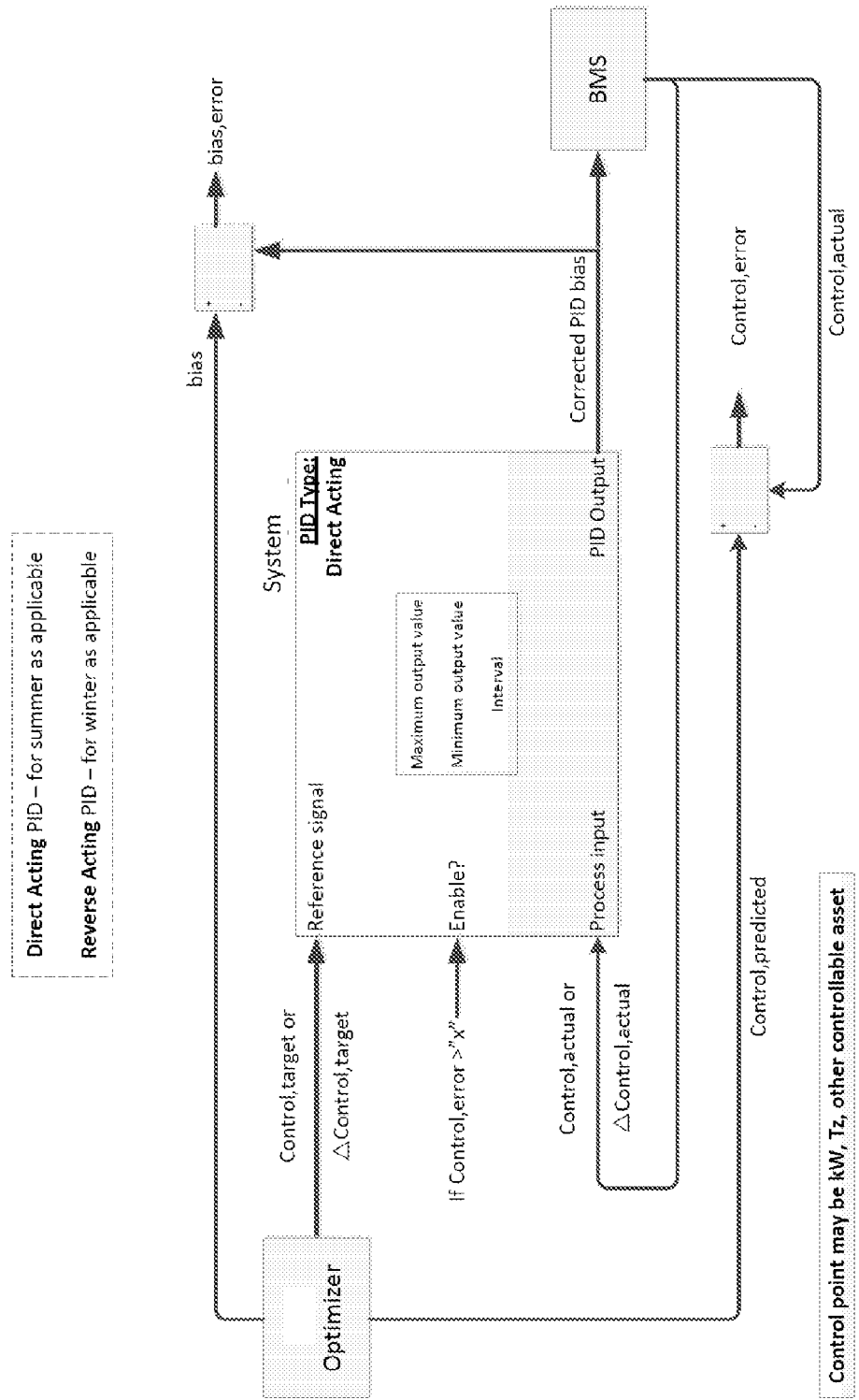
FIG. 19 shows an example functional block diagram of a PID controller according to a principle described herein.

FIGS. 19-23 show non-limiting examples of functional block diagrams of systems and apparatus that can be implemented to perform any of the self-tuning models according to the principles described herein. FIG. 19 shows a functional block diagram of a PID controller. FIGS. 20-23 show functional block diagrams of configurations of systems and apparatus for implementing a CBL computation, a day-ahead STM modeling, a real-time STM modeling, a day-after STM modeling, respectively.

Non-limiting examples of data that can be received by a communication interface of the example systems and apparatus as input date to implement a self-tuning model include: a) a customer's total load, b) a customer's HVAC load (if applicable), c) customer's weighted average building temperature, and d) a customer's local weather conditions.

In an example, a test may be used to validate the customer's load models and control.

Building Parameters Database for Faster Implementation

According to the principles described herein, the parameters of a STM model (including the day-ahead, real-time, day-after and CBL models), may be stored in a database to result in faster implementation. For example, once a STM model is built and trained as described herein, it may be implemented in an optimization over an objective function to generate suggested operating schedules on other physically comparable energy assets (including on physically similar building assets). The database may be used to classify buildings and parameters in categories, such as but not limited to the following categories:

a) Building Envelope: light, medium or heavy construction b) Building Fenestration: light or heavy fenestration c) Building Type: commercial, industrial, residential or institutional Proportional Integral Derivative (PID) Loop A PID controller algorithm also is developed to correct in real-time the bias signal sent to the building and ensure the target load reduction is achieved. The PID can be used to provide a measure of error (including ranges of values within the error) around a bias signal and to refine a business-as-usual approximation. BMS refers to the building management system that controls, e.g., equipment in the building (control signals can be sent to the BMS).

An example PID operates as illustrated shown in the functional block diagram of FIG. 19. Non-limiting examples of a "control" is a load (represented by kW), a zone temperature (represented by Tz), or other controllable asset (any other parameter sought to be controlled, including but not limited to a voltage). The PID model of FIG. 19 may be implemented so that the "control" is only the load (kW), only the zone temperature (Tz), only one of the other controllable assets, or any combination of two or more of the load, the zone temperature, and one or more of the other controllable assets. Applying the PID to load (kW) can be used to achieve an economic priority, i.e., ensuring that a load (kW) target is maintained within a predetermined allowable economic range. Applying the PID model to zone temperature (Tz) can be used to achieve a comfort priority, i.e., seeking to ensure that a zone temperature (Tz) target is maintained within a predetermined allowable comfort zone. In an implementation, the PID model is applied to both the load (kW) and the zone temperature (Tz) as "controls".

System Configurations for Implementing Self-Tuning Models

Non-limiting example system configurations for implementing the example self-tuning models are described in connection with FIGS. 20-23.

In each figure, the term M&V refers to measurement and verification; ADP refers to a dynamic programming solver. The terms RH and $RH_z$ refer to the relative humidity of outside air (RH) and building humidity ($RH_z$). T and $T_z$ refer to temperature, where Tz is a target zone temperature.

Self-Tuning Models and Optimizers

Example outputs from the self-tuning models are predicted load and predicted zone return air temperature. Examples of optimizations that can be run include according to the systems, apparatus, and methods described herein include a day-ahead optimization and a real-time optimization.

Day-Ahead ($OD^{t-1}$) Optimization

Figure 20:
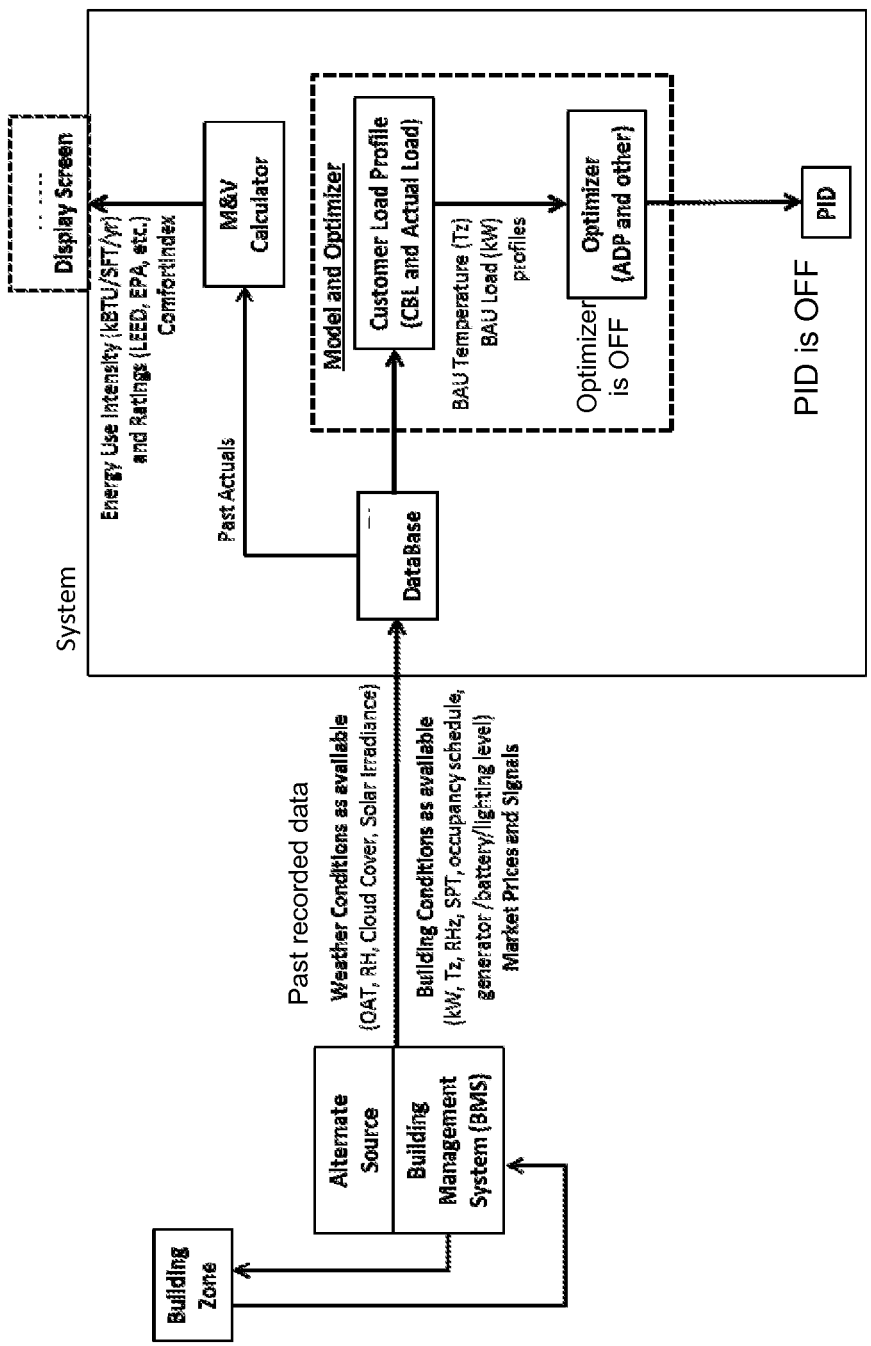
FIG. 20 shows an example functional block diagram of a configuration of a system and apparatus for implementing an example CBL computation according to a principle described herein.

FIG. 20 shows a functional block diagram of a system configuration for application of an optimization during the day-ahead STM computation. The $OD^{t-1}$ predictive model can be utilized to project the load in the energy asset (s), such as but not limited to a building. Based on price and weather forecasts, an optimal operating schedule of setpoints or biases can be determined to maximize revenues while maintaining comfort. The day-ahead optimization can be constrained by the zone temperature equation (2). Boundaries can be set for setpoint control range of typical occupants' comfort as determined by an energy customer or as set by the ASHRAE Standard 55-2010.

For poorly sensed buildings, including buildings with insufficient training data to capture the effect of temperature setpoints on the real zone temperature, a hybrid zone temperature equation of following form can be utilized:

$$A*RAT(t+1)=B*(OAT-RAT)(t)+C*SPT(t)-D*RAT(t)+E \quad \text{Eq. 34}$$

If the hybrid RAT equation does not provide robust constraint for optimization, change in temperature setpoint can be limited to the maximum recorded change in actual zone temperature.

Real-Time ($OD^t$) Optimization

Figure 21:
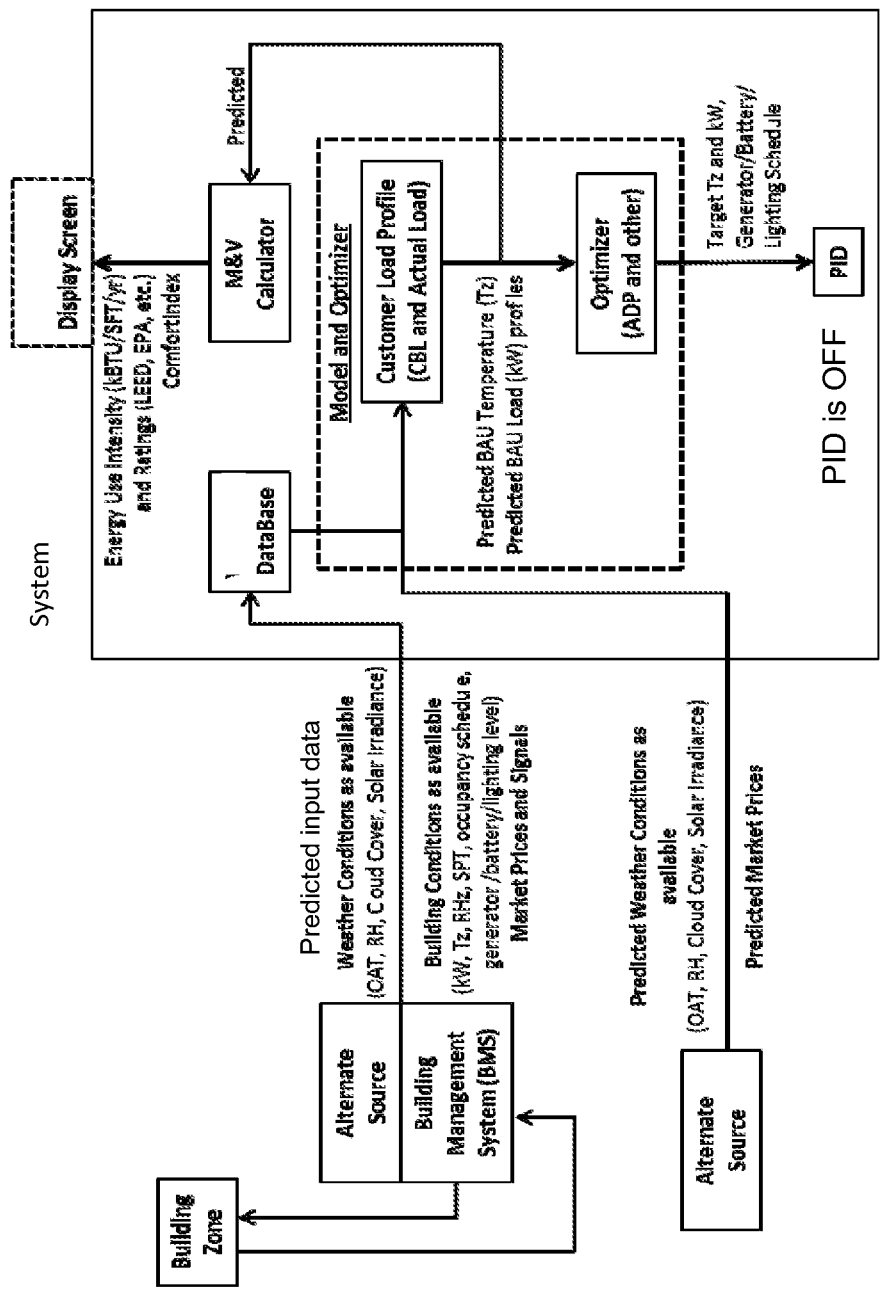
FIG. 21 shows an example functional block diagram of a configuration of a system and apparatus for implementing an example day-ahead self-tuning model according to a principle described herein.
Figure 22:
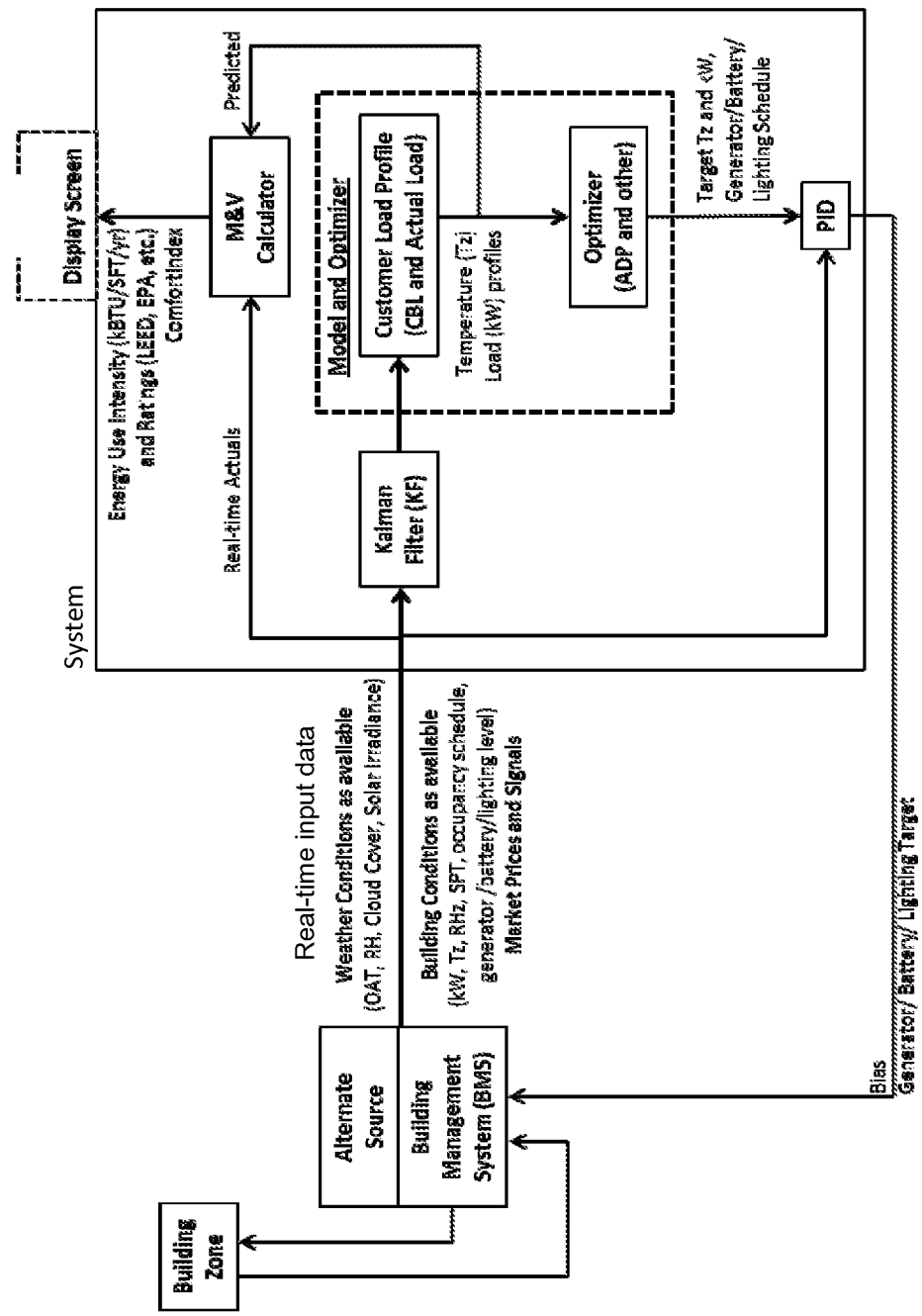
FIG. 22 shows an example functional block diagram of a configuration of a system and apparatus for implementing an example real-time self-tuning model according to a principle described herein.
Figure 23:
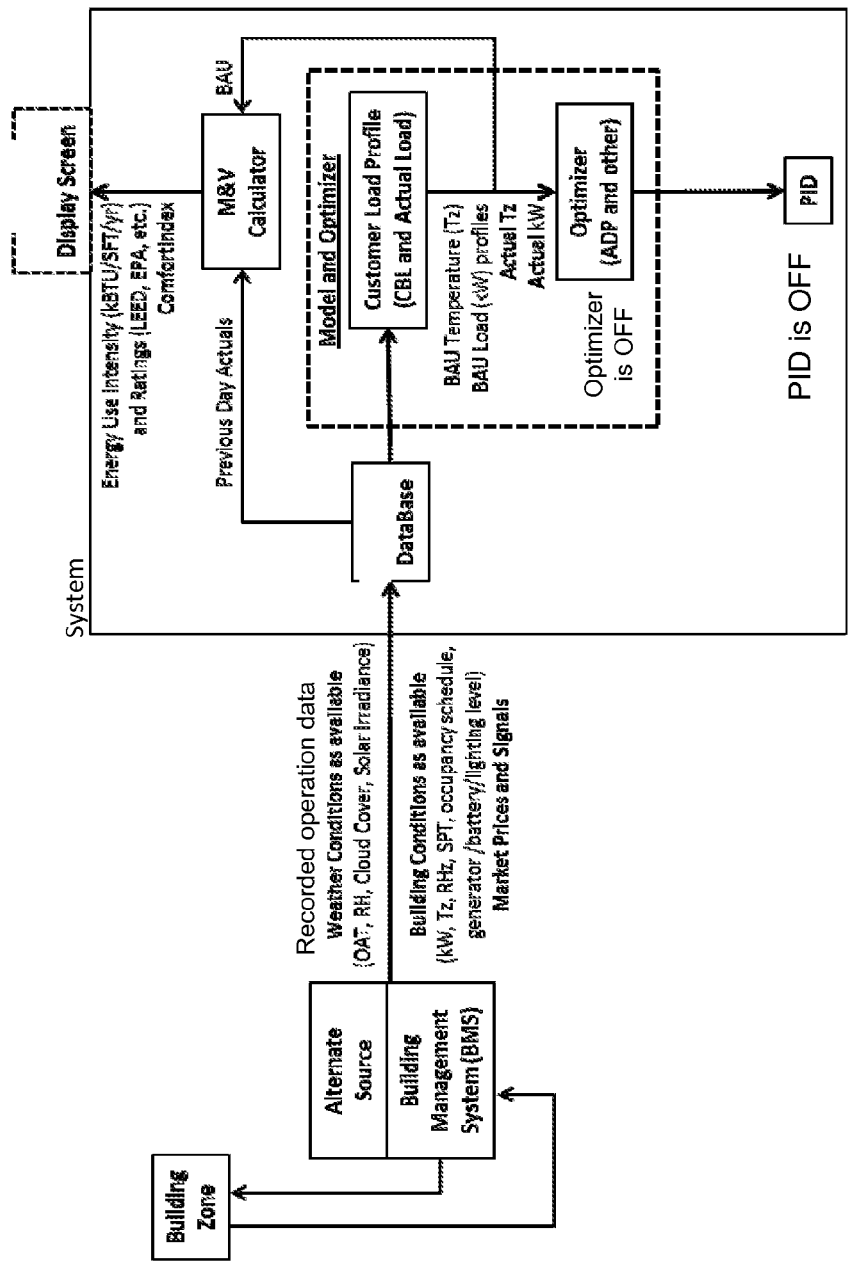
FIG. 23 shows an example functional block diagram of a configuration of a system and apparatus for implementing an example day-after self-tuning model according to a principle described herein.

FIG. 21 shows a functional block diagram of a system configuration for application of an optimization during the real-time STM computation. In real-time operation, the $OD^t$ model can be used to predict the load of the next time step. The optimizer can be run after each Kalman Filter update.

Non-Limiting Example Implementation

The self-tuning model can be applied to all building types, including but not limited to poorly-sensed buildings. Results of non-limiting example implementations are described. In these examples, the term AHU relates to the status of mechanical equipment (such as a HVAC system), OAH refers to outside air humidity, SPT refers to setpoint, and Qirr refers to solar irradiance.

STM Models Applied to First Example Building Asset

A non-limiting example is described of application of STM models for modeling energy assets of a First Example Building. The STM models can be used, according to the systems, methods and apparatus described herein, to facilitate generation of energy-related revenue based on optimization of an objective cost function.

Day-Ahead STM

Based on data representative of operation characteristics and the thermodynamic properties of the First Example Building Asset, a day-ahead STM model of the building asset is computed as described herein.

The load equation of the model is determined as:

ln(load(t))=1.01518577216349+5.552057044431111E−03*Time+1.89918986110202E−03*OAT(t)+1.26806513970821E−03*OAH*(t)+7.97864930884915E−03*RAT(t)−3.51423212592016E−02*SPT*(t)+0.674221638128815*ln(Load(t−1))+7.08002577470251E−02*ln(Load(t−2))+2.56638799494679E−04*Qirr−9.25316054889111E−05*Qirr(t−1)+4.94363807353346E−04*CC+2.71607576239426E−02*SPT(t−2)+0.33627491225217*AHU(t)−0.232557238131845*AHU(t−1)

The model can be transformed from a ln(load)) term to provide a measure of the load performance:

$R^2$=94.4% (May-June) vs. $R^2$=93.7% (July Validation)
CV=9.45% (May-June) vs. CV=9.37% (July Validation)
True rRMSE=12.6% (May-June) vs. rRMSE=11.2% (July Validation)

The zone temperature equation can be expressed as:

RAT(t)=9.260784539+0.850421867×RAT(t−1)+0.074101246×SPT(t)−0.05688809×SPT(t−1).

Real-Time STM

A day-ahead STM model of the building asset can be computed as described. For the First Example Building herein, the load equation for the model can be expressed as:

Load(t)=104.27527130685+1.32301609030541*OAT(t)−1.04880838470838*OAT(t−1)−4.84802833033975*RAT(t)+9.86681230772612*RAT(t−1)−4.99350121320919*RAT(t−2)−9.29631449888433*SPT*(t)+5.10331394136491*SPT*(t−1)+2.85881457805957*SPT(t−2)+0.774266995633034*load(t−1)+0.11211022518792*load(t−2)

The model load performance can be expressed as:
$R^2$ (predicted)=87%
CV=7.7%
True rRMSE=10.5%

The zone temperature equation can be expressed as:

RAT(t)=3.6945536780756+5.61602629994305E−02*OAT(t)−5.46579830556112E−02*OAT(t−2)+3.33252757965121E−02*OAH*(t)−3.31504045217453E−02*OAH*(t−1)+0.773153576672415*RAT(t−1)+0.166380934621244*RAT(t−2)+9.01302235694943E−02*SPT*(t)−8.43514524756083E−02*SPT(t−1)

Model performance:
$R^2$ (predicted)=88.5%
CV=0.7%
rRMSE=0.8%

Kalman Filtering

| KF Results | | |
|---|---|---|
| May-June | July (non-KFed) | July (KFed) |
| Load (Training Model) | For Load (Testing Model - BeforeKF) | Load (Testing Model - AfterKF) |
| $\hat{R}2$ = 87% | $\hat{R}2$ = 83% | $\hat{R}2$ = 89.2% |
| CV = 7.7% | CV = 7.3% | CV = 5.8% |
| rRMSE = 10.5% | rRMSE = 9.7% | rRMSE = 7.8% |
| RAT (Training Model): | For RAT (Testing Model - BeforeKF) | RAT (Testing Model - AfterKF): |
| $\hat{R}2$ = 88.5% | $\hat{R}2$ = 94% | $\hat{R}2$ = 95.3% |
| CV = 0.7% | CV = 1.01% | CV = 0.9% |
| rRMSE = 0.8% | rRMSE = 1% | rRMSE = 0.9% |

The model load performance can be expressed as:

Load(t)=104.27527130685+1.32301609030541*OAT
(t)−1.04880838470838*OAT(t−1)−
4.84802833033975*RAT(t)+
9.86681230772612*RAT(t−1)−
4.99350121320919*RAT(t−2)−
9.29631449888433*SPT*(t)+
5.10331394136491*SPT(t−1)+
2.85881457805957*SPT(t−2)+
0.774266995633034*load(t−1)+
0.11211022518792*load(t−2)

The model load performance can be expressed as:
$R^2$=96.6% (May-June) vs. $R^\wedge$=95.7%
CV=7.24% (May-June) vs. CV=8.03%
True rRMSE=9.08% (May-June) vs. rRMSE=9.28%

STM Models Applied to Second Example Building Asset

A non-limiting example is described of application of STM models for modeling energy assets of a Second Example Building. The STM models can be used, according to the systems, methods and apparatus described herein, to facilitate generation of energy-related revenue based on optimization of an objective cost function.

| Second Example Building (May-July 2011) | All 90 Days | 90 days_HE11-19 | All non-Event Days | NonEvent_HE11-19 |
|---|---|---|---|---|
| Artificial Neural Network (ANN) STM CBL -- RRMSE per industry guidelines | 7.896% | 6.045% | 7.998% | 6.109% |
| ANN CBL -- true rRMSE | 9.443% | 7.486% | 9.541% | 7.581% |
| Non-Linear STM CBL -- RRMSE per industry guidelines | 9.028% | 7.482% | 9.108% | 7.592% |
| Non-Linear STM CBL -- true rRMSE | 9.678% | 8.098% | 9.739% | 8.208% |
| Physical Model CBL -- RRMSE per industry guidelines | 12.918% | 12.007% | 13.096% | 12.234% |
| Comparative w/SAA HE11-19 RRMSE | 18.350% | 12.471% | 18.613% | 12.705% |
| Comparative w/SAA HE5-24 RRMSE | 22.454% | N/A | 22.758% | N/A |

An Event Day indicates when a command is sent to the building asset, and/or one or more controllers of components of the building asset, to affect an operating schedule. On a Non-Event Day, no such command is sent. HE11-19 indicates the hours from hour 11 of a given day to hour 19 of the same day.

Optimizer Module

In an example, an optimizer can be implemented to provide at least one solution set with respect to minimizing energy costs of a customer site (including the at least one energy asset). As described hereinabove, the optimizer can be implemented to minimize the net energy related costs (expressed as follows) over a time period T to determine the possible energy-related revenue that may be derived:

$$\text{Min}\left[\sum_{t}^{T}(Supply\$(t) - DR\$(t))\right] \qquad \text{Eq. 35}$$

where the term Supply$(t) indicates the total cost to supply the energy and demand response revenue. As a non-limiting example, the optimizer can be implemented according to the following equations.

$$\text{Minimize}[T\$_{dev} + \text{Emission}\$ + \text{Gen}\$ + \text{Supply}\$ - DR\$] \qquad \text{Eq. 36}$$

where
$T\$_{dev}$=Cost of deviations from the business-as-usual comfort levels (including BAU temperature level)
Emission$=Cost/value of deviations from the emission target
Gen$=Cost of electric power production by the customer energy generating assets
Supply$=Cost of electric power supply from the Load Serving Entity or the Electric Distribution Company $$DR\$ = \max(0,(CBL-Load))*(LMP-G\&T \text{ Rate}) \qquad \text{Eq. 37}$$

where
CBL=Customer baseline
Load=Actual customer usage
LMP=Locational Marginal Prices
G&T Rate=Generation & Transmission Rate In an example implementation, the minimization (Minimize$|_T$) can be computed, for a specified time period T, based on Eq. 35 or 36 for the time varying parameters. As a non-limiting example, time period T can be a period of 24 hours, 48 hours, or any other specified time period. In this example, an optimizer can be implemented to perform a method according to minimization (Minimize$|_T$), for the specified time period T. In an example implementation, the minimization can be computed as a continuous function over the entire time period T. In another example implementation, the minimization can be computed over discrete portions of the function for several time intervals (Δt) that sum to time period T. As a non-limiting example, the minimization can be computed over 48 different half-hour time intervals, for a total time period of T=24 hours.

An aspect of an optimizer is that the optimization determines a suggested operating schedule that can facilitate an overall economic benefit (including deriving energy-related revenue) over the entire time period T, even if the operating schedule may call for a mode of operation during a given time interval ($t_1$ to $t_2$) during time period T that may not take advantage of the lowest energy market price or lowest cost of energy production during that time interval ($t_1$ to $t_2$). For example, the suggested operating schedule may determine an operating schedule that calls for increased load if, for example, the load is used to charge an energy storage asset that can be committed to a regulation market if the regulation market price is sufficiently favorable to the overall economic benefit, for the entire time period T, when the suggested operating schedule is performed over the entire time period T.

To generate the suggested operating schedule, the optimizer can perform computations over various parameters, such as but not limited to the forecast wholesale market price over time period T for participating in the energy market, the regulation market price available to the customer and over what time interval, other potential energy-related revenue (including synchronized reserve markets and capacity markets), and the energy responsive behavior of each of the customer's energy assets. For example, the suggested operating schedule may include processor-executable instructions that cause a backup generator to be committed to an economic demand response market, a synchronized reserve market, or a capacity market as a part of the overall optimization over the time period T. In another example, the building of the customer site, the occupancy of the building, the HVAC systems; chillers; ventilators; heaters; lighting; or other similar energy assets can exhibit thermal inertia, i.e., it can take longer time scales for such energy assets to respond to a change in signal to reach a change of state (e.g., get to a lower temperature). The operating schedule can include processor-executable instructions to commit these types of energy assets to respond to an economic demand response market, a capacity market and/or a power quality market at some time interval during time period T based on the modulation of use of these energy assets. In other examples, the state of charge of a battery at a given point in the day determines whether it has sufficient capacity to be committed to any of the economic demand response market, regulation market, synchronized reserve market, capacity market or power quality market. As another example, the suggested operating schedule can include processor-executable instructions that cause energy assets (including the servers in a computing facility) to be committed to a regulation market based on modulating the operation of the controllable energy asset, where the controllable energy asset can respond on a fast timescale (e.g., according to regulation signals that can change potentially at 2-second time intervals). Non-limiting examples of the modulation of the operation of controllable energy assets include changing the speed of fans, changing the computing levels of servers and other computing equipment, modifying variable frequency and/or variable speed of components (such as but not limited to modifying the frequency and/or speed of a motor, a fan, any other ventilation equipment, and/or a pump), cooling rate/speed of the HVAC and a chill rate of the chiller. Given that increased load consumption of a controllable energy asset can cause them to heat, and as a result may also require increased cooling, there can be an interaction term between the modulation of controllable energy assets and the usage of energy assets such as HVAC systems; chillers; ventilators; or heaters. As a result, implementation of controllable energy asset in, e.g., the regulation market, can affect how energy assets such as HVAC systems; chillers; ventilators; or heaters are implemented in the energy markets, through time-based interaction terms. The systems, methods and apparatus described herein perform optimization that evaluate the types of energy assets in each customer site, the state of each of the various energy assets at each customer site, the markets available to each different customer site and the forecast prices for each such market, and the behavior of each energy asset, all over a specified time period T. The result is generation of a suggested operating schedule for the various energy assets (and/or for the controller of each energy asset), that, when executed, can generate energy-related revenue, over a time period T, associated with operation of the energy assets according to the operating schedule.

Energy Management System

Figure 24:
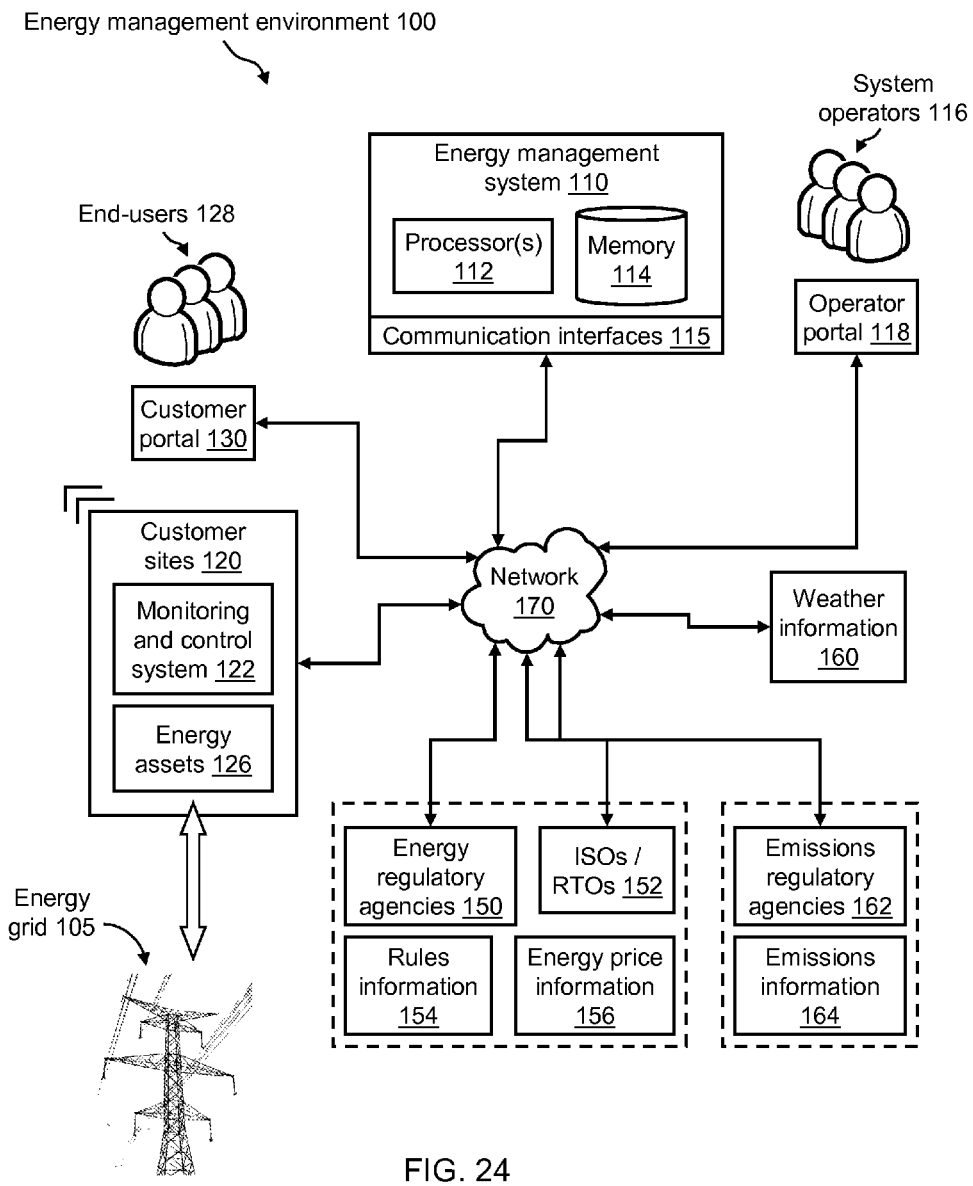
FIG. 24 illustrates a block diagram of an example energy management environment that includes an energy management system to facilitate generation of revenue from wholesale electricity markets, according to a principle described herein.

FIG. 24 illustrates a block diagram of an energy management environment 100 that includes an energy management system 110 to facilitate generation of revenue from energy markets, according to the principles described herein. In FIG. 24, energy customers are the end-users and/or consumers of electricity supplied by a retail electricity supplier (via electricity grid 105). Additionally, some customers may have electricity generation capabilities for providing electricity back to the grid and/or for supplying electricity to the customers' own electricity-consuming assets.

Energy management system 110 may include one or more processors 112, one or more memory devices 114, and one or more communication interfaces 115. Processors 112 may be configured to execute software applications (e.g., processor-executable instructions stored in one or more memory devices 114), and/or work in tandem with other hardware components, for managing the overall operations of energy management system 110. In a service-oriented architecture (SOA), processors 112 may implement a variety of functionality for supporting the SOA. In one example, communication interfaces 115 may include a web interface and an enterprise service bus. Additional details regarding processors 112, memory 114, and communication interfaces 115 are described with reference to FIG. 25.

One or more system operators 116 may be associated with energy management system 110. System operators 116 may access energy management system 110 via an operator portal 118. Operator portal 118 is the user interface by which a system operator 116 may manage the process of creating an energy assets operating schedule. The optimized operating schedule covers a chosen period of time. Once an optimized operating schedule is transmitted to and accepted by the customer, in some examples operator portal 118 may be used by a system operator 116 for monitoring and/or controlling a customer's energy assets in real time.

Customer sites 120 and end-users (energy customers) 128 of energy management environment 100 represent the customers and/or consumers of the electricity supplied by retail electricity suppliers via the grid 105. Customer sites 120 may be any electricity-consuming and/or electricity-generating environments, such as, but not limited to, a building or group of buildings belonging to energy grid customers. End-users 128 may be any individuals associated with customer sites 120. Examples of end-users 128 may include building supervisors, company employees, company executives, and the like. Each customer site 120 may include one or more energy assets 126. Energy assets 126 may be any configuration of one or more energy usage assets, one or more energy storage assets, one or more energy generation assets, one or more renewable energy assets, and any combinations thereof. Groups of energy assets 126 and/or buildings associated with a certain customer site 120 may be in close physical proximity to each other or may be physically distant and even separated by time zones.

A monitoring and control system 122 may be installed at each customer site 120. One example of monitoring and control system 122 is a building management system (BMS). Another example of monitoring and control system 122 is a building automation system (BAS). The main function of a BMS and BAS is to manage the environment within a building or group of buildings. For example, the BMS or BAS may control temperature, carbon dioxide levels, and humidity within a building via certain energy assets 126. In one example, an end-user 128 of a certain customer site 120 uses monitoring and control system 122 to monitor and/or manage the energy assets 126 thereof. Monitoring and control system 122 may be any commercially available BMS or BAS, such as those supplied by Johnson Controls, Inc (Milwaukee, Wis.), Automated Logic Corporation (Kennesaw, Ga.), and Honeywell International, Inc (Morristown, N.J.).

The web-based operator portal 118 and/or the web-based customer portal 130 may be accessed via any web-enabled device, such as, but not limited to, any desktop computer, laptop computer, tablet computer, net-book computing device, handheld computing device, personal digital assistant, enterprise digital assistant, portable digital assistant, cell phone, smart phone, and the like.

Additionally, energy management environment 100 may include any other entities that may be useful to (and communicate with from time to time, e.g., via network 170) energy management system 110 for operating, using, and/or controlling energy assets 126 of customer sites 120. Examples of other entities may include, but are not limited to, energy regulatory agencies 150 (e.g., FERC) and ISOs/RTOs 152. The energy regulatory agencies 150 and/or ISOs/RTOs 152 may be a source of any information that is useful to energy management system 110 for operating, using, and/or controlling energy assets 126 of customer sites 120. Examples of useful information sources may include, but are not limited to, rules information 154, and/or energy price information 156. Rules information 154 may be any rules, regulations, and/or guidelines according to any authorized entity related to the electric power industry, such as, but not limited to, energy regulatory agencies 150 and/or ISOs/RTOs 152.

Additionally, energy management environment 100 may include a source of weather information 160. In one example, weather information 160 may be information supplied by a third party service, such as, but not limited to, AWIS Weather Services, Inc. (Auburn, Ala.). In another example, weather information 160 may be information supplied by a national and/or regional weather service that may be accessed using the Internet via a network 170. Examples of weather websites may include, but are not limited to, the NOAA National Weather Service website (at nws.noaa.gov), the Weather Channel website (at weather.com), and the Weather Underground website (at wunderground.com).

Weather information 160 may be useful to the optimization function of energy management system 110 with respect to predicting the actual environmental conditions in a building or group of buildings. For example, the optimization function may factor in the delta between the outside temperature and inside temperature. Additionally, the optimization function may factor in the amount of cloudiness with respect to solar gain calculations. For example, the solar gain may be lowest on a cloudy day, highest on a day that is not cloudy, and anything in between.

Additionally, energy management environment 100 may include certain emissions regulatory agencies 162 that may be the source of certain emissions information 164. Emissions regulatory agencies 162 may be any federal, regional, state, and/or municipal regulatory bodies that facilitate emissions trading programs. In the United States, the Environmental Protection Agency (EPA) is an example of an emissions regulatory agency 162. In Europe, the European Union (EU) is an example of an emissions regulatory agency 162. Emissions information 164 may include emissions cap information, cost information for buying emissions credits, and/or price information for selling emissions credits. Additionally, emissions information 164 may include any published information about the local energy grid (e.g., energy grid 140) with respect to the emission of pollutants and/or greenhouse gases (GHG).

Network 170 may be, for example, any local area network (LAN) and/or wide area network (WAN). Network 170 provides the communication link between any and/or all entities of energy management environment 100. For example, energy management system 110, operator portal 118, customer sites 120, customer portal 130, regulatory agencies 150, ISOs/RTOs 152 and/or emissions regulatory agencies 162 may be connected via network 170. Entities may connect to network 170 using any wired and/or wireless networking protocols. Additionally, rules information 154, energy price information 156, weather information 160, and/or emissions information 164 may be accessed via network 170.

Once a model is created, the environmental conditions within the building or group of buildings of a certain customer site 120 may be simulated based on the input criteria of the model. The simulation results are then fed into an optimization function, which is a cost minimization function that includes a combination of multiple sub-functions, of energy management system 110 that processes the information and generates an optimized operating schedule, within a set of constraints. That is, the optimization function of energy management system 110 is used to create an operating schedule (for a chosen period of time) for energy assets 126 of a customer site 120, wherein the operating schedule for the energy assets 126 is optimized for reducing energy costs, reducing emissions costs, and/or generating revenue from energy markets.

Energy management system 110 may also include a markets component (see FIGS. 2 and 7) for interacting with any entities in the energy markets. In one example, the markets component processes settlements in any energy markets between the ISOs/RTOs and consumers. Energy management system 110 also provides a simplified and/or automated process of managing the energy assets in any energy-consuming and/or energy-producing environment, such as, but not limited to, a group of energy assets and/or a building or group of buildings. Energy management system 110 is used to facilitate an energy management service to customer sites 120 of energy management environment 100.

The optimized operating schedule for the chosen period of time is stored at energy management system 110 and then transmitted (i.e., deployed) to the monitoring and control system 122 of the customer site 120. The energy assets 126 are then operated and/or controlled according to the optimized operating schedule. In the deployment process, the process of an end-user 128 of a customer site 120 accepting an optimized operating schedule from energy management system 110 may be iterative. Once the optimized operating schedule is deployed and in service, system operators 116 may use operator portal 118 to monitor and/or control the operation of the energy assets 126 of customer site 120. Likewise, end-users 128 may use customer portal 130 to monitor and/or process information about the operation of the energy assets 126 of customer site 120. Additional details of an example of a process of creating and optimizing a schedule for managing energy assets of any energy-consuming and/or energy-producing environment are described with respect to FIG. 22.

Figure 25:
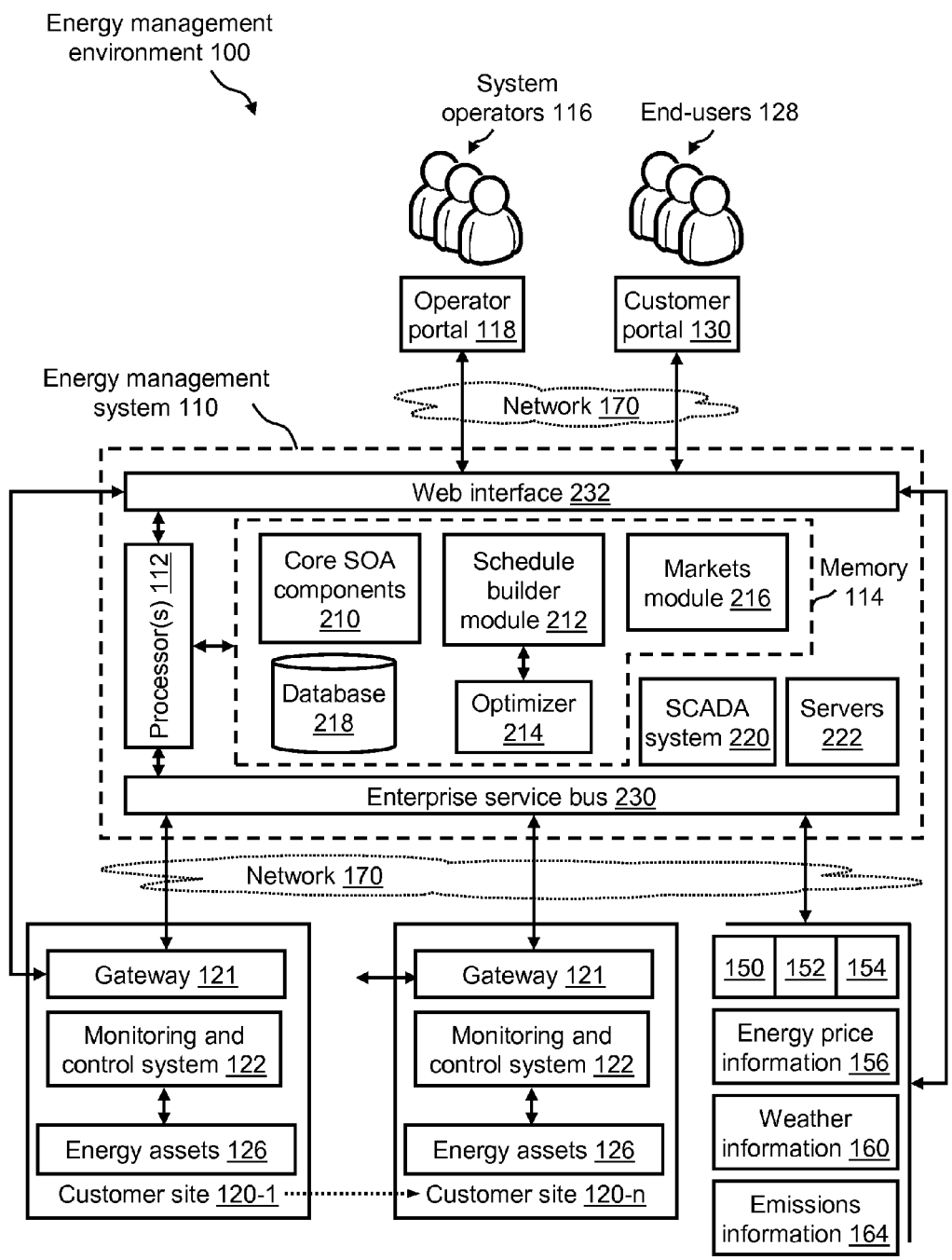
FIG. 25 illustrates a block diagram showing additional details of the example energy management system of FIG. 24, according to a principle described herein.

FIG. 25 illustrates a block diagram showing additional details of energy management system 110 of FIG. 24. For example, FIG. 25 shows energy management environment 100 of FIG. 24 implemented in a service-oriented architecture (SOA). In the service-oriented architecture shown in FIG. 25, the server side of energy management environment 100 is energy management system 110 while the client side of energy management environment 100 may include any number of customer sites 120, such as customer sites 120-1 through 120-n.

In one example, energy management system 110 may include certain functional components and/or modules that are installed and executing in memory 114 and managed by the one or more processors 112. Examples of functional components and/or modules of energy management system 110 may include, but are not limited to, certain core SOA components 210, a schedule builder module 212 that feeds an optimizer 214 (e.g., optimization software), a markets module 216, and a database 218. Energy management system 110 also includes a supervisory control and data acquisition (SCADA) system 220 as well as various servers 222 for supporting the SOA. The functional components and/or modules of energy management system 110 may communicate via an enterprise service bus 230. Enterprise service bus 230 manages "calls" in and out of energy management system 110. A set of adaptors (not shown) may be connected to enterprise service bus 230 for interfacing with any entities that are outside of energy management system 110, such as, but not limited to, the monitoring and control system 122 of any customer sites 120, energy regulatory agencies 150, ISOs/RTOs 152, rules information 154, energy price information 156, weather information 160, emissions regulatory agencies 162, and emissions information 164. The adaptors (not shown) are connected to enterprise service bus 230 for handling various communication protocols.

Energy management system 110 also includes a web interface 232. Web interface 232 may be, for example, any web browser that allows energy management system 110 to be accessed via a URL address. In addition to using enterprise service bus 230, the monitoring and control system 122 of any customer sites 120, energy regulatory agencies 150, ISOs/RTOs 152, rules information 154, energy price information 156, weather information 160, emissions regulatory agencies 162, and emissions information 164 may communicate with energy management system 110 via web interface 232. Additionally, the one or more operator portals 118 and customer portals 130 may communicate with energy management system 110 via web interface 232.

To integrate diverse monitoring and control systems 122 with energy management system 110, a physical connection from the monitoring and control systems 122 to network 170 is required. Therefore, a gateway 121 may be associated with each monitoring and control system 122 of customer sites 120. Gateway 121 may be any translation device between the output of energy management system 110, which is using a specified protocol, and one of any number of different BMS or BAS protocols and/or different energy asset device protocols. Accordingly, gateway 121 is installed at the physical location of the monitoring and control system 122 of a customer site 120. The presence of gateway 121 with each monitoring and control system 122 allows energy management system 110 to be substantially customer-agnostic by connecting common network protocols, such as, but not limited to, LONWORKS® (Echelon Corporation, San Jose, Calif.), BACNET® (ASHRAE, Atlanta, Ga.), and MODBUS® (Modbus Organization, Inc.), along with many proprietary network protocols.

In another example, optimizer 214 may use energy price information 156 to indicate to customer sites 120 to charge batteries at times of day when energy prices are lowest and to utilize (discharge) the batteries at times of day when energy prices are highest; again, reducing energy costs of a customer site 120.

In yet another example, optimizer 214 may use energy price information 156 to generate optimized operating schedules for energy assets 126 that may be used to indicate to end-users 128 at customer sites 120 when to bid into any of the various wholesale electricity markets, such as (1) the energy market, (2) the day-ahead scheduling reserve market, (3) the capacity market, (4) the synchronized reserve market, and (5) the regulation market.

With respect to emissions information, optimizer 214 may use emissions information 164 to generate optimized operating schedules for energy assets 126 that may be used to indicate to end-users 128 at customer sites 120 opportunities to buy and/or sell emissions credits. In this way, customer sites 120 may have opportunity to reduce emissions and/or receive revenue from emissions trading.

Markets module 216 may be a software component of energy management system 110 for interacting with any entities in the energy markets, such as ISOs/RTOs, any/or with any entities in the emissions trading markets. For example, markets module 216 may include certain market interfaces, which may be any mechanisms for interfacing with the market. Further, markets module 216 may include a registration component that is used for registering energy assets in a particular market for committing assets. Additionally, markets module 216 may include a markets bidding component that is used to submit bids into certain energy markets. Additionally, markets module 216 may include an energy markets settlements component that is used to process settlements in any energy markets between, for example, ISOs/RTOs 152 and customer sites 120. Markets module 216 may also include an emissions market settlements component that is used to process settlements with respect to emissions trading, such as settlements between emissions regulatory agencies 162 and customer sites 120.

SCADA stands for supervisory control and data acquisition. It generally refers to industrial control systems, such as computer systems that monitor and control industrial, infrastructure, and/or facility-based processes. In energy management system 110, SCADA system 220 may be used to communicate directly with customer sites 120. SCADA system 220 may also communicate with other components of energy management system 110 via enterprise service bus 230. SCADA system 220 handles, for example, ancillary services, such as "regulation" and "synchronized reserve."

Figure 26:
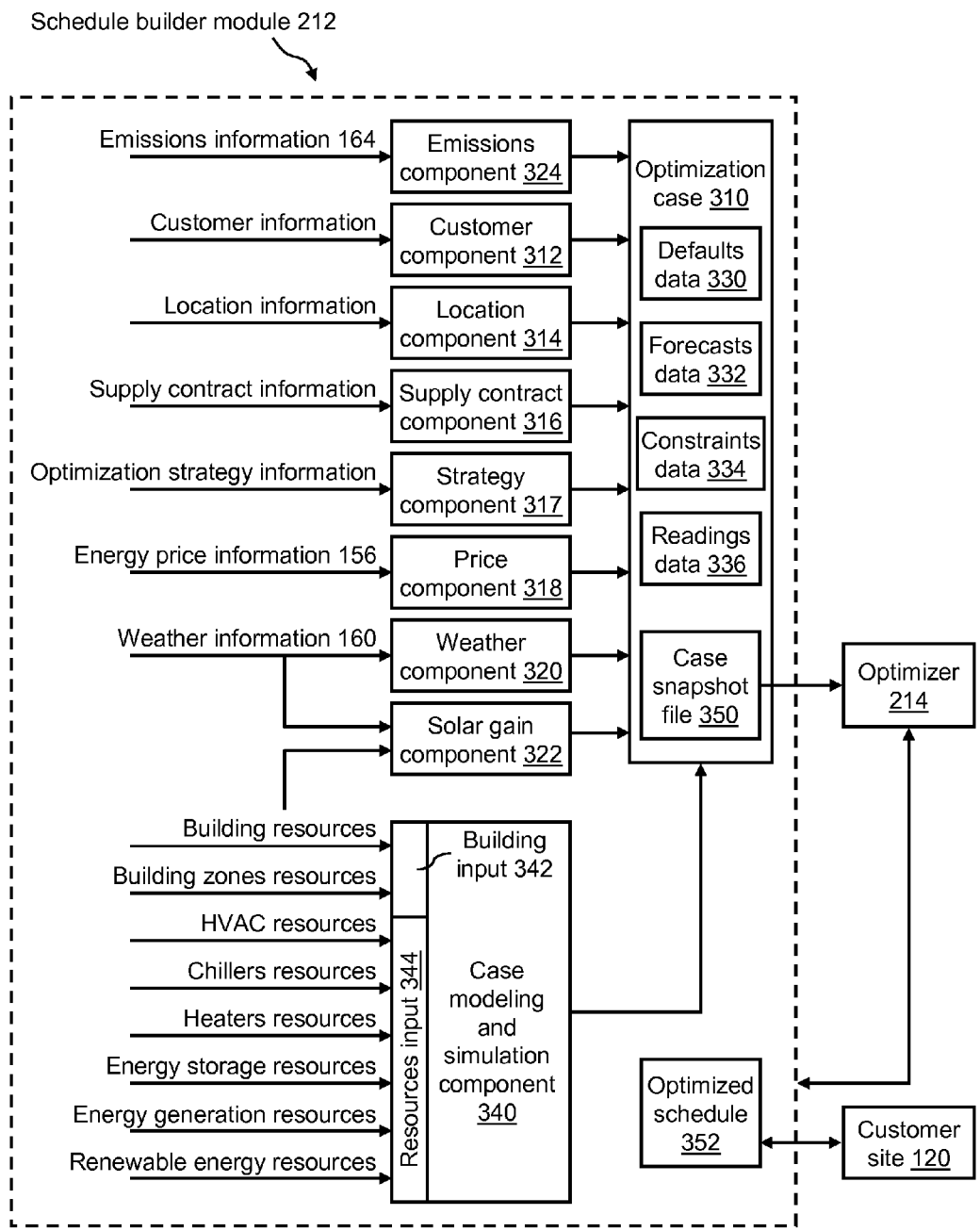
FIG. 26 illustrates a block diagram of an example schedule builder module of the example energy management system of FIG. 25, according to a principle described herein.

FIG. 26 illustrates a block diagram of schedule builder module 212 of energy management system 110 of FIG. 25. Schedule builder module 212 may include any components for processing any information that may be useful with respect to creating an optimization case 310 with respect to energy assets. For example, schedule builder module 212 may include a customer component 312 for processing customer information (e.g., customer site 120 information), a location component 314 for defining and/or configuring the customer's location, a supply contract component 316 for processing supply contract information, a strategy component 317 for processing optimization strategy information, a price component 318 for processing energy price information 156, a weather component 320 for processing weather information 160, a solar gain component 322 for processing solar gain information, and/or an emissions component 324 for processing emissions information 164.

Customer component 312 may process customer information (e.g., customer site 120 information), such as, but not limited to, customer name and contact information, customer type information (e.g., a university, a business, a retailer, a hospital, a factory), building (s) occupancy information, miscellaneous load information (e.g., lighting, any electric powered equipment), and the like.

Location component 314 may be used for defining and/or configuring the customer's location. The definition of a customer's location is not limited to a geographic address. Rather, the customer's location may be any configuration of energy assets, buildings, and/or geographic locations. For example, the customer's location may be configured as one building; a groups of buildings; one energy asset; a group of energy assets; one energy asset for one building; one energy asset for multiple buildings; one monitoring and control system 122 per building; multiple monitoring and control systems 122 per building; one monitoring and control system 122 for multiple buildings; energy assets and/or buildings in one town, city, or state in combination with energy assets and/or buildings in another town, city, or state; and the like. Additionally, groups of energy assets or buildings may be in close physical proximity to each other or may be physically distant and even separated by time zones.

Supply contract component 316 may be used to process supply contract information, which is the service contract between the ISOs/RTOs 152 and customer sites 120.

Strategy component 317 may be used to process optimization strategy information. For example, the optimization strategy may be determined by the definition of a customer's location per location component 314. That is, the grouping of energy assets and/or buildings may determine the best optimization strategy for the case. Example strategies include, but are not limited to single optimization, iterative optimization, customer baseline (CBL) optimization, parametric estimation optimization, and so on.

Price component 318 may be used to process energy price information 156. For example, price component 318 may query ISOs/RTOs 152 for energy price information 156 with respect to any energy market in a certain geographic region, such as the day-ahead energy market and the real-time energy market.

Weather component 320 may be used to process weather information 160. For example, weather component 320 may query weather information 160 for current and/or predicted temperature and/or cloud cover information for a certain geographic location per location component 314. Per weather component 320 and/or weather information 160, optimizer 214 may factor in the delta between the outside temperature and inside temperature of a building or group of buildings. Additionally, per weather component 320 and/or weather information 160, optimizer 214 may factor in the amount of cloudiness with respect to solar gain calculations.

Solar gain (also known as solar heat gain or passive solar gain) refers to the increase in temperature in a space, object, or structure that results from solar radiation. The amount of solar gain increases with the strength of the sun, and with the ability of any intervening material to transmit or resist the radiation. With respect to schedule builder module 212, solar gain component 322 may process solar gain information about one or more buildings of customer site 120 per location component 314. For example, building-specific solar gain information, which is based on an analysis of the customer's building and/or buildings and weather information per weather component 320. That is, solar gain is determined by the direction and orientation of windows, direction and orientation of the sun (by day of the year), and amount of cloud cover. For example, the solar gain may be lowest when cloudy and highest when not cloudy, and anything in between. Again, optimizer 214 may factor in the amount of cloudiness with respect to solar gain calculations. Other factors of solar gain include building information (e.g., size, mass, type and thickness of building materials, R-factor, etc) and window information (e.g., type, size, thickness, direction, R-factor, etc).

Emissions component 324 may be used to query emissions regulatory agencies 162 for emissions information 164 with respect to any emissions market in a certain geographic region. For example, emissions component 324 processes emissions cap information, cost information for buying emissions credits, and/or price information for selling emissions credits for the geographic region of a certain customer site 120.

Optimization case 310 also includes defaults data 330, forecasts data 332, constraints data 334, and readings data 336. For each individual energy asset 126 of each customer site 120 a set of default settings is established, which is defaults data 330. For example, there is a set default settings for a certain HVAC unit, another set default settings for a certain chiller, another set default settings for a certain heater, and so on; all included in defaults data 330. Defaults data 330 may be considered static data. This is because the default settings remain substantially the same from day to day for a given energy asset.

For each individual energy asset 126 of each customer site 120 there is also a set of forecast settings, which is forecasts data 332. That is, forecasts data 332 includes forecast operating values for each individual energy asset 126. The forecasts data 332 is set up by the system operator 116. The forecasts data 332 may initially include default data and/or historical data. A system operator 116 may modify the initial contents of forecasts data 332 based on any current conditions. Forecasts data 332 may include a schedule, such as forecast data for every 15, 30, 45, or 60 minutes for a chosen period of time. Forecasts data 332 may be considered time series data. This is because the data may change over a time period.

In one example, the forecast values in forecasts data 332 are used to modify the default values in defaults data 330 and, thereby, achieve improved optimization with respect to reducing energy costs and/or generating revenue from the day-ahead and/or real-time energy markets. The forecast values in forecasts data 332 may cover the whole day or any portion of the day. For example, forecast values may be used between noon and 6 pm and the default values may be used for the rest of the day. In the optimization process performed by optimizer 214, a first pass of the process may be to optimize using the default settings in defaults data 330. Then a second pass of the process may be to optimize using the forecast settings in forecasts data 332.

Constraints data 334 may include any information for constraining the operation and/or use of energy assets 126 of a certain customer site 120. One example of constraints may be any constraints that are on a particular energy asset 126, such as minimum run time or startup time (e.g., ice making). Another example of constraints may be constraints about the availability of a certain energy asset 126, such as information from the customer that a chiller is going to be down between 2 pm and 4 pm or that the chiller is running at only 50% capacity. Yet another example of constraints may be the allowable minimum and maximum internal temperatures of buildings.

Readings data 336 are the actual readings from the customer's monitoring and control system 122. For example, readings data 336 may be meter readings, thermostat readings, any energy assets readings. When creating a case, system operators 116 may pull any useful readings from readings data 336 and use these values as a baseline value into the optimizer. Further, system operators 116 may monitor actual real-time readings. Then based on actual readings from readings data 336, system operators 116 may make certain adjustments to any energy asset 126 and then rerun the optimization. Additionally, meter readings in readings data 336 may be used for parametric estimation.

Schedule builder module 212 may also include a case modeling and simulation component 340 for processing any information about buildings and/or energy assets of a customer site 120 and then models and simulates the environment. That is, case modeling and simulation component 340 is used to simulate a model of energy assets 126 and their operation in a given environment over a chosen period of time given certain input information and/or variables. For example, case modeling and simulation component 340 may include a building input 342 for receiving any type of building information (e.g., location, size, mass, # of floors, type and thickness of building materials, R-factor, etc) and/or building zones information (e.g., zone 1=floor 1, zone 2=floor 2, zone 3=floor 3, etc). Additionally, case modeling and simulation component 340 may include an energy assets input 344 for receiving any type of information about energy assets 126, such as, but not limited to, any operating specifications and/or attributes of, for example, HVAC assets, chillers assets, heaters assets, energy storage assets (i.e., thermal and electric storage), energy generation assets, and/or renewable energy assets.

The aforementioned information about energy assets 126 may originate from a customer (i.e., customer site 120). That is, the attributes and/or technical specifications of each energy asset 126 may be supplied by the customer site 120 and initially entered manually. However, in other examples, a simulation components library of predefined assets may exist that provides a simulation model of any types, brands, and/or models of energy assets. In this example, the customer may supply only the types, brands, and/or models of its energy assets and then case modeling and simulation component 340 may pull the information from the simulation components library when building an optimization case 310. In one example, the simulation components library includes industry-standard XML representations of any types, brands, and/or models of energy assets 126.

Using the aforementioned information and/or variables, case modeling and simulation component 340 creates a model of the customer site 120 (e.g., a building or group of buildings per location component 314 and associated energy assets 126) and simulates the environment at the customer site 120 for a chosen period of time. Schedule builder module 212 generates a case snapshot file 350 that contains a snapshot of the simulation results from case modeling and simulation component 340 and all other information collected by and/or included in optimization case 310. Case snapshot file 350 is fed into optimizer 214. Optimizer 214 uses a two step process to process the information in case snapshot file 350 and generate a solution set in the form of an optimized schedule 352. The optimized schedule 352 is for a chosen period of time, such as one 24-hour period (i.e., one calendar day), and includes settings information on a predetermined interval, such as every 15, 30, 45, or 60 minutes. The optimized schedule 352 from optimizer 214 is returned to schedule builder module 212. Schedule builder module 212 may then deploy the optimized schedule 352 to a customer site 120.

Following is a description illustrate how the operation of any of the energy assets described herein can be implemented in different markets.

Dynamic Virtualization

Dynamic virtualization is an integrated solution for energy generation and storage involving energy assets, such as batteries and solar generators. This uses a version of examples with virtual partitioning of an energy storage asset. Dynamic virtualization can be used to co-optimize energy storage assets and solar generation across different energy markets or other uses. These markets or uses may include (1) electric energy provided over the grid to the energy market, and (2) the ancillary services market (which may include regulation, which is focused on regulation of power frequency and voltage on the grid) or (3) use of the storage device to maintain power quality at the owners' facilities.

Dynamic virtualization uses examples of systems with the virtual partitioning of the battery or other type of energy storage asset into virtual separate batteries, each virtual energy storage asset being allocated to separate markets or functions, such as participating in the energy market, and the ancillary services (regulation) market or use to maintain power quality at the premise. The virtual partition of the batteries is not physical, but is instead an allocation of energy storage asset capacity to various markets or uses. This virtual partition by allocation is dynamic in that it can be constantly changed in response to changing price points and performance requirements during the day.

There are rapid swings in load on the spot electric energy market. In order to maintain electrical balance on the grid and regulate consistent power and voltage on the grid over short periods of time, for example, over periods of four seconds, fifteen seconds, or one minute, the grid operator sends out signals to change generation to match the load changes. Batteries are particularly well suited to respond to these short response time signals.

With examples of the principles herein, energy storage assets such as batteries can be applied to swing between the markets for energy and ancillary services for regulation of the grid or for the maintenance of power quality at the energy storage asset owner's facility. In the past, batteries were not purchased and installed for the purpose of providing regulation services, because batteries tend to be too expensive for this purpose alone. Most regulation services now come from gas powered generators providing about 1-10 megawatts, and these energy assets take time to turn on and off. Industrial batteries, however, are instant on and off and usually provide power in the 1 megawatt range—and can respond to grid operator signals in milliseconds.

In the past, energy storage and energy storage asset facilities were usually purchased with the intent to provide backup power for the owners, in case the electric power grid goes down or temporarily provides inadequate power. However, once the battery or other type of energy storage assets are installed to satisfy backup capacity for the owner, they may also to some extent be active in the regulation market to regulate the power and voltage on the grid, and in the energy market, to sell power into the grid in response to real-time pricing changes (or to cut the user's demand on the grid). For example, energy storage assets may discharge to the grid during high LMP price hours.

Energy storage assets may include batteries, ice units, compressed air, or other technologies to store energy on site by users and generators of power. Batteries may be of any type, including lithium ion, lead acid, flow batteries, dry cell batteries, or otherwise.

Solar generators of power may include solar panels, solar cells, any other photovoltaic power generator, or any means for generating power from sunlight. This may also include generation of electricity from steam or similar use of liquid to gas phase generation from sunlight, to generate electricity.

The energy market involves generating power, distributing power into the grid, and drawing power out of the grid, each at a price. This is measured in terms of megawatt hours that are the amount of power delivered. Energy is delivered for sustained periods of time, such as for 15 minutes or more.

The capacity market is measured in terms of megawatts of capacity. In this market, a seller makes their facilities available to generate electricity when needed and holds them in reserve for that purpose, but may never actually distribute energy into the grid rather than just be on-call. This, in effect, pays the seller to be available and impacts the reliability of the grid.

The ancillary market includes regulation of frequency and voltage in the grid, and the provision of an operating reserve. The regulation of the voltage in the grid involves discharging energy into the grid or absorbing energy from the grid in small increments, frequently, for short periods of time, and very rapidly.

Smart grid services increasingly rely on new technologies such as renewable energy and large-scale storage resources. Unfortunately, the life-cycle costs associated with such resources, when taken individually, are still high compared with more traditional forms of energy production. In addition, the desired proliferation of distributed and renewable resources on the power grid introduces new threats to its reliable operation, as they are subject to unpredictable drops in output, such as when the wind stops blowing. Consequently, both economic and reliability issues introduce substantial obstacles to a high penetration of those technologies in the power grid.

By themselves, storage resources such as electrical batteries are presently high cost options. Likewise, photovoltaic generation and wind turbines are comparatively quite expensive and their intermittency creates new strains on the power grid.

However, when optimally managed by various examples disclosed herein to provide timely support to the power grid, the net cost of electrical storage can be substantially reduced, as the result of payments by the grid operator (ISO/RTO) provides for facilities that can be called on to provide such support. Also, combining energy storage with intermittent generation makes technologies such as wind and solar more predictable on the grid, and hence, more valuable.

Examples, including dynamic virtualization, can dramatically improve the economics of renewable generation and storage technologies, by co-optimizing their operation to participate in the various energy and ancillary services (including regulation) markets and thus maximize their economic benefits.

Examples focus on the economics of batteries and energy storage and, by providing energy resource optimization and a gateway to the wholesale markets, can help facility managers deploy a comprehensive energy storage solution that can cost-effectively meet an organization's business objectives.

More broadly, when optimally coupling energy storage with renewable generation, various examples redefine the economics of such resources, while providing firm, dispatchable virtual generation that supports the reliability objectives of the power grid. Thus, by integrating distributed resources into virtual generation via system operator dispatch, examples can help enable the acceleration of renewable energy generation technologies such as solar and wind.

Systems Including Energy Storage Assets

Large-scale storage is widely seen as a necessary piece of the smart grid and a key component of America's electricity future. This recognition is driven by the following factors: (1) the growing adoption of intermittent renewable power sources; (2) state and nationwide budget shortfalls, leading local governments to seek cost-effective solutions for maintaining America's aging infrastructure; and (3) the widespread belief that electric vehicles ("EVs") will materially grow their market share over the next 5 to 15 years.

In this context, stakeholders have been looking for ways to accelerate the development and implementation of grid-level storage. Effective battery and other energy storage asset solutions can take unpredictable energy resources and turn them into reliable power, while matching electricity supply to demand; they play a crucial role in fostering microgrids and distributed generation, viable alternatives to expanding the U.S.'s power infrastructure; and they can address the new and unique concerns created by EVs, such as helping to maintain grid stability and giving utilities and grids more control over energy dispatch.

A key concern with batteries has long been their high upfront cost and long payback periods. Various examples address this by providing battery-owners a robust gateway to the wholesale electricity markets, thus unlocking new streams of revenues that increase their return on investment. This may also apply to other types of energy storage assets.

Various examples provide processor-executable instructions (including software solutions) that optimizes participation in wholesale markets by providing energy storage asset owners with dynamic virtualization, a service that continuously re-partitions the energy storage asset for different markets and uses, chiefly real-time energy, and regulation, and power quality control, in an optimized manner, based on pricing and weather data, retail electricity rates, and characteristics of the energy storage asset and its host site.

For large retailers and supermarkets, backup generation is a necessary but often expensive proposition. The nation's largest big box chains have taken a variety of approaches to minimizing the costs of providing substitute power in the case of an emergency or brownout; but for many stores, their only choice to date has been inefficient and costly diesel generators.

Examples with dynamic virtualization optimally manage an energy storage asset's state of charge based on the revenue producing opportunities in the wholesale market, as well as the organization's business objectives, such as providing backup power to critical loads for a given period of time. Thus, when paired with these examples, the energy storage asset becomes an energy resource that will concurrently: (1) participate in the energy markets by providing a way to shift the net load of a facility from high- to low-price periods; (2) participate in the frequency regulation market by responding to real-time signals from the grid operator; (3) participate in other wholesale markets, such as energy and synchronized reserve; and (4) provide reactive/voltage support to the microgrid/distribution grid.

Examples enable the energy storage asset to maximize revenues from the various wholesale markets, while maintaining its ability to achieve its main objective of providing a reliability service to the organization. To achieve this, examples herein describe virtualization of the energy storage asset and creating dynamic "energy storage asset partitions," in a manner similar to the way computing resources are virtualized. Through its optimization capability, an example determines in hourly increments which portion of the controller output (including its capacity), and hence the energy storage asset capacity (including its SOC), can be allocated to the energy and regulation markets respectively, while maintaining sufficient reserve to meet the forecasted backup requirements. The optimal control (to perform the optimization described herein) can take into account the forecasted and real-time hourly prices for each of the markets, along with the time and weather dependent backup requirements of the facility. When combined with other resources such as renewable generation, backup generation or demand response, the examples described herein can extract the maximum value of all such resources while meeting the organization's reliability, comfort, and sustainability objectives.

In energy markets, ancillary services support the reliable operation of the transmission system as it moves electricity from generating sources to retail customers. Examples of ancillary services include "Synchronized Reserve" and "Regulation." Synchronized Reserve supplies electricity if the grid has an unexpected need for more power on short notice. Regulation is a service that corrects for short-term changes in electricity use that might affect the stability of the power system. An entity that is participating in the Regulation service must be able to respond rapidly (within a few seconds or minutes) to a "regulation" signal.

The different types of energy assets available at a customer site can determine the types of energy markets in which the customer site may participate (e.g., capacity market, energy market, or synchronized reserve market). For example, the capacity of a backup generator, battery and HVAC can be committed for economic demand response or a capacity market, according to any of the principles described herein. In another example, the capacity of a battery or a computing load management system can be committed to a regulation market, according to any of the principles described herein. As another example, the capacity of a backup generator and a battery can be committed for a demand response, according to any of the principles described herein. As yet another example, the capacity of a battery and a HVAC can be committed for power quality, according to any of the principles described herein.

Following is a description of the different types of markets, including energy markets and regulation markets, to illustrate how the operation of any of the energy assets described herein can be implemented in each market.

Regulation Market

In a non-limiting example, capacity of the energy storage asset may be committed to the regulation market to maintain the frequency and/or voltage on the power line. For example, system operators seek to maintain the system frequency at very near to a nominal frequency of around 60 Hz in the U.S. or around 50 Hz in some other countries (including countries in the European Union). If the frequency is too high, there is too much power being generated in relation to load. A system operator would send a signal to participants in the regulation market to increase their load, or ask for generation to be reduced, to keep the system in balance. If the frequency is too low, then there is too much load in the system, and the system operator would send a signal asking for generation to be increased or the load reduced. A grid operator may use a real-time communication signal to call for either a positive correction (referred to in the industry as "regulation up") or negative correction (referred to as regulation down"). If load exceeds generation, the frequency and voltage tend to drop. The ISO/RTO system operator would relay a signal requesting regulation up. If, however, generation exceeds load, the frequency tends to increase. The ISO/RTO system operator would relay a signal requesting regulation down (including asking for reduced generation).

The regulation market may seek commitment of a system on an hourly basis. However, the ISO/RTO system operator may relay regulation signals for regulation up and/or regulation down at much shorter timescales. For example, during the commitment period, the adjustments of regulation may take place minute-by-minute, on the order of a minute or a few minutes, or on the order of a few seconds (e.g., at 2-second or 4-second intervals). Traditional regulation applies to slower responding energy storage assets (e.g., assets with about 5 minutes response time), such as but not limited to chillers. Faster responding energy storage assets, such as but not limited to batteries, can respond within about 2 seconds. In an example, the objective cost function may include a term to performance incentives offered for fast responding energy storage assets. To participate in the regulation market, a resource may receive and may need to respond to a regulation signal generated by the grid operator approximately every 2 seconds. (In some territories, this rule may be relaxed somewhat for batteries.) The energy storage asset responds to this signal with a percentage of its maximum resource capability that is bid into the regulation market. Examples receive and respond to this signal and distribute it among the various resources participating in the regulation market within a given price zone, based on the results produced by an optimizer.

If the ISO/RTO system operator sizes the regulation signals to adequately balance the signal in the long run, the charge of the energy storage asset may merely fluctuate around its initial state of charge when it started to provide regulation. That is, the proportion of the available state of charge of the energy storage asset that is committed for use to provide regulation may be delivered at variable charge rates or discharge rates. Adequately balanced regulation signals should neither completely deplete nor fill the energy storage asset.

In a non-limiting example, the regulation price may be set at average values of around $30-$45/MW per hour, with hourly rates fluctuating around this average value. Some regulation markets may pay simply for the commitment of an available capacity of the energy storage asset during a time period, such as for an hour, with a separate payment for the total amount of energy ultimately provided. Thus, payment at the regulation price may be made for the period of commitment, even if the system is not called upon to provide regulation during the commitment period.

There may also be additional payment from the energy market for energy generated, based on the wholesale electricity market price (the LMP).

Operating characteristics of the energy storage asset include power (or its instantaneous delivery capability in kW) and the energy stored in the energy storage asset (or the amount of power it can generate over one hour, or kWh). In a non-limiting example, a battery rated at 1.5 MW power and 1.0 MWh energy storage capacity will be able to provide 1.5 MW power for a total period of 40 minutes ($60 \times 1/1.5$). Thus, if the owner bids 1.5 MW into the regulation market for a given hour, a 50% discharge signal over 2 seconds could decrease the battery's charge level by 0.8 kWh ($1.5$ MW$\times 1/1800$ hrs).

As part of a certification for participating in the regulation market, the ISO/RTO system operator may verify that the energy storage asset is capable of responding to the regulation bid into the market. The ISO/RTO system operator may require that the energy storage asset be able to be charged/ discharged at its full enrolled amount, when receiving a +/−100% regulation signal within a duration of 10 minutes. In the 1.5 MW example above, the battery charge would be increased/decreased by +/−250 kWh (1.5 MW×1/6 hr).

For example, assuming that the energy storage asset starts with an initial state of charge of 50% at time t=0. Ideally, the regulation signal is "net zero," meaning that the quantity of charged/discharged energy averages to zero over a given 24-hour period. In reality, the state of charge of the energy storage asset may at times drift to the limits of the energy storage asset's recommended state of charge. If the state of charge exceeds some adjustable maximum or minimum values, various examples include compensating by exiting the regulation market for the next hour and bringing the energy storage asset back to its initial set-point.

In an example, the operating schedule that is generated according to an implementation of an apparatus herein specifies intervals of time when the energy storage asset may be committed to the regulation market. During these time periods, the operating schedule may additionally indicate the points during these intervals of time where energy may be bought to charge the energy storage asset if its state of charge falls below a desirable limit, or where excess energy may be sold if the state of charge is too high. This discharge can contribute to a short-term demand response action in the real-time energy market.

Energy Market

To participate in the energy market, the energy storage asset should to be able to provide the "as bid" energy into the real-time market for the next hour. Various examples compute the optimal charge or discharge signal in anticipation of or in response to the economic signals, while maintaining minimum and maximum constraints on the state of charge of the energy storage asset. When combined with other controllable resources, such as renewable generation or advanced lighting and HVAC systems, examples extract the maximum economic value of each resource, given external factors and constraints. For example, examples can use an energy storage asset to compensate for the intermittency of renewable generation, and can include demand response actions to help maintain the balance.

Figure 27:
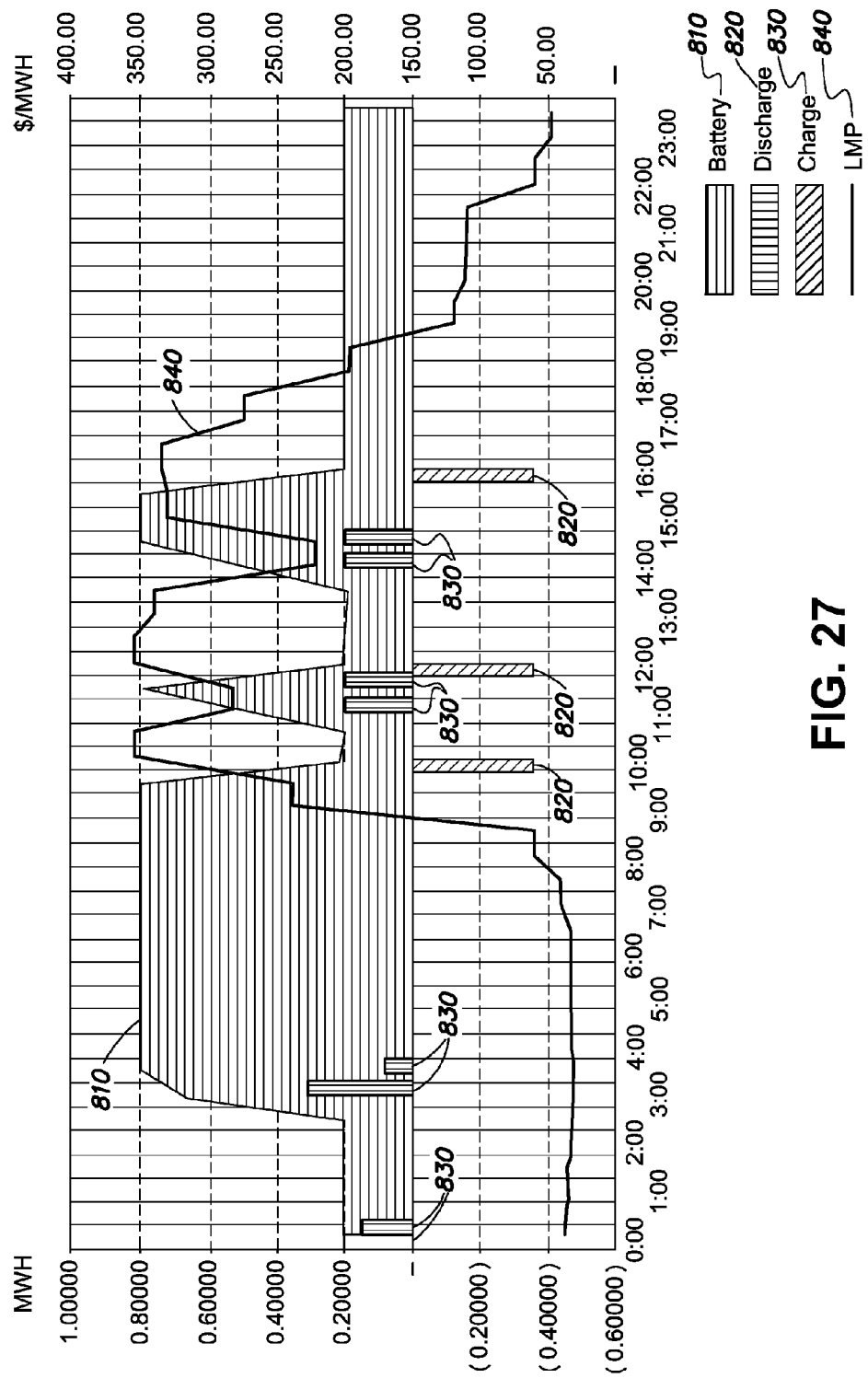
FIG. 27 shows an example of an implementation based on an example suggested operating schedule, according to a principle described herein.

FIG. 27 shows an example energy storage asset optimization in response to economic signals and performance needs. The horizontal axis is time over a 24 hour cycle. The left vertical axis is megawatt hours. The right vertical axis shows price in dollars per megawatt hours. The volume under the line battery 810 shows the stored capacity in the battery. The three lines below the horizontal axis shows the discharge 820 from the battery. The seven vertical lines 830 above the horizontal axis shows charging to the battery 830. The line 840 shows the LMP energy price throughout the 24-hour cycle to which indicated energy assets are responding. In this example, examples determine the optimized hourly charge and discharge schedule of a 1.5 MW/1.0 MWh battery in response to an LMP price signal. The optimization is further constrained to maintain a 200 kWh minimum capacity for backup purposes, and a maximum capacity of 800 kWh to maintain charge/discharge cycle efficiency.

Spinning Reserve Market

To participate in the spinning reserve market, the energy asset should to be able to commit building asset resources to provide power during unplanned outages of base load generators. Spinning reserve is generation capability that can provide power to the grid immediately when called upon by the ISO/RTO and reach full capacity within 10 minutes. The energy storage asset included in the building asset needs to be electrically synchronized with the grid, e.g., through the controller, to participate in this market. Revenue in the spinning reserve market is for capacity rather than energy. It requires quick response but makes low total energy demand. Requests in the spinning reserve market may be made around 20-50 times per year.

Revenue for the spinning reserve market may be determined based on the ability of an energy storage asset to provide power during an unplanned event, such as a generator failure. Revenue may also be derived based on the amount of energy (MWh) that is generated during active participation in the spinning reserve market, such as based on the electricity wholesale price.

Market Based on Voltage/VAR Ancillary Service

To participate in a market based on a voltage/VAR ancillary service, certain resources of the energy asset may be committed to provide for voltage control and/or VAR control.

The voltage/VAR ancillary service seeks to maintain reliability and power quality. It may appear at the microgrid level or feeder level of a distribution system.

A voltage control ancillary service assists in maintaining system voltages within an acceptable range (120 volts±about 5% or 220 volts±about 5%) to customers served by a feeder. For example, if the supply line voltage fluctuates by some amount, resources of the energy asset may be committed to adjust the distribution primary voltage so that the distribution primary voltage also does not drift out of the acceptable range. In another example, if the current (ampere) flowing on the feeder increases during peak load conditions, the voltage along the feeder may decrease due to an increase in current flow, resulting in decreased voltage for customers that are further from the substation end of the feeder. Here, resources of the energy asset may be committed to raise the line voltage under peak load conditions to account for any increased voltage drop. If instead the feeder is lightly loaded, the voltage drop may be lower, and resources of the building asset may be committed to lower the voltage to avoid possible high voltage conditions.

VAR refers to the reactive power (measured in volt-ampere reactive (VARs)). VAR is the electrical energy that energizes capacitive components and inductive components in a power system. A non-limiting example of a capacitive component is overhead conductors, which are continuously charged and discharged by an alternating current (AC) waveform. Non-limiting examples of inductive components are electric motors and transformers, which can store energy in magnetic fields that are used for device operation. By reducing the amount of VARs flowing on the distribution feeder, an electricity supplier can reduce electrical losses and improve the voltage profile along the feeder. Where reactive power varies throughout the day, the capacitive components of a energy asset that are equipped with switches can be placed in or out of service as needs vary during the day. These capacitive components of the energy asset may be equipped with controllers. A system, apparatus, or method may be used to determine when to switch the switches on or off. For example, when the voltage at the location of the capacitive component is low, the operating schedule determined according to a principle herein may include instructions for the controller to close the switch to place the capacitive component in service. When the voltage is high, the operating schedule may include instructions for the controller to open the switch to remove the capacitive component from service.

Revenue from a market based on the voltage/VAR ancillary service may be determined based on the ability of an energy storage asset of the energy asset(s) to be used to provide the voltage controls and/or the VAR controls. In an example, the voltage/VAR control may apply in a microgrid application at the microgrid bus level, which may introduce a reliability cost to the computation of the net-energy-related cost.

Co-Optimization Across Multiple Markets and/or Ancillary Services

As described above, the economic signal can be a driver for the average charge status of the energy storage asset. It responds to price signals that are averaged on an hourly basis. The regulation signal can be seen as having a "bias" effect over the average charge, in response to the regulation commands. Examples co-optimize the energy storage asset charge by first economically optimizing the charge status of the energy storage asset, then allocating the balance of the available power to the regulation market, on an hourly basis.

By adding user-adjustable upper and lower constraints to the optimized energy storage asset charge, examples take into account reliability objectives (e.g. backup) and charge/discharge cycle efficiency. Other constraints can be added, based on the type of energy storage asset technology used, to maximize charge/discharge round trip efficiency, and optimize energy storage asset life versus energy storage asset replacement costs.

In addition to co-optimizing a storage resource at a given location, examples have the capability to perform a global optimization across multiple customers within the same price zone, and disaggregate the regulation and economic signals among the various customers. In particular, this gives customers that do not have the minimum energy storage asset capacity required the ability to participate in the regulation market.

Co-Optimization with Other Distributed Resources

With various examples, distributed resources can earn maximum economic benefit through co-optimization. Co-optimization of various resources on one site results in accelerated payback for all assets, and this, in turn, accelerates the market-wide penetration of these resources.

Figure 28:
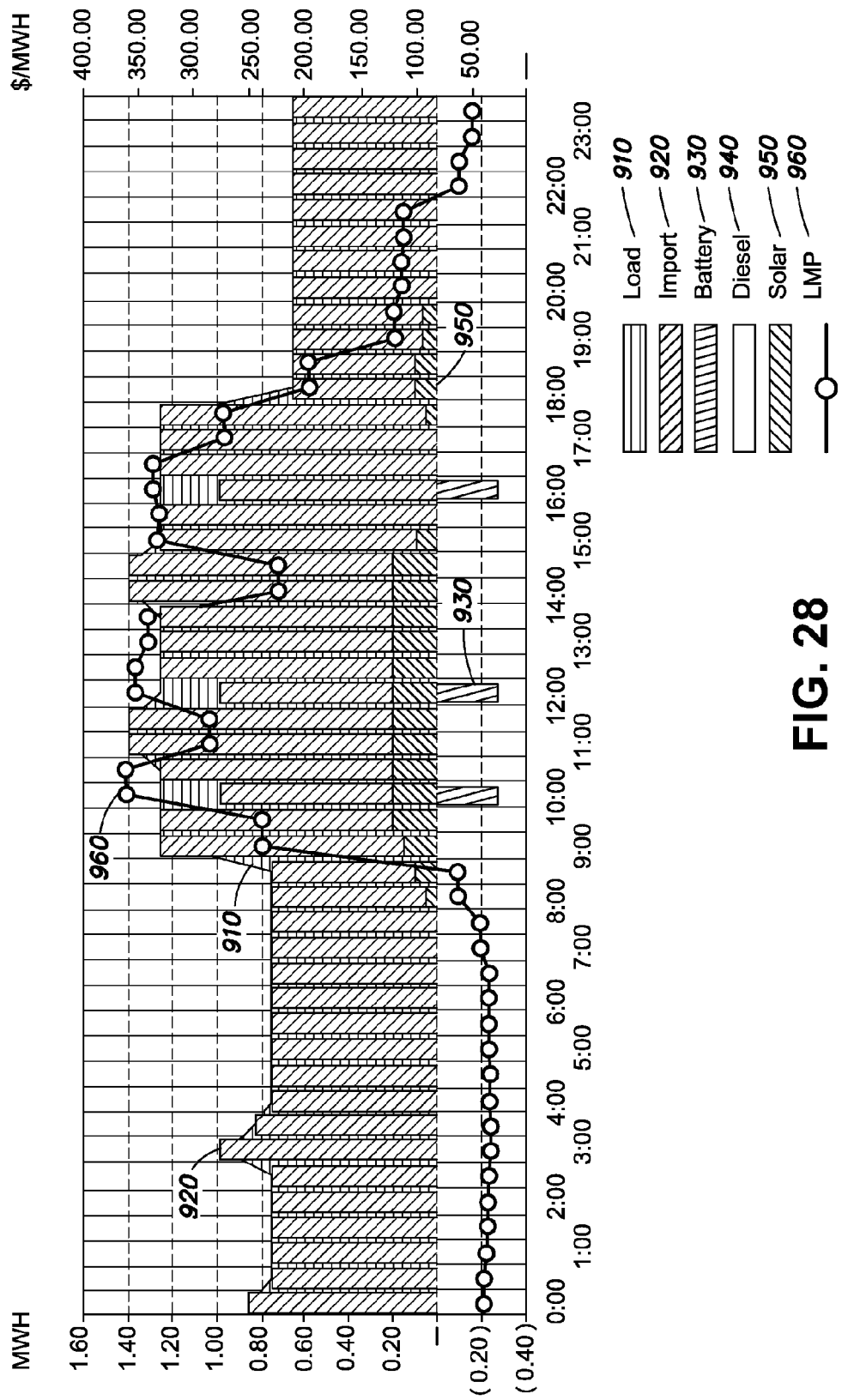
FIG. 28 shows an example energy storage asset optimization according to a principle described herein.

FIG. 28 shows an example generation schedule for battery-photovoltaic co-optimization. FIG. 28 shows an example where the same battery used in the previous example in FIG. 27 is combined with 0.5 MW of PV (solar-photovoltaic) generation. The horizontal axis shows the time in the 24-hour cycle. The left vertical axis shows megawatt hours. The right vertical axis shows price in dollars per megawatt hours. The load 910 is the electric load on the facilities. The import of power 920 shows the power imported into the facilities from the grid. The battery 930 shows the three bars below the horizontal axis for the power discharge from the batteries at specific times. The diesel 940 is not shown because diesel generation is not used in this co-optimization because of its relative price. The solar 950 shows the power used by the system and/or stored in the batteries from the solar generator or photovoltaic generator at various times. The LMP line 960 shows the fluctuating price for electricity during the 24-hour cycle.

Example Energy Storage Assets

Various examples are technology agnostic and can optimize any storage installation. However, certain forms of storage, such as compressed air and ice storage, are currently not recognized as applicable resources for some regulation markets.

Aided by significant private investment, grid-scale batteries have significantly reduced in cost over the past decade. Different technologies appear to have converged around a similar price: with batteries offered at roughly $1-2 per Watt, and $1-2 per Watt-hour, before Balance of Plant ("BoP") costs. (Watts [W, kW, MW] are a measure of power, i.e., the charge and discharge rate of an energy storage asset. Watt-hours [Wh, kWh, MWh] are a measure of energy, i.e., the storage capacity of an energy storage asset.) At these prices, energy storage asset owners and lessees can use examples to achieve a positive return over the installed life while meeting their sites' backup needs.

Below is a brief overview of each different types of energy storage assets:

Lithium-Ion Battery

This "power battery" is well-suited for regulation with high efficiency and hybrid opportunities. However, it has a high cost and little data exists to corroborate lifespan claims.

Quoted prices include $2 million for a 1 MW/1 MWh unit, and $1.5 million for a 1 MW/250 kWh unit.

Lithium-Ion (Li-Ion) batteries are receiving great attention because they are the preferred battery for electric vehicles. Presently, Li-Ion batteries are among the most expensive of the storage options available. This may change, as many companies are pouring resources into new Li-Ion variants; however, some suggest that the chemical characteristics of Li-Ion cells make it difficult to significantly reduce their cost. Additionally, Li-Ion is a new technology so that no company has empirically demonstrated Li-Ion's lifespan. Companies have tried to allay these concerns through "accelerated testing" that charge/discharge the battery more rapidly, but this does not provide full insight into how well Li-Ion batteries perform over time.

Li-Ion batteries are very dense and therefore very small compared to other technologies. One manufacturer's 1 MW/1 MWh unit, for example, has dimensions of 8'×20'. In comparison, a quoted lead-acid unit with similar specs has dimensions of 40'×70'.

Hybrid opportunities for Li-Ion batteries are discussed in the flow battery section.

Lead-Acid Battery

This battery is the lowest-cost option with long lifespan and proven technology. However, it is physically large with high maintenance and limited depth of discharge.

Quoted prices include $896,000 for a 1 MW/2 MWh unit, and $512,000 for a 1 MW/500 kWh unit.

Lead-Acid batteries, which have the same chemistry as a car battery, are proven for long-lasting grid applications. One manufacturer's 1 MW/1.4 MWh unit lasted for 12 years, from 1996-2008, as both a provider of voltage support and a backup power source, before the battery cells were replaced. The original power electronics of that installation still function, and the unit is running with a new set of lead-acid cells.

A downside of lead-acid batteries is that they are very heavy and very large. This is why they are not being considered as much for EVs, and this poses other logistical challenges for metropolitan installations. Lead-acid batteries are also considered to be high maintenance. They need to be kept within a narrow temperature range, and therefore require their own building (for industrial power uses), as well as periodic upkeep. Also, lead-acid batteries are typically oversized because exceeding the lower bounds of their state of charge can damage the cells. They are best for regulation or voltage support, and as backup if sized explicitly for that purpose.

Flow Batteries

These batteries can be fully charged and discharged without damage to the battery. Also, "hybridization" is possible. However, this "energy battery" limits regulation market opportunities and has low round-trip efficiency.

Quoted prices include $1.15 million for a 1 MW/1 MWh battery.

Flow batteries are energy batteries, i.e., they are best suited for backup electricity, but their chemistry limits their ability to provide high-MW regulation. The typically configured flow battery takes 4 hours to charge/discharge, and flow batteries have lower round-trip efficiencies than other types (roughly 75% in contrast to Li-Ion's 90%). With flow batteries, a tank is filled with electrolyte fluid that flows through solid cell stacks located at the top of the unit. The liquid solution never degrades, but the cells need to be replaced every 5 or 6 years. The cost of cell replacement is 10-15% of the total unit.

The electrochemical characteristics prohibit them from power-dense applications, unless they are oversized and paired with a large inverter, or "hybridized" with another battery technology. Hybridization can be provided by some suppliers in conjunction with a well-established power electronics provider. One manufacturer has created a system that allows its "energy" batteries to be paired with "power" batteries, like lithium-ion, connected through a single inverter. A leading lithium-ion battery manufacturer recently announced a plan to provide a similar Li-Ion/flow battery unit for grid-scale applications.

Dry Cell Technology

This power battery is good for the regulation market. However, it has very small recommended depth of charge/discharge and is expensive.

Quoted prices include $1.5 million for a 1.5 MW/1 MWh battery, plus 30% extra for BoP ("Balance of Plant").

These batteries provide high power-to-energy ratios that make them attractive for regulation, so long as they remain within a fairly narrow range of state of charge. These batteries are not meant to fully charge or discharge and pushing their recommended operating parameters affects their lifespan. Ideal state of charge is 20-80%. Because of these constraints, these batteries would need to be oversized to provide backup. These batteries are more expensive than cheaper options such as lead-acid.

Based on their characteristics, these batteries are likely suited for projects whose primary objective is not backup power, but rather systems support. They provide high-MW regulation, can address voltage sag concerns, and can be recharged by regenerative braking. However, when their state of charge limitations are taken into account, they appear to be a costly technology, even in comparison to lithium-ion.

Ice Units

The thermal storage capacity of an ice unit can be used according to the principles herein as an energy storage asset.

Ice units can be used to modify how a building asset is cooled, including how energy is consumed for cooling/air conditioning. An ice unit generally consists of a thermally-insulated storage tank that attaches to a building asset's air-conditioning system. The unit makes ice (generally at night when supply costs tend to be lower) and uses that ice during the day to deliver cooling directly to the building asset's existing air conditioning system. Storage tanks can be on the order of hundreds of gallons of water (e.g., about 450 gallons) of water. The water is frozen by circulating refrigerant through copper coils within or surrounding the tank. The condensing unit then turns off, and the ice is stored until its cooling energy is needed. During the higher temperature daytime hours, the power consumption of air conditioning and demand levels on the grid, increase. The ice unit may be used to replaces the energy-demanding compressor of a building asset's air conditioning unit. The melting ice of the ice unit, rather than the air conditioning unit, can be piped around the building asset to cool it.

Compressed Air

The storage capacity of compressed air can be used according to the principles herein as an energy storage asset.

For example, compressed air energy storage (CAES) technology provides a way to store compressed air, using energy generated at lower cost at one time, and use that compressed air at another time when energy costs are higher. For example, energy generated during periods of low energy demand periods (such as during off-peak electricity usage as night) may be released at on-peak times to meet higher demand. The CAES system may be located where there is large, accessible air-storage pockets or caverns, such as but not limited to mines and underground formations. The air may be compressed using electrically powered turbo-compressors. The compressed air stored in these pockets may be later fed to, e.g., gas-fired turbine generators to generate electricity during on-peak, higher-priced time periods. In another example, the compressed air is expanded using turbo expanders or air engines that are driving electrical generators to generate electricity.

In another example, the thermal storage capacity of compressed air can be used according to the principles herein as an energy storage asset.

Using a heat exchanger, it is possible to extract waste heat from the lubricant coolers used in types of compressors, and use the waste heat to produce hot water. Depending on its design, a heat exchanger can produce non-potable or potable water. When hot water is not required, the lubricant can be routed to the standard components for lubricant cooling. The hot water can be used in central heating or boiler systems, or any other application where hot water is required. Heat exchangers also offer an opportunity to produce hot air and hot water, and allow the operator some flexibility to vary the hot air to hot water ratio.

Controller for an Energy Storage Asset

The controllers for the energy storage assets described herein can be used to vary the input to or output from the energy storage assets. When the controller functions as a converter, it converts the AC signal to a DC signal. That DC signal may be used to charge the energy storage asset. When the controller functions as an inverter, it converts one type of voltage (direct current (DC)) into another type of voltage (alternating current (AC)). Since the electricity supplier generally supplies 110 or 220 volts AC on the grid, the conversion may typically be from 12 volts DC to 110 or 220 volts AC. In another example, the output of the controller may be different, depending on the type of load on the system. Inverters called utility intertie or grid tie may connect to energy generating assets such as solar panels or wind generator, and can feed their output directly into the inverter. The inverter output can be tied to the grid power.

In a non-limiting example, the inverter takes the DC output from the energy storage asset and runs it into a number of power switching transistors. These transistors are switched on and off to feed opposite sides of a transformer, causing the transformer to think it is getting an AC signal. Depending on the quality and complexity of the inverter, it may put out a square wave, a "quasi-sine" (sometimes called modified sine) wave, or a true sine wave. The quality of the quasi-sine wave can vary among different inverters, and also may vary somewhat with the load.

The virtual partitioning of the energy storage asset described facilitates partitioning between energy and regulation participation. The partitioning can be based on the available capacity of the controller (i.e., the inverter/converter). The SOC of the energy storage asset may be used to provide a constraint within the optimization for determining the optimal charge/discharge strategy for participation in these two different markets. As a non-limiting example, an operating schedule generated according to the principles herein can indicate the optimal charge/discharge strategy for the controller, including on an hourly basis, in response to or anticipation of projected LMPs. The balance of the inverter capacity of the controller may be made available to the regulation market at its shorter timescales (e.g., at the 2-second or minute-by-minute time intervals described above). The proportion of the controller output (and hence the energy storage asset) committed to the energy market and the remaining proportion of the energy storage asset committed to the regulation market are co-optimized based on the economic benefit derived from the two markets, and subject to the SOC constraints. The operating schedules generated based on any of the principles described herein, and in any of the example, can suggest the proportion of the controller output committed to the energy market and to the regulation market in a given time interval t (less than time period T), and for what length of time. the proportion of the controller output committed to the energy market and to the regulation market in a given time interval t (less than time period T). For example, for a controller with a 1 MWatt inverter capacity, the principles herein can be used to generate an operating schedule that suggests the proportion of the controller's 1 MWatt inverter capacity that can be committed to the energy market and to the regulation market in a given time interval t to generate the energy-related revenue.

Energy Generating Assets

Examples of energy generating asset applicable to the apparatus and methods herein include photovoltaic cells, fuel cells, gas turbines, diesel generators, flywheels, electric vehicles and wind turbines.

Electric storage has the potential to address some of the attributes of renewable energy generation. The intermittent nature of energy generating assets, including solar generation, may present some difficulty for grid operators. For example, weather events can make energy output of energy generating assets, including photovoltaic cells or wind turbines, difficult to predict. As renewable generators make up a growing share of regional generation portfolios, grid operators may require greater real-time visibility of distributed generation and benefit from a resource's ability to control bi-directional power flow. Adding storage to distributed generation achieves new levels of responsiveness not seen with existing systems.

According to principles described herein, the operating schedule generated for a system that includes a controller, an energy storage asset and an energy generating asset can firm up intermittent renewable generation into dispatchable generation. The operating schedule can provide for renewable generation forecasting based on the forecasted weather conditions.

Dynamic virtualization can be beneficial to sites that utilize both energy storage assets and energy generating assets. For example, by integrating weather data, price forecasts, and expected site load, examples can accurately predict a solar array's output, determine how much solar generation should be captured by an energy storage asset, and dispatch the energy storage asset at the time of day that optimizes revenues derived from wholesale market participation.

By passing energy through an energy storage asset and exhibiting real-time control, power can be delivered strategically and act as a price-responsive resource in the various wholesale markets. In effect, storage allows the maturation of energy generating assets as a resource that provides discrete power-flow to the grid that is controllable, quantifiable, and dispatchable. Solar power and its generation can be costly. Through dynamic virtualization the value of renewable generation can be increased by improving the resource with electric storage.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments disclosed herein are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the disclosure can be implemented in any of numerous ways. For example, some embodiments may be implemented via one or more controllers, which may employ hardware, software or a combination thereof. In some embodiments discussed herein, one or more controllers may be implemented, at least in part, as a state machine.

When any aspect of an embodiment is implemented at least in part in software, the software code can be executed on any suitable processor or collection of processors, whether provided in a single device or computer or distributed among multiple devices/computers.

In this respect, various aspects of the disclosure, may be embodied at least in part as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in claims, shall have its ordinary meaning as used in the field of patent law.

As used herein in the specification and claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the specification and claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An apparatus for determining a suggested operating schedule for at least one energy asset operable by an energy customer, the apparatus comprising:

at least one communication interface;

at least one memory to store processing unit-executable instructions and an objective function for the at least one energy asset, wherein the at least one energy asset comprises at least one controllable energy asset, wherein the objective function facilitates a determination of the suggested operating schedule for the at least one energy asset based at least in part on data representative of model parameters, and wherein the model parameters are: (a) an operation characteristic of the at least one controllable energy asset, (b) a thermodynamic property of the at least one energy asset, (c) a projected environmental condition during time period T; and at least one processing unit communicatively coupled to the at least one memory, wherein, upon execution of the processing unit-executable instructions, the at least one processing unit:

A) prior to time period T, determines the suggested operating schedule based on an optimization of the objective function over time period T, wherein the objective function is determined based on a dynamic simulation model of the energy profile of the at least one energy asset, a customer baseline (CBL) energy profile for the at least one energy asset, and a forecast wholesale electricity price, over time period T, associated with a wholesale electricity market, wherein the dynamic simulation model is adaptive to physical changes in the at least one energy asset based on a parametric estimation using at least one of the model parameters, and wherein the dynamic simulation model is trained using the data; and B) controls the at least one communication interface to transmit to the energy customer the suggested operating schedule determined in A), and/or controls the at least one memory so as to store the determined suggested operating schedule, wherein the operation of the at least one energy asset according to the suggested operating schedule, over a time period T, facilitates generation of energy-related revenue based at least in part on the wholesale electricity market, wherein:

the at least one energy asset is at least one building asset; and the at least one controllable energy asset comprises at least one heating, ventilation and air conditioning (HVAC) system to control a variable internal temperature of the at least one building asset wherein the operation characteristic of the HVAC comprises at least one of a fan status, chiller status, or an ice storage status.

2. An apparatus for determining a suggested operating schedule for at least one energy asset operable by an energy customer, the apparatus comprising:

at least one communication interface;

at least one memory to store processing unit-executable instructions and an objective function for the at least one energy asset, wherein the at least one energy asset comprises at least one controllable energy asset, wherein the objective function facilitates a determination of the suggested operating schedule for the at least one energy asset based at least in part on data representative of model parameters, and wherein the model parameters are: (a) an operation characteristic of the at least one controllable energy asset, (b) a thermodynamic property of the at least one energy asset, (c) a projected environmental condition during time period T; and at least one processing unit communicatively coupled to the at least one memory, wherein, upon execution of the processing unit-executable instructions, the at least one processing unit:

A) prior to time period T, determines the suggested operating schedule based on an optimization of the objective function over time period T, wherein the objective function is determined based on a dynamic simulation model of the energy profile of the at least one energy asset, a customer baseline (CBL) energy profile for the at least one energy asset, and a forecast wholesale electricity price, over time period T, associated with a wholesale electricity market, wherein the dynamic simulation model is adaptive to physical changes in the at least one energy asset based on a parametric estimation using at least one of the model parameters, and wherein the dynamic simulation model is trained using the data; and B) controls the at least one communication interface to transmit to the energy customer the suggested operating schedule determined in A), and/or controls the at least one memory so as to store the determined suggested operating schedule, wherein the operation of the at least one energy asset according to the suggested operating schedule, over a time period T, facilitates generation of energy-related revenue based at least in part on the wholesale electricity market, wherein:

the at least one energy asset is at least one building asset; and the at least one controllable energy asset comprises at least one heating, ventilation and air conditioning (HVAC) system to control a variable internal temperature of the at least one building asset wherein the thermodynamic property of the building asset comprises at least one of a chilled water temperatures, an air temperatures, and an ice loop temperature.

3. An apparatus for determining a suggested operating schedule for at least one energy asset operable by an energy customer, the apparatus comprising:

at least one communication interface;

at least one memory to store processing unit-executable instructions and an objective function for the at least one energy asset, wherein the at least one energy asset comprises at least one controllable energy asset, wherein the objective function facilitates a determination of the suggested operating schedule for the at least one energy asset based at least in part on data representative of model parameters, and wherein the model parameters are: (a) an operation characteristic of the at least one controllable energy asset, (b) a thermodynamic property of the at least one energy asset, (c) a projected environmental condition during time period T; and at least one processing unit communicatively coupled to the at least one memory, wherein, upon execution of the processing unit-executable instructions, the at least one processing unit:

A) prior to time period T, determines the suggested operating schedule based on an optimization of the objective function over time period T, wherein the objective function is determined based on a dynamic simulation model of the energy profile of the at least one energy asset, a customer baseline (CBL) energy profile for the at least one energy asset, and a forecast wholesale electricity price, over time period T, associated with a wholesale electricity market, wherein the dynamic simulation model is adaptive to physical changes in the at least one energy asset based on a parametric estimation using at least one of the model parameters, and wherein the dynamic simulation model is trained using the data; and B) controls the at least one communication interface to transmit to the energy customer the suggested operating schedule determined in A), and/or controls the at least one memory so as to store the determined suggested operating schedule, wherein the operation of the at least one energy asset according to the suggested operating schedule, over a time period T, facilitates generation of energy-related revenue based at least in part on the wholesale electricity market, wherein time period T is 24 hours.

4. An apparatus for determining a suggested operating schedule for at least one energy asset operable by an energy customer, the apparatus comprising:

at least one communication interface;

at least one memory to store processing unit-executable instructions and an objective function for the at least one energy asset, wherein the at least one energy asset comprises at least one controllable energy asset, wherein the objective function facilitates a determination of the suggested operating schedule for the at least one energy asset based at least in part on data representative of model parameters, and wherein the model parameters are: (a) an operation characteristic of the at least one controllable energy asset, (b) a thermodynamic property of the at least one energy asset, (c) a projected environmental condition during time period T; and at least one processing unit communicatively coupled to the at least one memory, wherein, upon execution of the processing unit-executable instructions, the at least one processing unit:

A) prior to time period T, determines the suggested operating schedule based on an optimization of the objective function over time period T, wherein the objective function is determined based on a dynamic simulation model of the energy profile of the at least one energy asset, a customer baseline (CBL) energy profile for the at least one energy asset, and a forecast wholesale electricity price, over time period T, associated with a wholesale electricity market, wherein the dynamic simulation model is adaptive to physical changes in the at least one energy asset based on a parametric estimation using at least one of the model parameters, and wherein the dynamic simulation model is trained using the data; and B) controls the at least one communication interface to transmit to the energy customer the suggested operating schedule determined in A), and/or controls the at least one memory so as to store the determined suggested operating schedule, wherein the operation of the at least one energy asset according to the suggested operating schedule, over a time period T, facilitates generation of energy-related revenue based at least in part on the wholesale electricity market, wherein the objective function is based on a comparison between at least one demand response revenue and at least one energy-related cost associated with operation of the at least one energy asset according to the suggested operating schedule.

5. An apparatus for determining a suggested operating schedule for at least one energy asset operable by an energy customer, the apparatus comprising:

at least one communication interface;

at least one memory to store processing unit-executable instructions and an objective function for the at least one energy asset, wherein the at least one energy asset comprises at least one controllable energy asset, wherein the objective function facilitates a determination of the suggested operating schedule for the at least one energy asset based at least in part on data representative of model parameters, and wherein the model parameters are: (a) an operation characteristic of the at least one controllable energy asset, (b) thermodynamic property of the at least one energy asset, (c) a projected environmental condition during time period T; and at least one processing unit communicatively coupled to the at least one memory, wherein upon execution of the processing unit-executable instructions, the at least one processing unit:

A) prior to time period T, determines the suggested operating schedule based on an optimization of the objective function over time period T, wherein the objective function is determined based on a dynamic simulation model of the energy profile of the at least one energy asset, a customer baseline (CBL) energy profile for the at least one energy asset, and a forecast wholesale electricity price, over time period T, associated with a wholesale electricity market, wherein the dynamic simulation model is adaptive to physical changes in the at least one energy asset based on a parametric estimation using at least one of the model parameters, and wherein the dynamic simulation model is trained using the data; and B) controls the at least one communication interface to transmit to the energy customer the suggested operating schedule determined in A), and/or controls the at least one memory so as to store the determined suggested operating schedule, wherein the operation of the at least one energy asset according to the suggested operating schedule, over a time period T, facilitates generation of energy-related revenue based at least in part on the wholesale electricity market, wherein the dynamic simulation model is trained using the data representative of the operation characteristic of the at least one controllable energy asset and the thermodynamic property of the at least one energy asset, during operation of the at least one energy asset at under similar environmental conditions to the projected environmental condition during time period T.

6. An apparatus for determining a suggested operating schedule for at least one energy asset operable by an energy customer, the apparatus comprising:

at least one communication interface;

at least one memory to store processing unit-executable instructions and an objective function for the at least one energy asset, wherein the at least one energy asset comprises at least one controllable energy asset, wherein the objective function facilitates a determination of the suggested operating schedule for the at least one energy asset based at least in part on data representative of model parameters, and wherein the model parameters are: (a) an operation characteristic of the at least one controllable energy asset, (b) a thermodynamic property of the at least one energy asset, (c) a projected environmental condition during time period T; and at least one processing unit communicatively coupled to the at least one memory, wherein, upon execution of the processing unit-executable instructions, the at least one processing unit:

A) prior to time period T, determines the suggested operating schedule based on an optimization of the objective function over time period T, wherein the objective function is determined based on a dynamic simulation model of the energy profile of the at least one energy asset, a customer baseline (CBL) energy profile for the at least one energy asset, and a forecast wholesale electricity price, over time period T, associated with a wholesale electricity market, wherein the dynamic simulation model is adaptive to physical changes in the at least one energy asset based on a parametric estimation using at least one of the model parameters, and wherein the dynamic simulation model is trained using the data; and B) controls the at least one communication interface to transmit to the energy customer the suggested operating schedule determined in A), and/or controls the at least one memory so as to store the determined suggested operating schedule, wherein the operation of the at least one energy asset according to the suggested operating schedule, over a time period T, facilitates generation of energy-related revenue based at least in part on the wholesale electricity market, wherein the at least one processing unit further:

C) determines an updated operating schedule for the at least one energy asset, during time period T, based on updated parameters of the suggested operating schedule, wherein the updated parameters are determined using a feedback mechanism, wherein the feedback mechanism comprises comparing a predicted value of at least one of the model parameters, computed using the suggested operating schedule, to an actual value measured, during time period T, of the respective at least one of the model parameters; and D) controls the at least one communication interface to transmit to the energy customer the updated operating schedule for at least one energy asset determined in C), and/or controls the at least one memory so as to store the determined updated operating schedule.

7. The apparatus of claim 6, wherein the updated parameters of the suggested operating schedule are computed based on Kalman filtering.

8. The apparatus of claim 6, wherein the at least one processing unit determines the updated operating schedule for the at least one energy asset as at least one bias signal, as an interruptible load function, or as at least one use modulation signal.

9. The apparatus of claim 8, wherein the at least one processing unit determines the updated operating schedule for the at least one energy asset in (A) as at least one bias signal, and controls the at least one communication interface in (B) to transmit to the energy customer the at least one bias signal at different times during time period T.

10. The apparatus of claim 8, wherein the at least one processing unit controls the at least one communication interface to transmit to the energy customer the updated operating schedule as at least one use modulation signal, and wherein the operation of the at least one energy asset according to the at least one use modulation signal causes a modulation with time of the loads use of the controllable energy asset.

11. The apparatus of claim 6, wherein (C) and (D) are repeated at regular time intervals during time period T.

12. The apparatus of claim 11, wherein time period T is 24 hours, and wherein the regular time intervals are each a half hour.

13. An apparatus for determining schedule for at least one energy asset t operable by an energy customer, the apparatus comprising:
at least one communication interface;
at least one memory to store processing unit-executable instructions and an objective function for the at least one energy asset, wherein the at least one energy asset comprises at least one controllable energy asset, wherein the objective function facilitates a determination of the suggested operating schedule for the at least one energy asset based at least in part on data representative of model parameters, and wherein the model parameters are: (a) an operation characteristic of the at least one controllable energy asset, (b) a thermodynamic property of the at least one energy asset, (c) a projected environmental condition during time period T; and
at least one processing unit communicatively coupled to the at least one memory, wherein, upon execution of the processing unit-executable instructions, the at least one processing unit:
A) prior to time period T, determines the suggested operating schedule based on an optimization of the objective function over time period T, wherein the objective function is determined based on a dynamic simulation model of the energy profile of the at least one energy asset, a customer baseline (CBL) energy profile for the at least one energy asset, and a forecast wholesale electricity price, over time period T, associated with a wholesale electricity market, wherein the dynamic simulation model is adaptive to physical changes in the at least one energy asset based on a parametric estimation using at least one of the model parameters, and wherein the dynamic simulation model is trained using the data; and
B) controls the at least one communication interface to transmit to the energy customer the suggested operating schedule determined in A), and/or controls the at least one memory so as to store the determined suggested operating schedule, wherein the operation of the at least one energy asset according to the suggested operating schedule, over a time period T, facilitates generation of energy-related revenue based at least in part on the wholesale electricity market,
wherein the at least one processing unit further:
C) determines a mathematical model of the energy profile of the at least one energy asset in operation according to the operating schedule during time period T; and
(D) determines the energy-related revenue based on a comparison between at least one demand response revenue derived from the wholesale electricity market and at least one energy-related cost associated with operation of the at least one energy asset according to the suggested operating schedule.

* * * * *